(12) United States Patent
Hwang et al.

(10) Patent No.: US 9,899,394 B2
(45) Date of Patent: Feb. 20, 2018

(54) VERTICAL MEMORY DEVICES HAVING CONTACT PLUGS CONTACTING STACKED GATE ELECTRODES

(71) Applicants: Sung-Min Hwang, Seoul (KR); Jee-Yong Kim, Hwaseong-Si (KR); Dae-Seok Byeon, Seongnam-si (KR)

(72) Inventors: Sung-Min Hwang, Seoul (KR); Jee-Yong Kim, Hwaseong-Si (KR); Dae-Seok Byeon, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/001,877

(22) Filed: Jan. 20, 2016

(65) Prior Publication Data
US 2016/0268264 A1    Sep. 15, 2016

Related U.S. Application Data

(60) Provisional application No. 62/130,982, filed on Mar. 10, 2015.

(30) Foreign Application Priority Data

Mar. 10, 2015 (KR) .................. 10-2015-0032969
May 20, 2015 (KR) .................. 10-2015-0070338

(51) Int. Cl.
| | |
|---|---|
| *H01L 27/115* | (2006.01) |
| *H01L 27/11578* | (2017.01) |
| *H01L 27/11575* | (2017.01) |
| *H01L 27/11573* | (2017.01) |
| *H01L 27/11565* | (2017.01) |
| *H01L 27/1157* | (2017.01) |

(Continued)

(52) U.S. Cl.
CPC ........ *H01L 27/115* (2013.01); *H01L 27/1157* (2013.01); *H01L 27/11563* (2013.01); *H01L 27/11565* (2013.01); *H01L 27/11573* (2013.01); *H01L 27/11575* (2013.01); *H01L 27/11578* (2013.01); *H01L 27/11582* (2013.01)

(58) Field of Classification Search
CPC ......... H01L 27/11578; H01L 27/11563; H01L 27/11565; H01L 27/11568; H01L 27/11573; H01L 27/1157; H01L 27/11575; H01L 27/115
See application file for complete search history.

(56) References Cited

U.S. PATENT DOCUMENTS 8,207,029 B2    6/2012 Ishikawa
8,385,131 B2    2/2013 Seol
(Continued)

FOREIGN PATENT DOCUMENTS

JP    2011060958    3/2011

*Primary Examiner* — Michael Jung
(74) *Attorney, Agent, or Firm* — Ward and Smith, P.A.

(57) ABSTRACT

A vertical memory device includes a plurality of gate electrodes at a plurality of levels, respectively, spaced apart from each other in a vertical direction substantially perpendicular to a top surface of a substrate, a channel extending in the vertical direction on the substrate and penetrating through the gate electrodes, and a plurality of contact plugs extending in the vertical direction and contacting the gate electrodes, respectively. At least one second contact plug is formed on a first gate electrode among the plurality of gate electrodes, and extends in the vertical direction.

18 Claims, 74 Drawing Sheets

(51) Int. Cl.
*H01L 27/11563* (2017.01)
*H01L 27/11582* (2017.01)

(56) References Cited

U.S. PATENT DOCUMENTS

| | | | |
|---|---|---|---|
| 8,569,829 B2 | 10/2013 | Kiyotoshi | |
| 8,637,919 B2 | 1/2014 | Lee et al. | |
| 8,638,919 B2 | 1/2014 | DeLuca | |
| 8,648,404 B2 | 2/2014 | Ko et al. | |
| 2011/0104869 A1* | 5/2011 | Hyun | H01L 27/11551 438/430 |
| 2012/0061744 A1* | 3/2012 | Hwang | H01L 27/11565 257/324 |
| 2012/0211823 A1* | 8/2012 | Lim | H01L 27/11565 257/326 |
| 2013/0234338 A1 | 9/2013 | Uenaka et al. | |
| 2013/0270714 A1* | 10/2013 | Lee | H01L 21/76802 257/774 |
| 2014/0061750 A1* | 3/2014 | Kwon | H01L 27/1052 257/314 |
| 2014/0061776 A1* | 3/2014 | Kwon | H01L 21/8239 257/329 |
| 2014/0070295 A1 | 3/2014 | Fukuda et al. | |
| 2014/0199815 A1* | 7/2014 | Hwang | H01L 29/66833 438/270 |
| 2015/0206895 A1* | 7/2015 | Oh | H01L 23/528 257/324 |
| 2015/0214103 A1* | 7/2015 | Matsuda | H01L 21/76877 257/314 |

\* cited by examiner

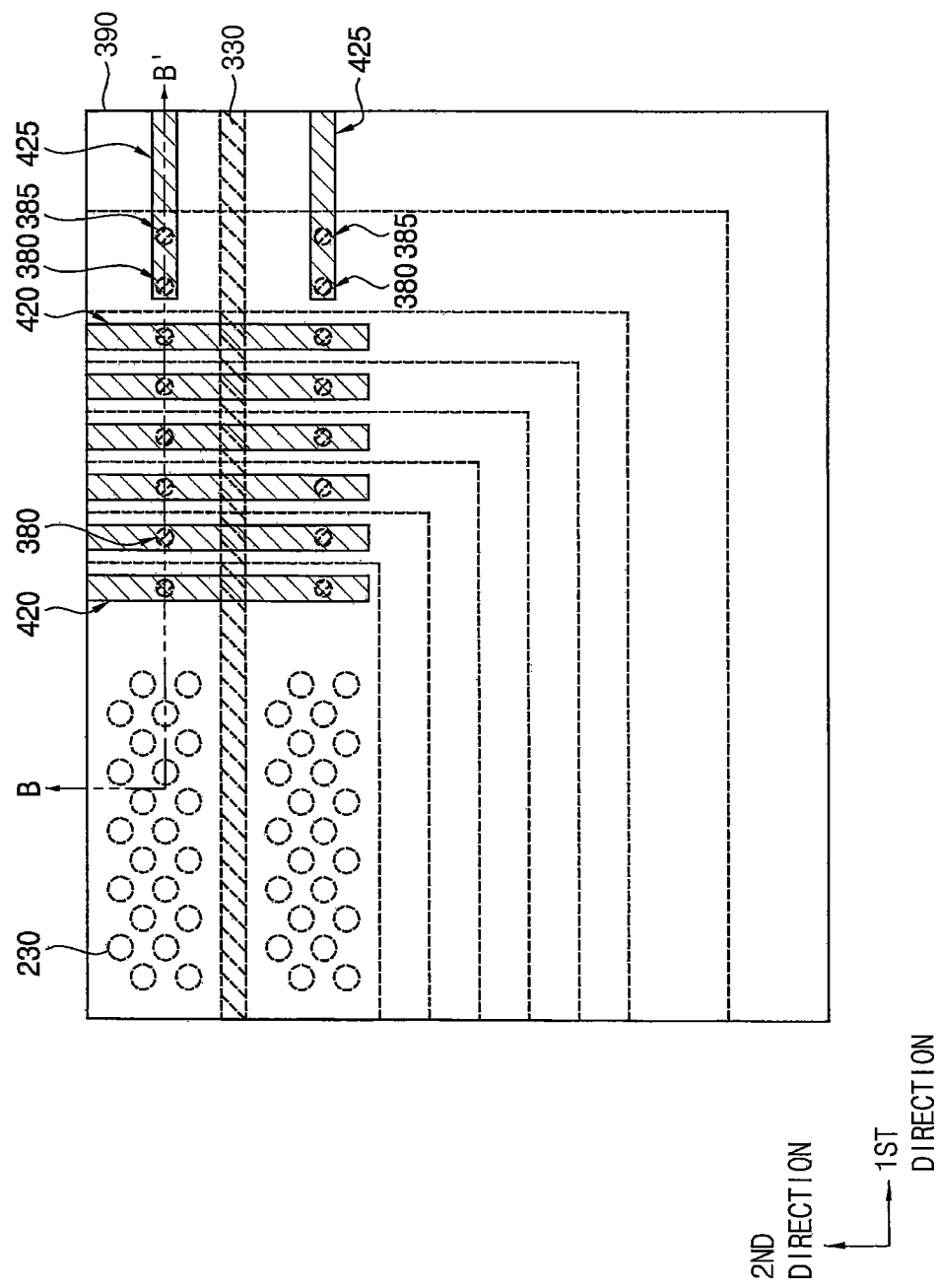

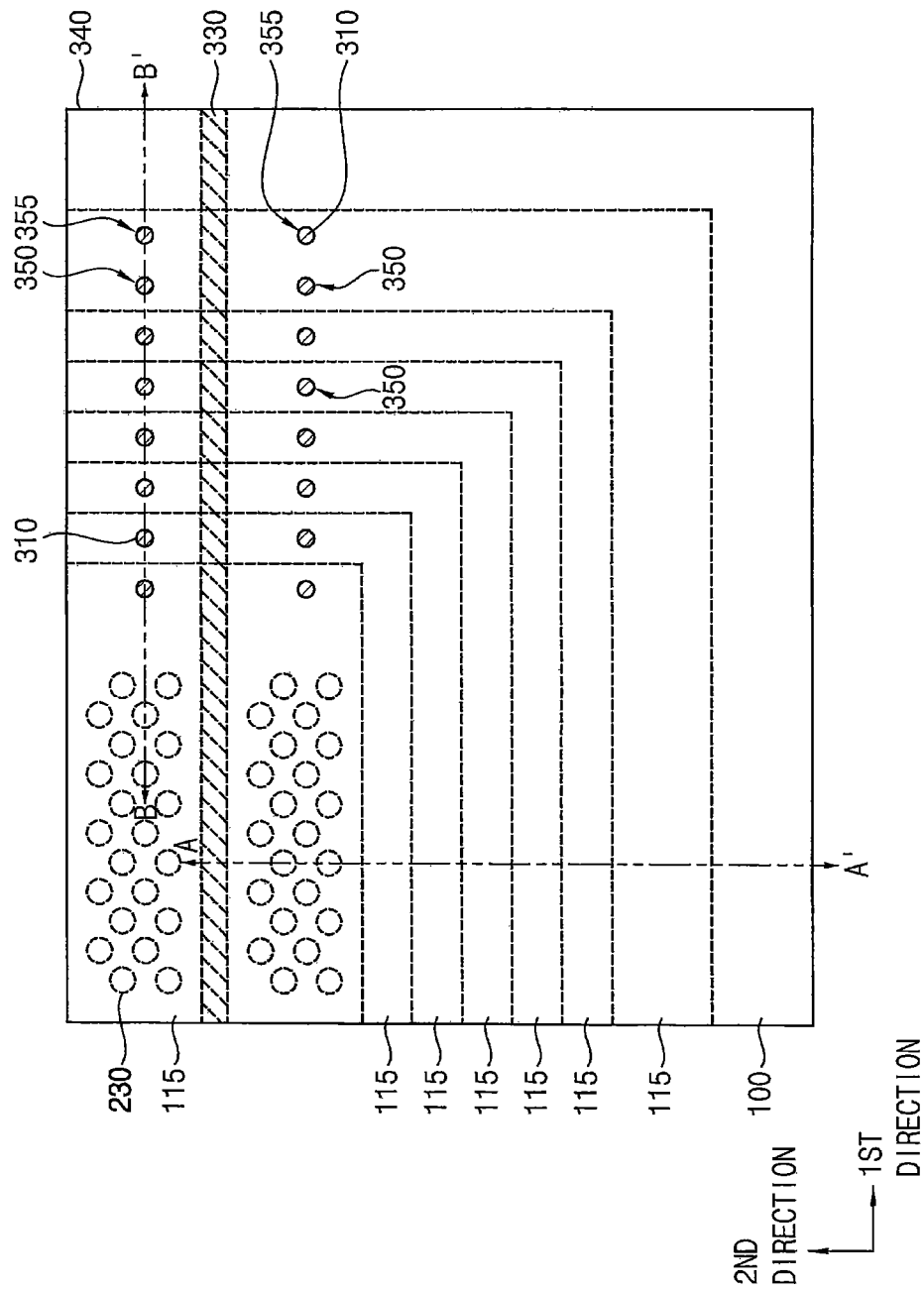

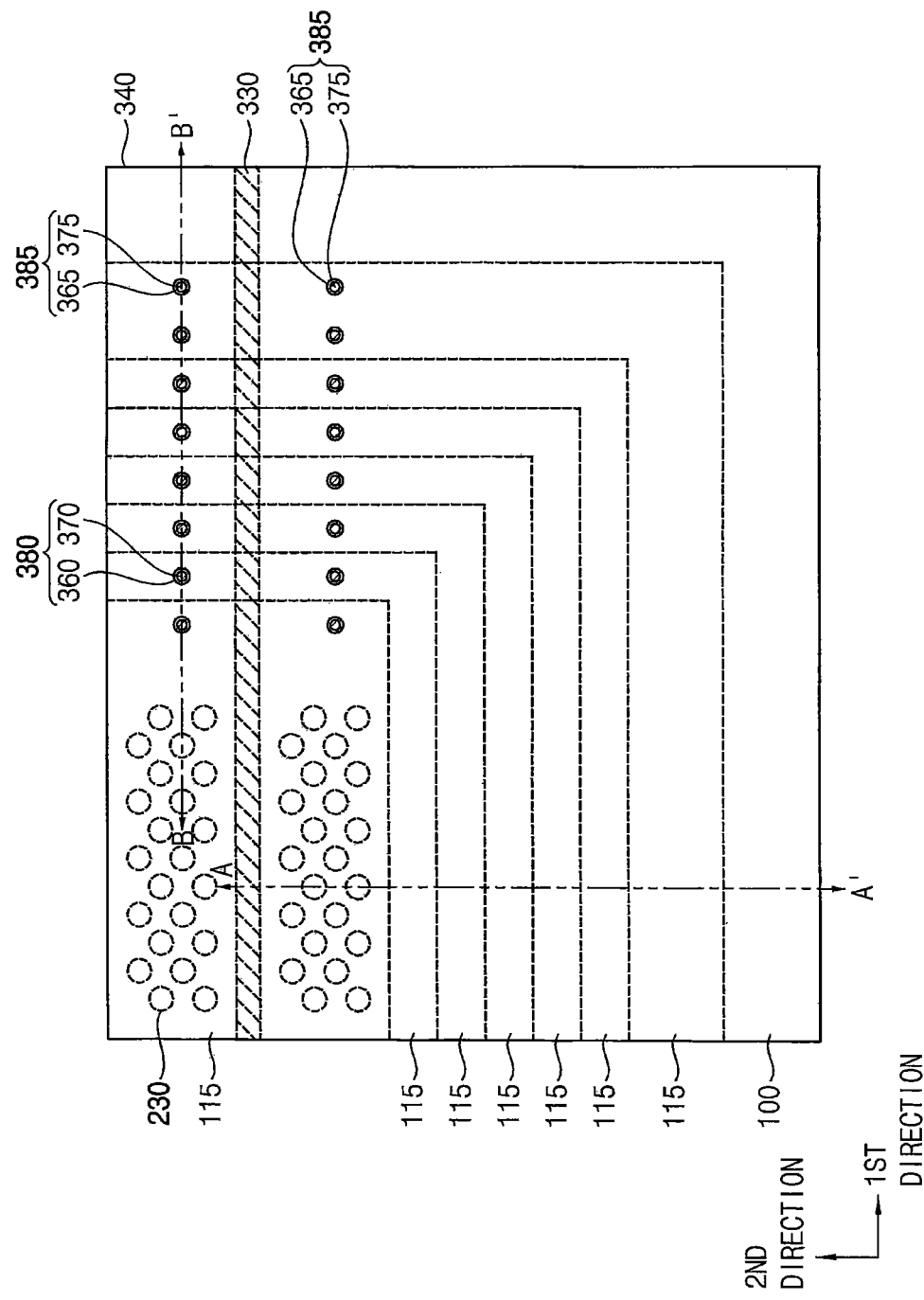

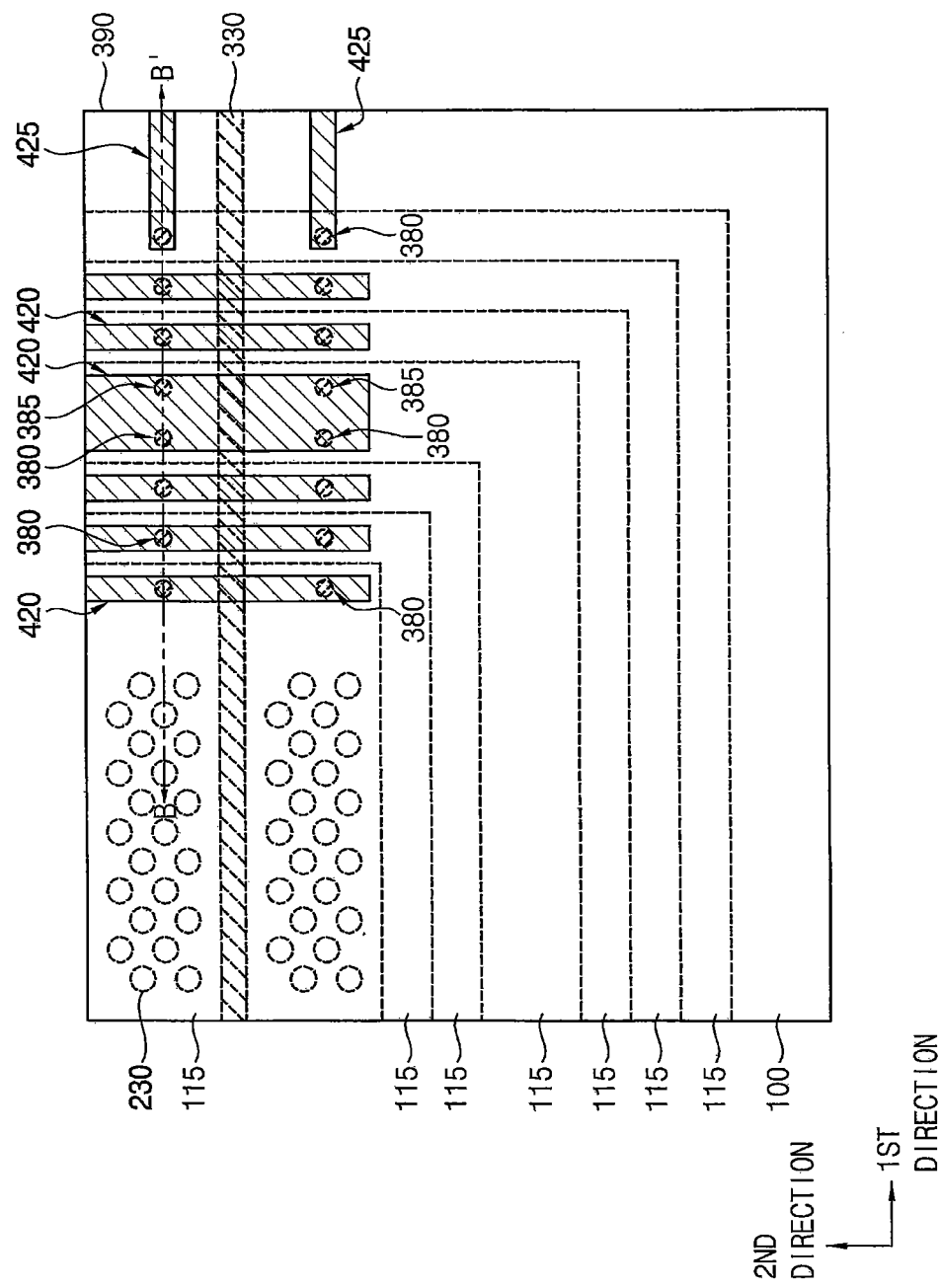

VERTICAL MEMORY DEVICES HAVING CONTACT PLUGS CONTACTING STACKED GATE ELECTRODES

CROSS-REFERENCE TO RELATED APPLICATIONS

This application is a non-provisional application that claims priority to U.S. Provisional Application No. 62/130,982 filed on Mar. 10, 2015, and also claims priority under 35 U.S.C. § 119 to Korean Patent Application Nos. 10-2015-0032969 and 10-2015-0070338 filed on Mar. 10, 2015 and May 20, 2015, respectively, in the Korean Intellectual Property Office (KIPO), the contents of which are incorporated by reference herein in their entireties.

BACKGROUND

1. Field

The inventive concepts generally relate to vertically-oriented memory devices, and more particularly, the inventive concepts relate to vertical non-volatile memory devices including staircase-shaped word line pads and contacts thereon.

2. Description of the Related Art

Recently, vertical non-volatile memory devices having enhanced integration degree have been developed. When a vertical non-volatile memory device is manufactured, after forming staircase-shaped word line pads, contacts may be formed on the word line pads, respectively. According to pattern loading effects that may be caused by the density difference of patterns, contact holes for forming uppermost and lowermost contacts may not expose corresponding word line pads. Thus, the contacts in the contact holes may not electrically contact the word line pads well, which may deteriorate the electrical characteristics of the vertical non-volatile memory device.

SUMMARY

According to some embodiments of the inventive concepts, a memory device, includes a plurality of conductive gate electrodes stacked on a substrate, which define selection lines and word lines of the memory device, a channel structure on the substrate and extending through ones of the stacked conductive gate electrodes, and a plurality of conductive contact plugs extending toward the substrate substantially parallel to the channel structure and onto the conductive gate electrodes. First ones of the conductive contact plugs electrically contact first ones of the conductive gate electrodes, respectively. Second ones of the conductive contact plugs extend on a second one of the conductive gate electrodes such that at least one of the second ones of the conductive contact plugs electrically contacts the second one of the conductive gate electrodes.

In some embodiments, surfaces of the conductive contact plugs opposite the substrate may be substantially coplanar, the first ones of the conductive contact plugs may extend toward the substrate to different depths, and the second ones of the conductive contact plugs may extend toward the substrate to respective depths that are different than the different depths of the first ones of the conductive contact plugs.

In some embodiments, first wiring lines may extend substantially parallel on the surfaces of the first ones of the conductive contact plugs and may be electrically coupled to the first ones of the conductive gate electrodes thereby, respectively, and a second wiring line may extend on the surfaces of the second ones of the conductive contact plugs and may be electrically coupled to the second one of the conductive gate electrodes by the at least one of the second ones of the conductive contact plugs.

In some embodiments, the second wiring line may extend in a different direction than the first wiring lines.

In some embodiments, the respective depths of the second ones of the conductive contact plugs may be substantially similar such that two or more of the second ones of the conductive contact plugs may electrically contact the second one of the conductive gate electrode.

In some embodiments, another of the second ones of the conductive contact plugs may not electrically contact the second one of the conductive gate electrodes and/or may be free of electrical contact to a wiring at the surface thereof.

In some embodiments, the second one of the conductive gate electrodes may define a respective one of the selection lines.

In some embodiments, ones of the conductive gate electrodes proximate to the substrate may be longer than ones of the conductive gate electrodes distal from the substrate stacked thereon, and the first and second ones of the conductive contact plugs may be uniformly spaced relative to one another along a direction in which the conductive gate electrodes extend.

According to an aspect of the inventive concepts, there is provided a vertical memory device. The vertical memory device includes a plurality of gate electrodes at a plurality of levels, respectively, spaced apart from each other in a vertical direction substantially perpendicular to a top surface of a substrate, a channel extending in the vertical direction on the substrate and penetrating through the gate electrodes, and a plurality of contact plugs extending in the vertical direction and contacting the gate electrodes, respectively. At least one second contact plug is formed on a first gate electrode among the plurality of gate electrodes, and extends in the vertical direction.

In example embodiments, a top surface of the second contact plug may be substantially coplanar with top surfaces of the first contact plugs.

In example embodiments, the second contact plug may contact the first gate electrode.

In example embodiments, the second contact plugs may not contact the first gate electrode, and a bottom surface of the second contact plug may be higher than a top surface of the first gate electrode and lower than a bottom surface of one of the gate electrodes at a level higher than and nearest to a level of the first gate electrode.

In example embodiments, each of the gate electrodes may extend in a first direction substantially parallel to the top surface of the substrate, and when viewed from above (i.e., in plan view), the first and second contact plugs may be disposed in the first direction at a constant distance or uniformly spaced from each other.

In example embodiments, the second contact plug may be disposed at a first end or a second end in the first direction among the first and second contact plugs.

In example embodiments, the second contact plug may be disposed in the middle in the first direction among the first and second contact plugs.

In example embodiments, the first and second contact plugs may be disposed in a zigzag layout in the first direction.

In example embodiments, the second contact plug may be disposed at a first end or a second end in the first direction among the first and second contact plugs.

In example embodiments, the gate electrodes may have lengths in the first direction decreasing from a lower level toward an upper level, and each of the first and second contact plugs may be formed on an edge portion of a corresponding one of the gate electrodes not overlapped by upper ones of the gate electrodes.

In example embodiments, the first gate electrode may be disposed at a lowermost level among the gate electrodes.

In example embodiments, the first gate electrode may be disposed at an uppermost level among the gate electrodes.

In example embodiments, the first gate electrode may be disposed at a middle level among the gate electrodes.

In example embodiments, the gate electrodes may include a plurality of first gate electrodes.

In example embodiments, the first gate electrodes may be disposed at a lowermost level and an uppermost level among the gate electrodes.

In example embodiments, the vertical memory device may further include first wirings contacting top surfaces of the first contact plugs, respectively, and an electrical signal may be applied to the first contact plugs through the first wirings.

In example embodiments, a top surface of the second contact plug may contact one of the first wirings on the top surface of corresponding one of the first contact plugs contacting the first gate electrode.

In example embodiments, the second contact plug may be connected to no wiring (i.e., free of connection to the first and/or other wirings).

In example embodiments, the gate electrodes may have a staircase shape having a length in a first direction substantially parallel to the top surface of the substrate decreasing from a lower level toward an upper level. The vertical memory device may further include at least one third contact plug on the top surface of the substrate adjacent one of the gate electrodes at a lowermost level in the first direction. The at least one third contact plug may have a top surface substantially coplanar with top surfaces of the first and second contact plugs.

In example embodiments, the vertical memory device may further include first wirings contacting the first contact plugs, respectively, and an electrical signal may be applied to the contact plugs through the first wirings.

In example embodiments, a top surface of the third contact plug may contact a second wiring different from the first wirings.

In example embodiments, the third contact plug may be connected to no wiring.

In example embodiments, the gate electrodes may include a GSL, a word line and an SSL sequentially stacked in the vertical direction.

In example embodiments, the first gate electrode may include the GSL or the SSL.

In example embodiments, each of the gate electrodes may include a metal pattern and a barrier pattern on or covering at least a top and a bottom of the metal pattern.

In example embodiments, each of the first contact plugs may penetrate or extend through the barrier pattern of a corresponding one of the gate electrodes, and contact the metal pattern thereof.

In example embodiments, each of the first contact plugs may contact the barrier pattern of a corresponding one of the gate electrodes.

In example embodiments, each of the first contact plugs may contact the barrier pattern and the metal pattern of a corresponding one of the gate electrodes.

In example embodiments, the second contact plug may contact the barrier pattern of a corresponding one of the gate electrodes.

In example embodiments, the second contact plug may not contact the barrier pattern of a corresponding one of the gate electrodes.

According to an aspect of the inventive concepts, there is provided a vertical memory device. The vertical memory device includes a plurality of gate electrodes in a memory cell region of a substrate at a plurality of levels, respectively, spaced apart from each other in a vertical direction substantially perpendicular to a top surface of the substrate including the memory cell region and a peripheral region, a channel extending in the vertical direction on the substrate and penetrating through the gate electrodes, and a plurality of contact plugs extending in the vertical direction and contacting the gate electrodes, respectively. At least one third contact plug is formed on the substrate in the memory cell region adjacent one of the plurality of gate electrodes at a lowermost level. The at least one third contact plug extends in the vertical direction and has a top surface substantially coplanar with top surfaces of the first contact plugs.

In example embodiments, each of the gate electrodes may extend in a first direction substantially parallel to the top surface of the substrate, and when viewed from above, the first and third contact plugs may be disposed in the first direction at a constant or uniform distance from each other.

In example embodiments, the gate electrodes may have a staircase shape having a length in a first direction substantially parallel to the top surface of the substrate decreasing from a lower level toward an upper level. The third contact plug may be disposed on a portion of the substrate adjacent one of the plurality of gate electrodes at a lowermost level in the first direction.

In example embodiments, the vertical memory device may further include first wirings contacting top surfaces of the first contact plugs, respectively, and an electrical signal may be applied to the first contact plugs through a second wiring in the peripheral region of the substrate.

In example embodiments, a top surface of the third contact plug may contact one of the first wirings on the top surface of corresponding one of the first contact plugs contacting the one of the plurality of gate electrodes at the lowermost level.

In example embodiments, the third contact plug may be connected to a third wiring different from the first wiring.

In example embodiments, the third contact plug may be connected to no wiring.

In example embodiments, the vertical memory device may further include at least one second contact plug extending in the vertical direction on the first gate electrode among the gate electrodes. The at least one second contact plug may have a top surface substantially coplanar with the top surfaces of the first contact plugs.

According to an aspect of the inventive concepts, there is provided a vertical memory device. The vertical memory device includes a channel extending on a substrate in a vertical direction substantially perpendicular to a top surface of the substrate, a charge storage structure on or covering an outer sidewall of the channel, a plurality of gate electrodes at a plurality of levels, respectively, spaced apart from each other in the vertical direction, and a plurality of contact plugs each extending in the vertical direction and contacting an edge portion of a corresponding one of the gate electrodes not overlapped by ones of the gate electrodes at upper levels. Each of the plurality of gate electrodes covers the charge storage structure and extends in the first direction, and the plurality of gate electrodes have a staircase shape of which a length in the first direction decreases from a lower level toward an upper level. Lengths in the first direction of the gate electrodes sequentially stacked in the vertical direction decrease by a first value, while a difference between a length in the first direction of the first gate electrode and a length in the first direction of one of the gate electrodes nearest to the first gate electrode and disposed over the first gate electrode has a second value greater than the first value.

In example embodiments, the second value may be equal to or more than twice of the first value.

In example embodiments, the vertical memory device may further include at least one second contact plug extending in the vertical direction on the first gate electrode.

In example embodiments, the first and second contact plugs may be disposed in the first direction at a constant or uniform distance from each other.

In example embodiments, a top surface of the second contact plug may be substantially coplanar with a top surface of the first contact plug.

In example embodiments, the gate electrodes may include a plurality of first gate electrodes.

In example embodiments, the first gate electrode may be disposed at a lowermost level among the gate electrodes.

In a method of manufacturing the vertical memory device in accordance with example embodiments, when the first contact plugs are formed to be connected to the gate electrodes in the stairs of the staircase structure, the second contact plug may be further formed on some stairs to reduce or prevent the pattern loading effects. Thus, the first contact plugs may be formed to contact the gate electrodes well.

BRIEF DESCRIPTION OF THE DRAWINGS

The above and other aspects and features of the inventive concepts will become readily understood from the detail description that follows, with reference to the accompanying drawings, in which like reference numbers refer to like elements unless otherwise noted, and in which:

FIGS. 14 through 44 are plan views and cross-sectional views illustrating fabrication stages of a vertical memory device throughout a manufacturing method in accordance with example embodiments; and FIGS. 45 to 70 are plan views and cross-sectional views illustrating vertical memory devices in accordance with example embodiments.

DETAILED DESCRIPTION

Figure 1:
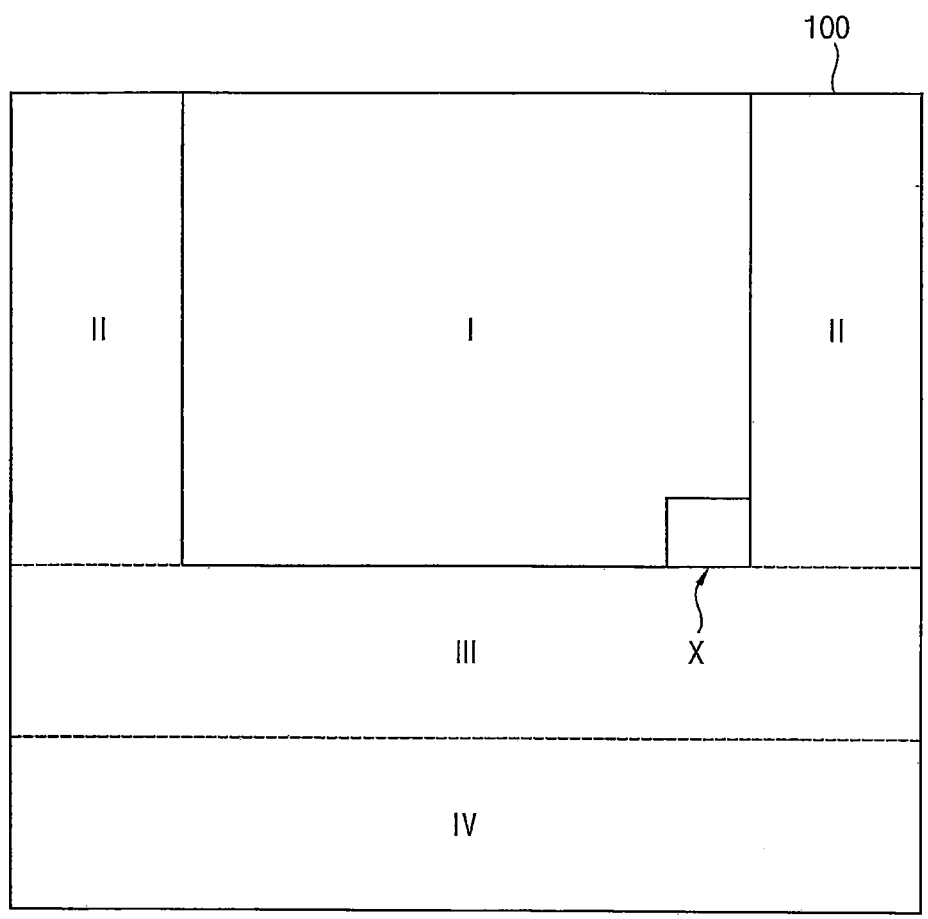
FIGS. 1 through 13 are plan views and cross-sectional views illustrating a vertical memory device in accordance with example embodiments.

Example embodiments will now be described more fully with reference to the accompanying drawings, in which example embodiments are shown. Example embodiments may, however, be embodied in many different forms and should not be construed as limited to the example embodiments set forth herein. In the drawings, the thicknesses of layers and regions are exaggerated for clarity. Like reference numerals in the drawings denote like elements, and thus their description will be omitted.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Other words used to describe the relationship between elements or layers should be interpreted in a like fashion (e.g., "between" versus "directly between," "adjacent" versus "directly adjacent," "on" versus "directly on"). As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. Unless indicated otherwise, these terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
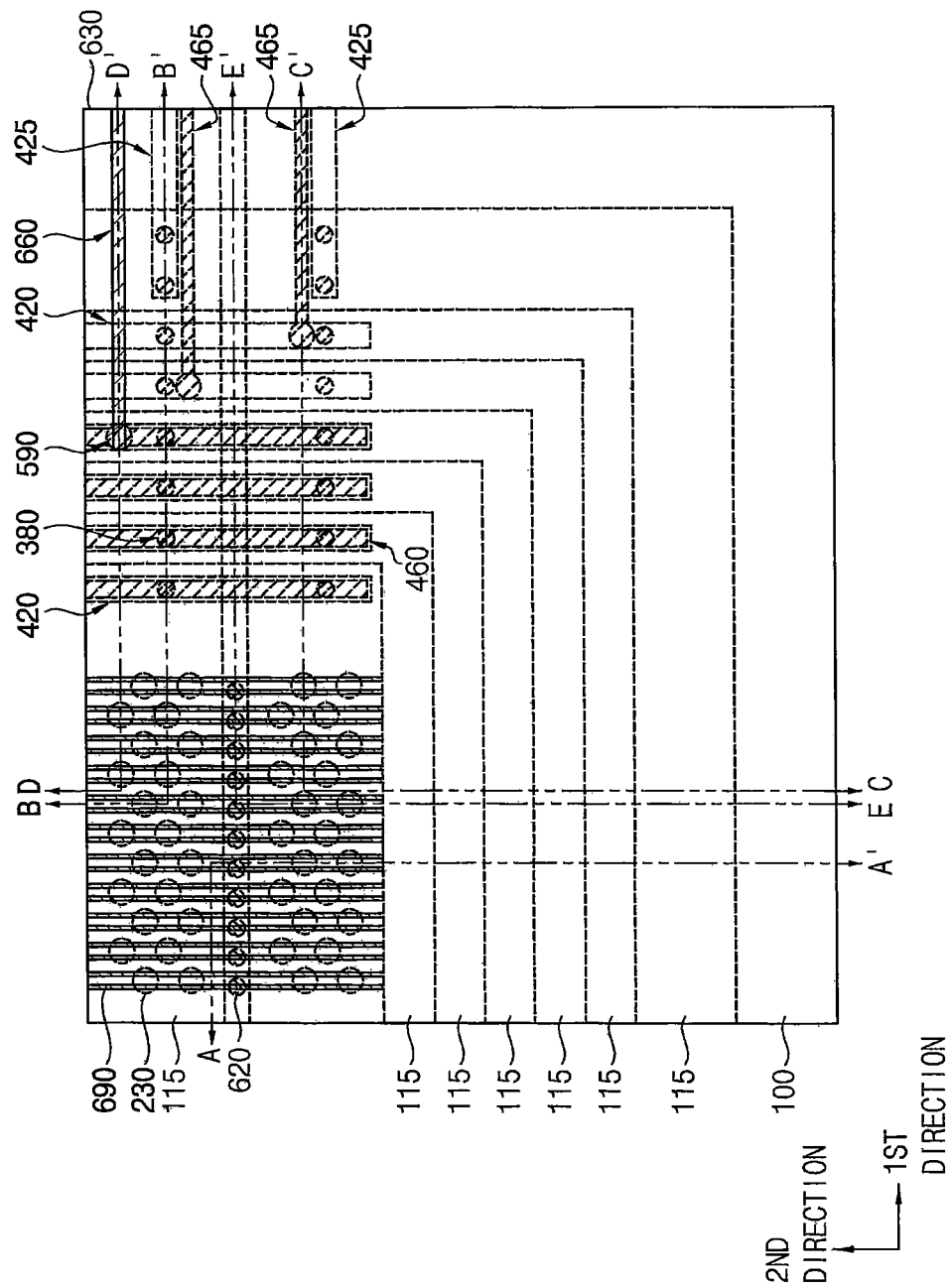
Figure 3:
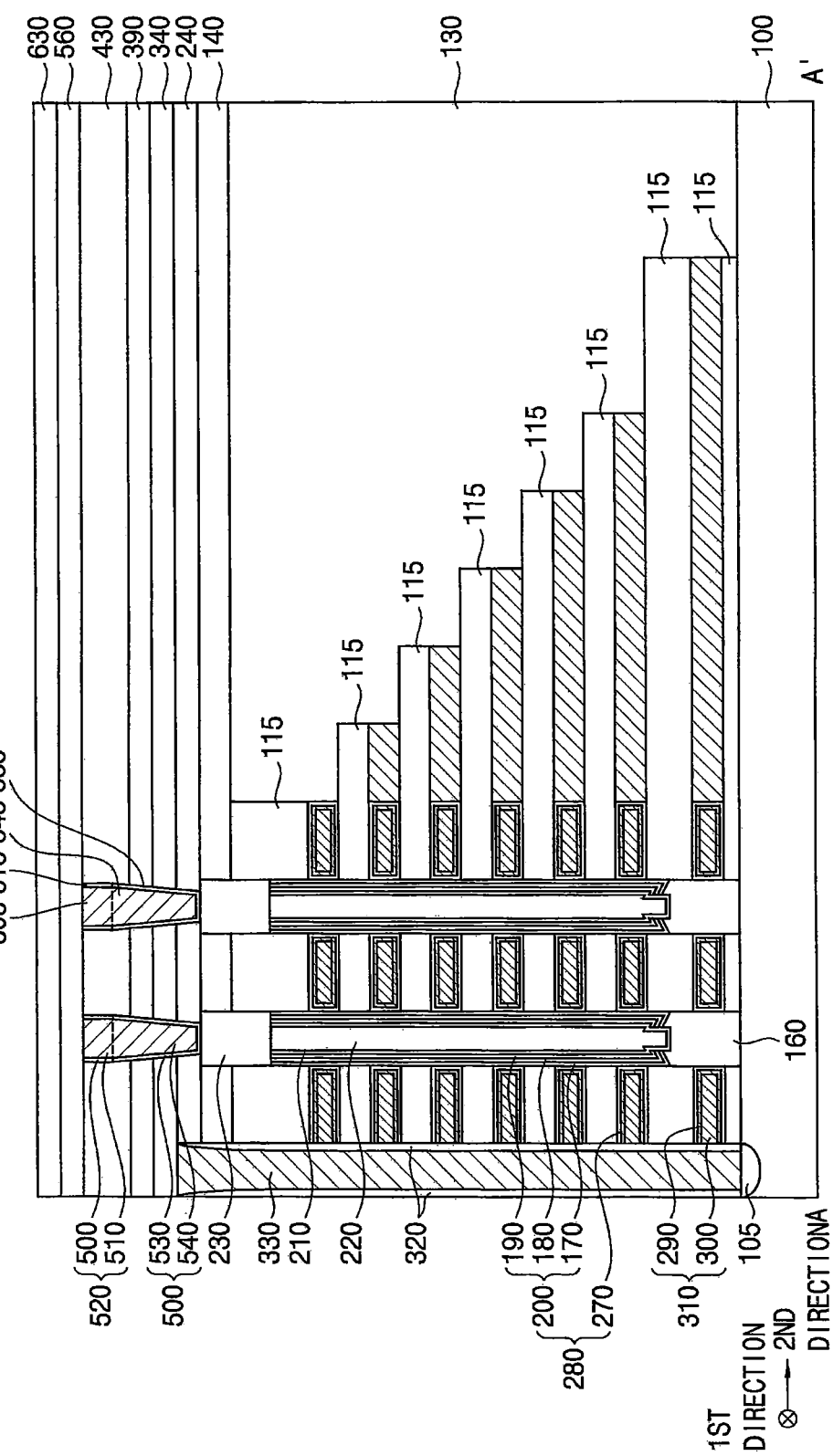
Figure 4:
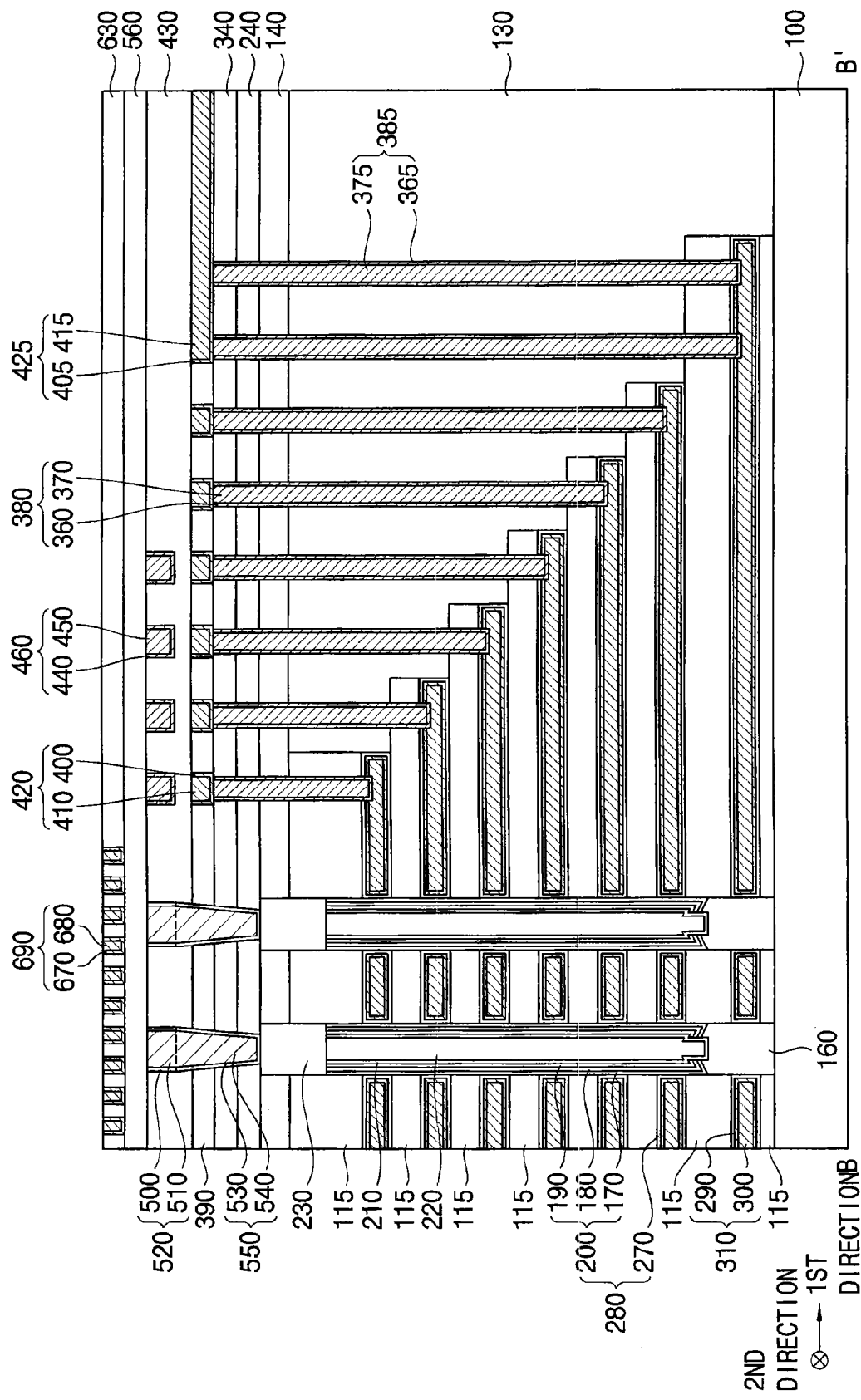
Figure 5:
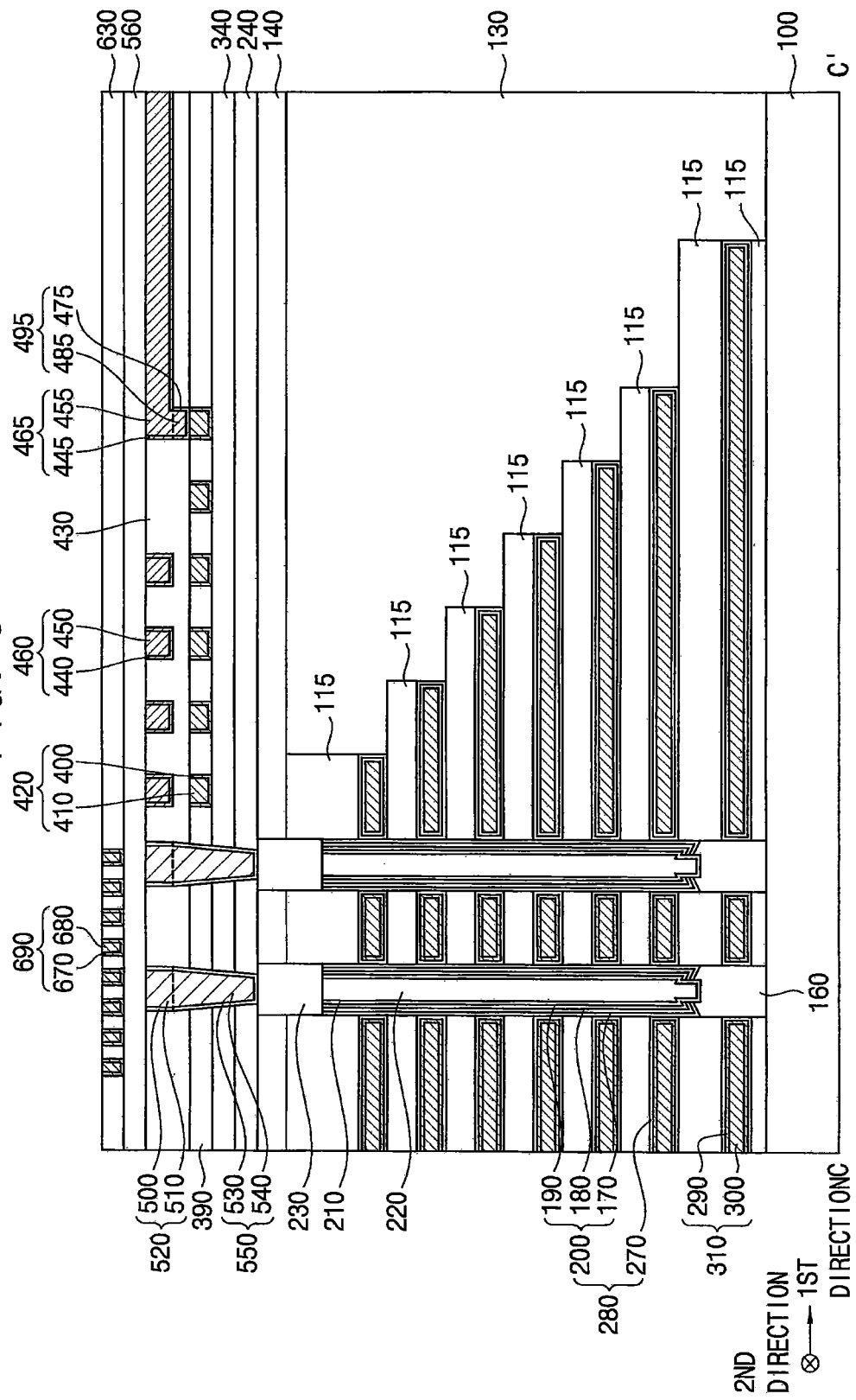
Figure 6:
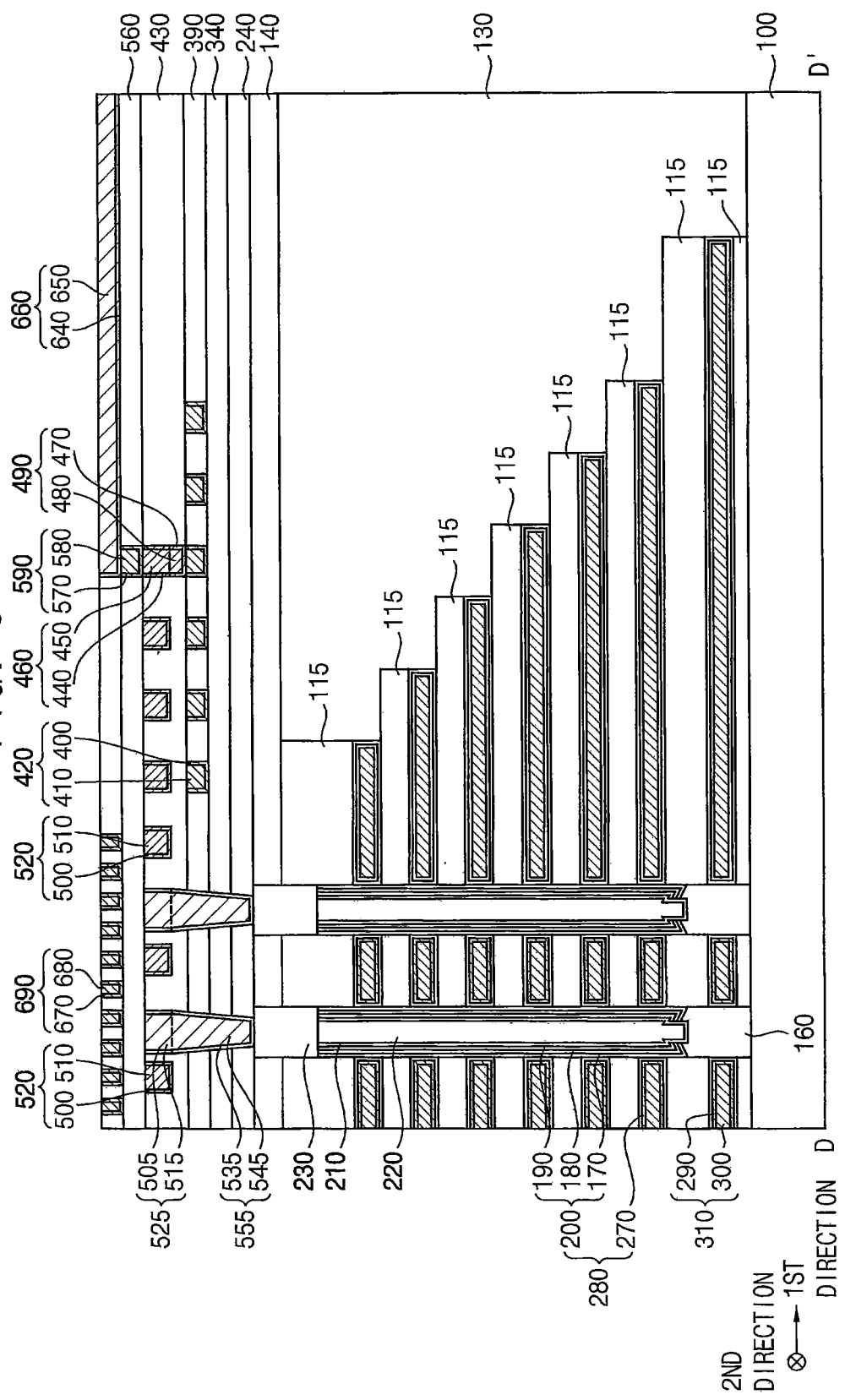
Figure 7:
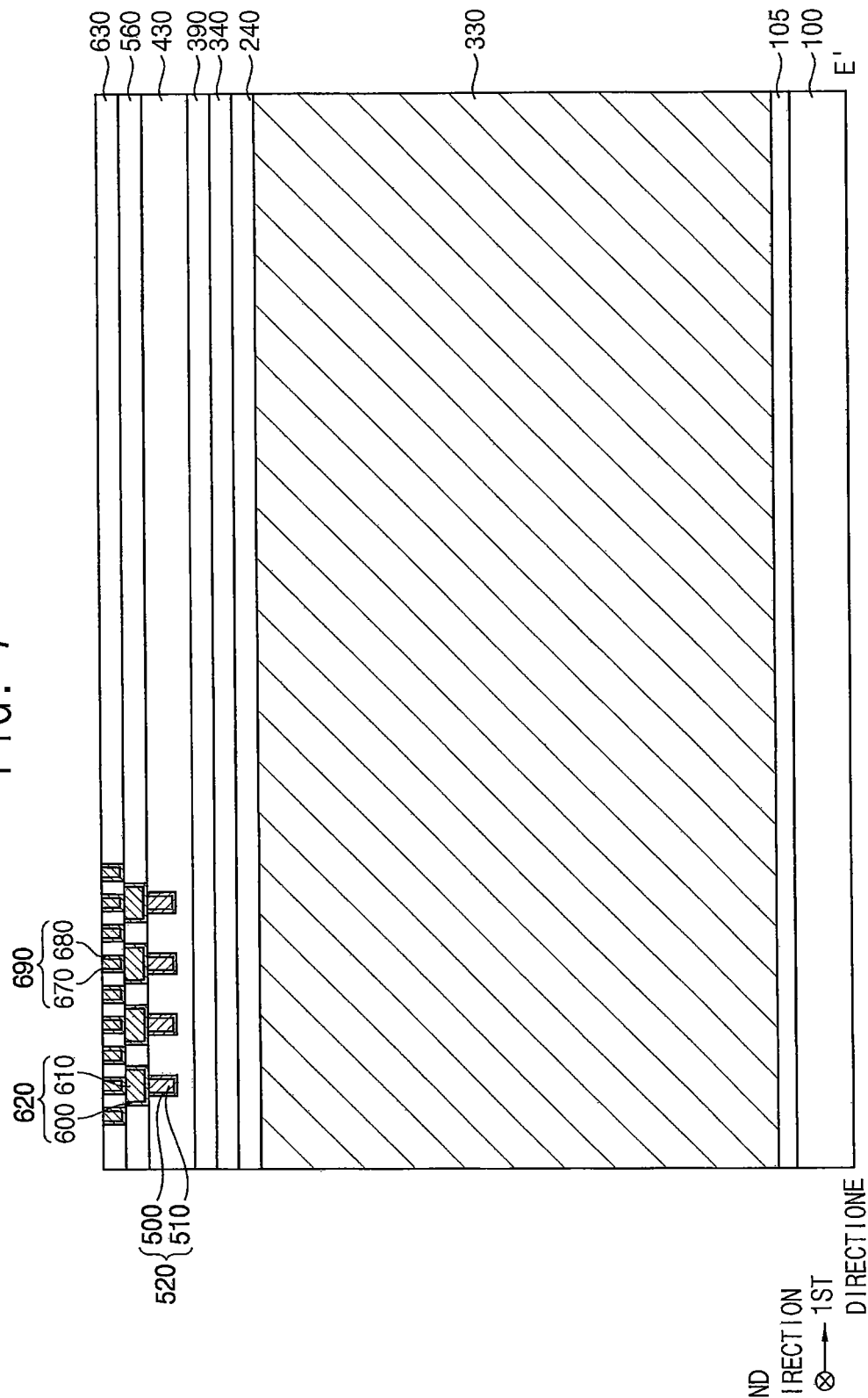

FIGS. 1 through 13 are plan views and cross-sectional views illustrating a vertical memory device in accordance with example embodiments. FIG. 1 is a plan view illustrating regions of a substrate on which the vertical memory device may be formed, and FIGS. 2 through 13 illustrate a region X of FIG. 1. Particularly, FIGS. 1, 2, 8 and 13 are plan views, and FIGS. 3-7 and 9-12 are cross-sectional views. Among the cross-sectional views, FIG. 3 is a cross-sectional view along a cutline A-A' of FIG. 2, FIG. 4 is a cross-sectional view along a cutline B-B' of FIG. 2, FIG. 5 is a cross-sectional view along a cutline C-C' of FIG. 2, FIG. 6 is a cross-sectional view along a cutline D-D' of FIG. 2, and FIG. 7 is a cross-sectional view along a cutline E-E' of FIG. 2.

Figure 8B:
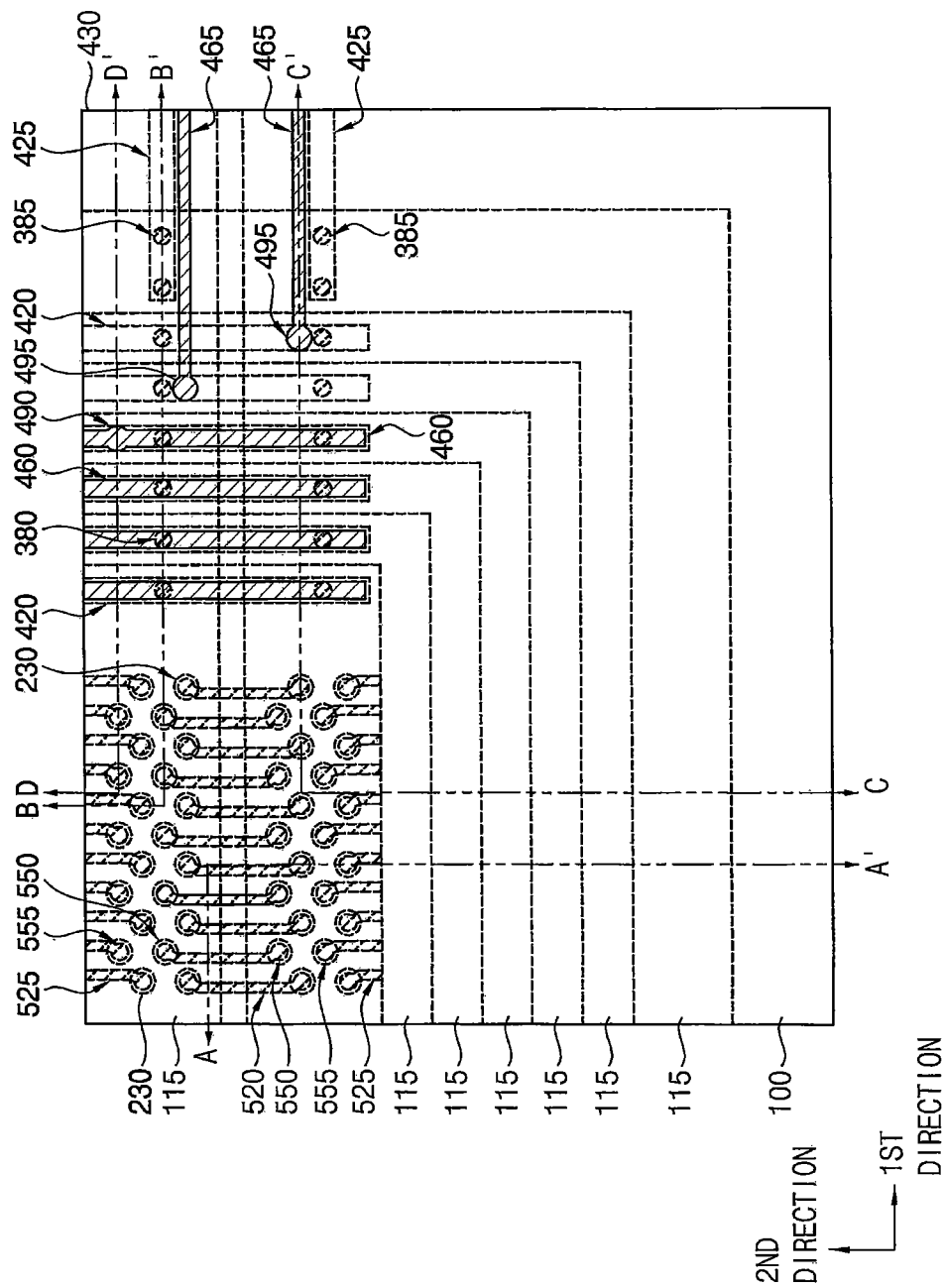
Figure 8C:
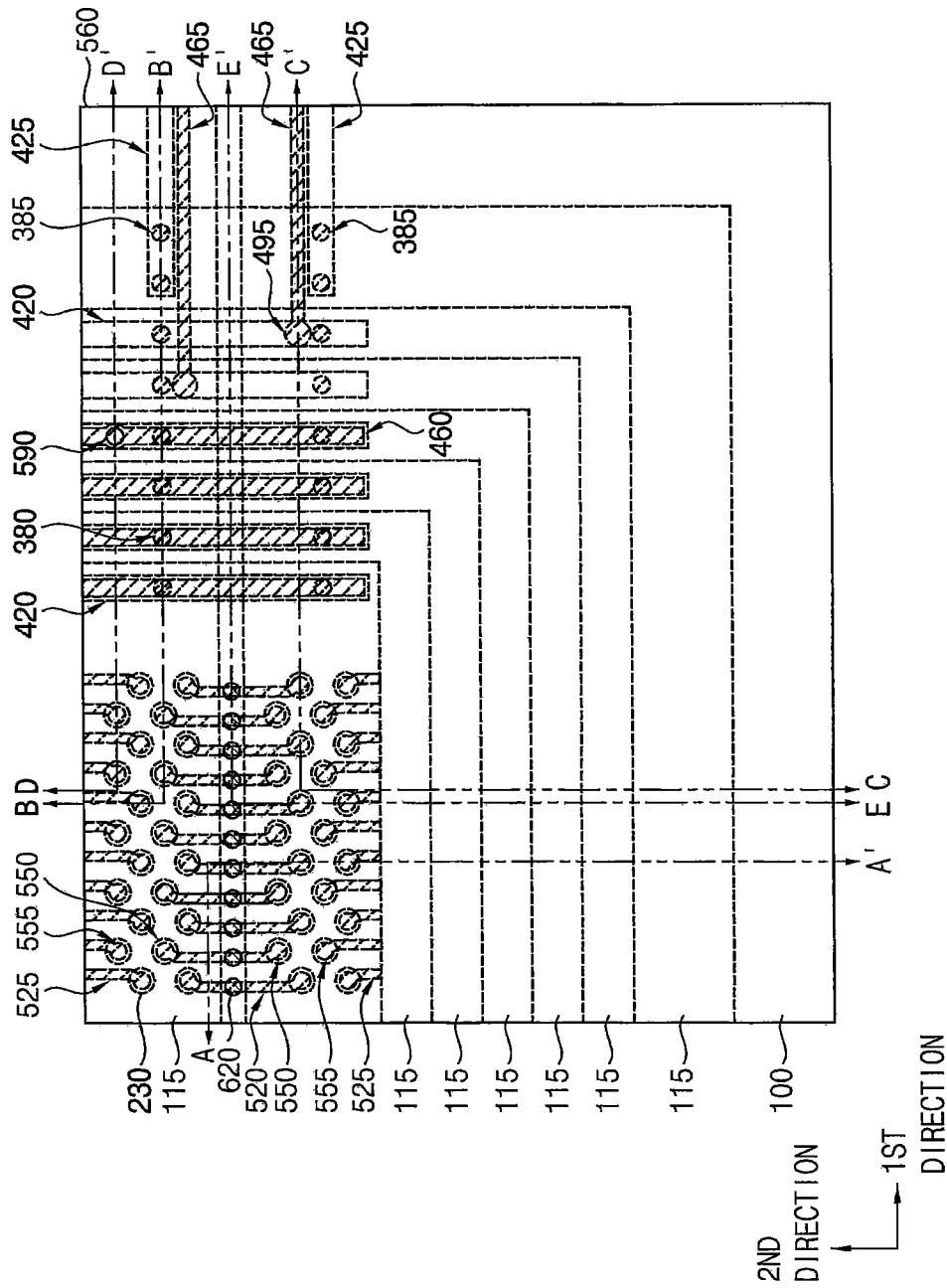
Figure 9A:
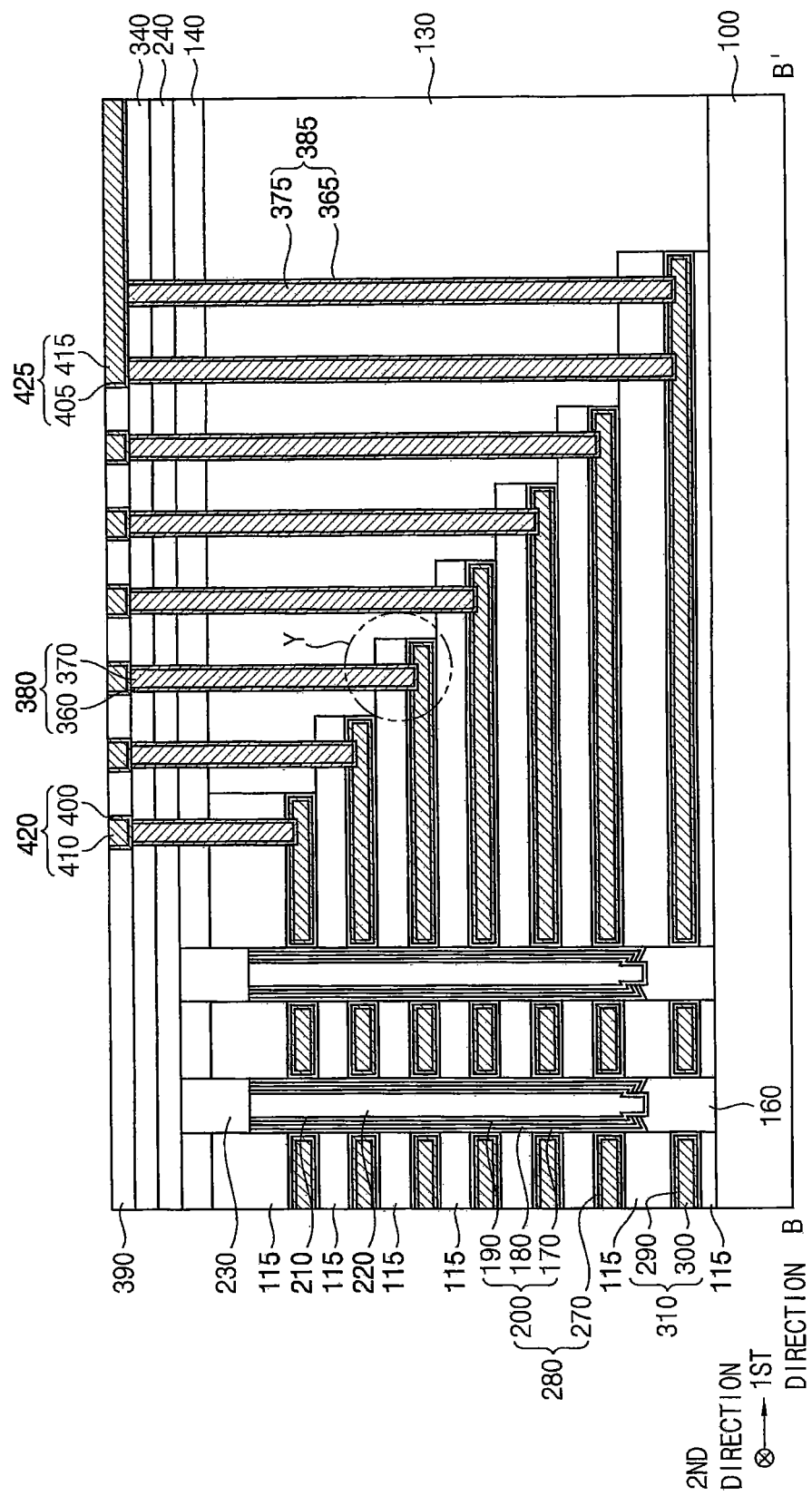
Figure 9B:
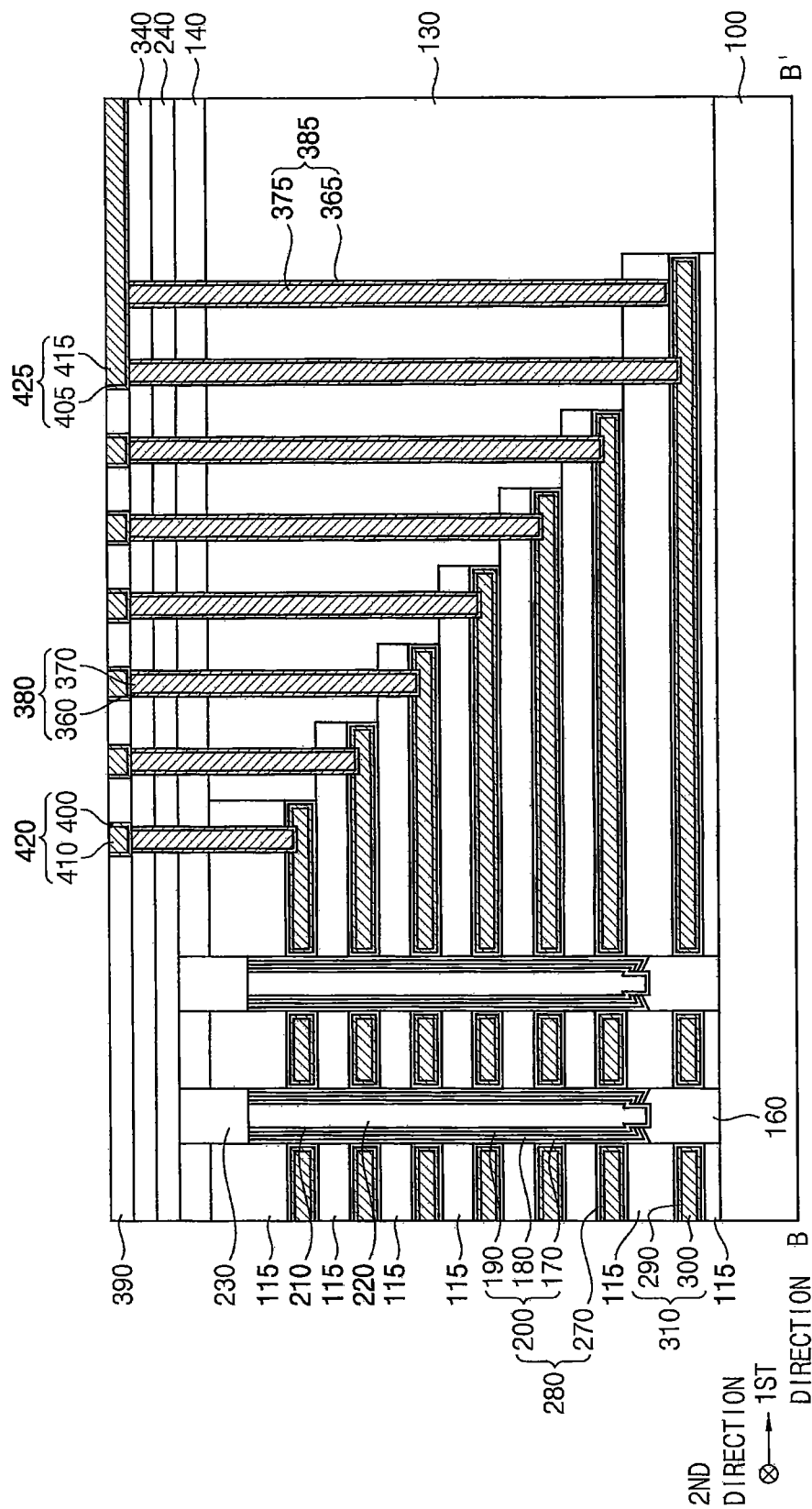

FIG. 8A is a plan view of a structure including elements under a fifth insulating interlayer on the substrate, FIG. 8B is a plan view of a structure including elements under a sixth insulating interlayer on the substrate, and FIG. 8C is a plan view of a structure including elements under a seventh insulating interlayer on the substrate. Additionally, FIGS. 9A and 9B are cross-sectional views, respectively, along a cutline B-B' of FIG. 8A, and FIGS. 10 through 12 are enlarged views, respectively, of a region Y of FIG. 9A.

For purposes of illustration, two directions substantially parallel to a top surface of the substrate and crossing each other are defined as first and second directions, respectively, and a direction substantially perpendicular to the top surface of the substrate is defined as a third direction. In example embodiments, the first and second directions may be substantially perpendicular to each other. Throughout the present disclosure, the first, second and third directions are as defined above and as shown in the drawings.

Referring to FIG. 1, a substrate 100 on which the vertical non-volatile memory device may be formed may include first, second, third and fourth regions I, II, III and IV. The first region I may serve as a memory cell region in which memory cells may be formed, the second region II may serve as a region in which X-decoders may be formed, the third region III may serve as a region in which page buffers and Y-decoders may be formed, and the fourth region IV may serve as a peripheral circuit region in which peripheral circuits may be formed. The second and third regions II and III may form a core region, and the core region and the peripheral circuit region may form a peripheral region.

Hereinafter, the region X located at an edge of the first region I will be illustrated.

Referring to FIGS. 2-7, 8A, 8B, 8C and 9A, the vertical non-volatile memory device may include gate electrodes 310, a channel 210, a second charge storage structure 280, and first and second contact plugs 380 and 385.

The vertical non-volatile memory device may further include an insulation pattern 115, an insulation pad 127, a semiconductor pattern 160, a filling pattern 220, a capping pattern 230, first to eighth insulating interlayers 130, 140, 240, 340, 390, 430, 560 and 630, a common source line (CSL) 330, a second spacer 320, first to sixth wirings 420, 425, 460, 465, 660 and 690, and first to sixth vias 490, 495, 550, 555, 590 and 620 on the substrate 100.

The substrate 100 may include a semiconductor material, e.g., silicon or germanium.

The gate electrodes 310 may be formed at a plurality of levels along the third direction on the substrate 100, and may be spaced apart from each other. The insulation pattern 115 may be interposed between the gate electrodes 310 stacked along the third direction.

Each of the gate electrodes 310 may extend in the first direction, and a plurality of gate electrodes 310 may be formed in the second direction. The gate electrodes 310 disposed in the second direction may be separated by the CSL 330 extending in the first direction and the second spacer 320 on each of opposed sidewalls of the CSL 330. An impurity region 105 may be formed at an upper portion of the substrate 100 adjacent the CSL 330. The impurity region 105 may include n-type impurities, e.g., phosphorus, arsenic, etc.

The gate electrode 310 and the insulation pattern 115 sequentially stacked in the third direction may form a "stair" shape, and a plurality of stairs stacked along the third direction may form a "stair-step" pattern or "staircase structure." Thus, in the present specification, each "stair" of the "staircase structure" may mean not only an exposed portion thereof but also a portion thereof covered by an upper "stair." That is, the "stair" may mean the whole portion of the gate electrode 310 and the insulation pattern 115 sequentially stacked in the third direction.

The staircase structure may include a plurality of stairs having lengths, respectively, in the first direction that may decrease from a lowermost level toward an uppermost level, and thus both of the gate electrodes 310 and the insulation patterns 115 in the stairs may have lengths in the first direction that may also decrease from a lowermost level toward an uppermost level. In example embodiments, the stairs may have lengths in the first direction that may decrease by a constant value, and thus portions of the stairs along the third direction not covered or overlapped by upper stairs may have a constant length in the first direction. Likewise, the gate electrodes 310 stacked along the third direction may have lengths in the first direction that may decrease by a constant first value, and thus portions of the gate electrodes 310 not covered or overlapped by upper gate electrodes 310 may have a constant length in the first direction.

However, a difference between a length in the first direction of "a first stair" (for example, a lowermost stair in FIG. 4) among the plurality of stairs and a length in the first direction of a second stair, which may be one of the plurality of stairs nearest to "the first stair" and disposed over "the first stair" may have a second value greater than the first value. In example embodiments, the second value may be equal to or more than twice of the first value.

Accordingly, from a first gate electrode 310 in the first stair among the plurality of gate electrodes 310 to a second gate electrode 310 in the second stair among the plurality of gate electrodes 310, which may be one of the plurality of gate electrodes 310 nearest to the first gate electrode 310 and disposed over the first gate electrode 310, lengths in the first direction of the first and second gate electrodes 310 may be reduced by the second value greater than the first value. Additionally, a portion of the first gate electrode 310 not covered or overlapped by upper gate electrodes 310 may have an area greater than those of portions of other gate electrodes 310 not covered or overlapped by upper gate electrodes 310.

In example embodiments, the first gate electrode 310 may be a lowermost one of the plurality of gate electrodes 310 disposed at a plurality of levels, respectively. In other example embodiments, the first gate electrode 310 may be an uppermost one of the plurality of gate electrodes 310 disposed at a plurality of levels, respectively. In still other example embodiments, the first gate electrode 310 may be a middle one of the plurality of gate electrodes 310 disposed at a plurality of levels, respectively.

The gate electrode 310 may include a ground selection line (GSL), a word line, and a string selection line (SSL) sequentially stacked in the third direction. Each of the GSL, word line and the SSL may be formed at one level or at a plurality of levels. One or more than one dummy word lines may be further formed between the GSL and the word line and/or between the SSL and the word line. In example embodiments, the GSL may be formed at one level, the SSL may be formed at two levels, and the word line may be formed at even numbers of levels between the GSL and the SSL. Thus, the first gate electrode 310 may be a GSL or an SSL.

The gate electrode 310 may include a gate conductive pattern 300, and a gate barrier pattern 290 on or covering a top, a bottom, and at least a portion of a sidewall of the gate conductive pattern 300. The gate conductive pattern 300 may include a metal having a low electrical resistance, e.g., tungsten, titanium, tantalum, platinum, etc. The gate barrier pattern 290 may include a metal nitride, e.g., titanium nitride, tantalum nitride, etc. Additionally or alternatively, the gate barrier pattern 290 may have a first pattern including a metal and a second pattern including a metal nitride.

A top, a bottom and a portion of a sidewall of the gate electrode 310 may be covered by a second blocking pattern 270. Particularly, the second blocking pattern 270 may cover the gate barrier pattern 290 of the gate electrode 310. The second blocking pattern 270 may include an oxide, e.g., silicon oxide.

The insulation pattern 115 may include an oxide, e.g., silicon oxide, the CSL 330 may include a metal, a metal nitride and/or a metal silicide, and the second spacer 320 may include a nitride, e.g., silicon nitride.

The insulation pad 127 may be formed at a sidewall of each gate electrode 310, and may have a length in the second direction decreasing from a lowermost level toward an uppermost level. The insulation pad 127 may include a nitride, e.g., silicon nitride.

A second structure may be formed through the staircase structure, and may contact a top surface of the substrate 100. That is, the second structure may include the semiconductor pattern 160, a first structure, and the capping pattern 230 sequentially stacked on the substrate 100, and the first structure may include a first charge storage structure 200, the channel 210, and the filling pattern 220. The second structure may extend in the third direction, and may penetrate or extend through the gate electrodes 310 and the insulation patterns 115 alternately and repeatedly stacked on the substrate 100.

In example embodiments, a plurality of second structures may be formed both in the first and second directions, which may form a second structure array. Each of the plurality of second structures may include the channel 210, and thus subsequent explanation on a channel array may be applied to explanation on the second structure array.

The semiconductor pattern 160 may include single crystalline silicon or single crystalline germanium, and in some cases, impurities may be doped thereinto. In example embodiments, a top surface of the semiconductor pattern 160 may be located between a top surface and a bottom surface of one of the insulation patterns 115, which may be formed at a second level from the top surface of the substrate 100.

The channel 210 may be formed on the semiconductor pattern 160, and may have a cup-like shape. The channel 210 may include doped or undoped polysilicon, or amorphous silicon. A plurality of channels 210 may be formed both in the first and second directions, which may form the channel array.

In example embodiments, the channel array may include a first channel column having a plurality of first channels disposed in the first direction, and a second channel column having a plurality of second channels disposed in the first direction and being spaced apart from the first channel column in the second direction. The first and second channels may form an acute angle with the first direction and/or the second direction. Thus, the first and second channels may be disposed in a zigzag layout with respect to the first direction. According as the first and second channels are disposed in a zigzag layout, more numbers of channels 210 may be formed in an area.

The first and second channel columns may be alternately and repeatedly disposed in the second direction. In example embodiments, the first and second channel columns may be disposed in the second direction twice to form a channel block, and a plurality of channel blocks may be formed in the second direction to be spaced apart from each other. Hereinafter, four channel columns adjacent an edge of an uppermost insulation pattern 115 along the second direction among the plurality of channel columns in each channel block may be referred to as first, second, third and fourth channel columns in this order. That is, FIG. 2 shows two channel blocks spaced apart from each other in the second direction, and each channel block includes first, second, third and fourth channel columns disposed in the second direction.

Additionally or alternatively, the channel array may include a plurality of channels 210 in a layout which differs from a zigzag layout.

A tunnel insulation pattern 190, a charge storage pattern 180 and a first blocking pattern 170 may be sequentially stacked on an outer sidewall of the channel 210, which may form the first charge storage structure 200. The first charge storage structure 200 may contact a portion of the second blocking pattern 270 on or covering a sidewall of the gate electrode 310, and the first charge storage structure 200 and the second blocking pattern 270 may form the second charge storage structure 280. The first and second blocking patterns 170 and 270 may form a blocking pattern structure. The first charge storage structure 200 may have a cup-like shape of which a central bottom portion is opened.

The tunnel insulation pattern 190 may include an oxide, e.g., silicon oxide, the charge storage pattern 180 may include a nitride, e.g., silicon nitride, and the first blocking pattern 170 may include an oxide, e.g., silicon oxide.

The filling pattern 220 may fill an inner space of the channel 210 having the cup-like shape. The filling pattern 220 may include an oxide, e.g., silicon oxide.

The first structure including the first charge storage structure 200, the channel 210 and the filling pattern 220 may be adjacent the word line and the SSL.

The capping pattern 230 may be formed on the first structure. The capping pattern 230 may include doped or undoped polysilicon, or amorphous silicon.

The first insulating interlayer 130 may be formed on the substrate 100, and may cover a sidewall of the staircase structure. The second insulating interlayer 140 may be formed on the first insulating interlayer 130 and the staircase structure, and may cover the capping pattern 230. The third insulating interlayer 240 may be formed on the second insulating interlayer 140 and the capping pattern 230, and may cover the CSL 330 and the second spacer 320. The fourth insulating interlayer 340 may be formed on the third insulating interlayer 240 and the CSL 330. The first to fourth insulating interlayers 130, 140, 240 and 340 may include an oxide, e.g., silicon oxide, and some or all of the first to fourth insulating interlayers 130, 140, 240 and 340 may be merged to each other. Additionally, the first and second insulating interlayers 130 and 140 may be merged with the insulation pattern 115.

Figure 10:
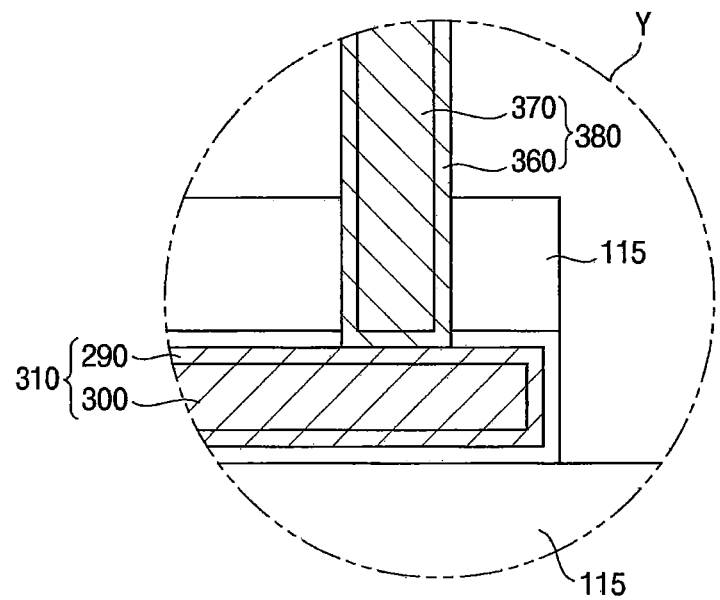
Figure 11:
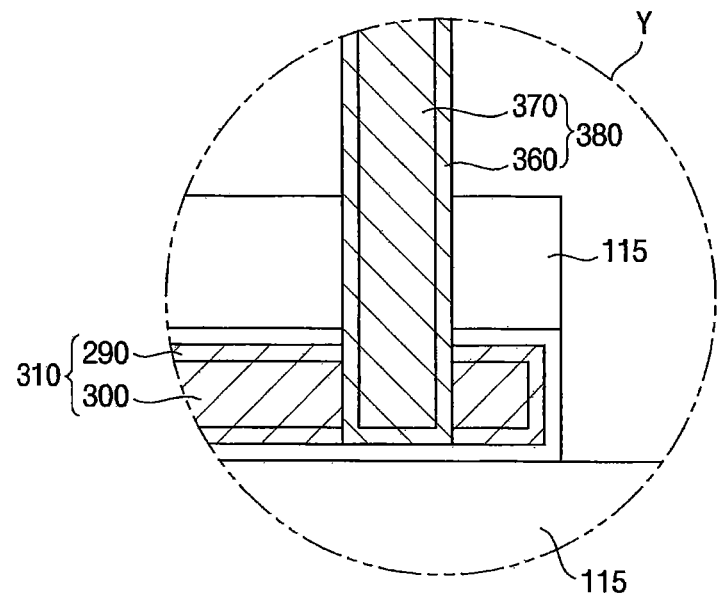
Figure 12:
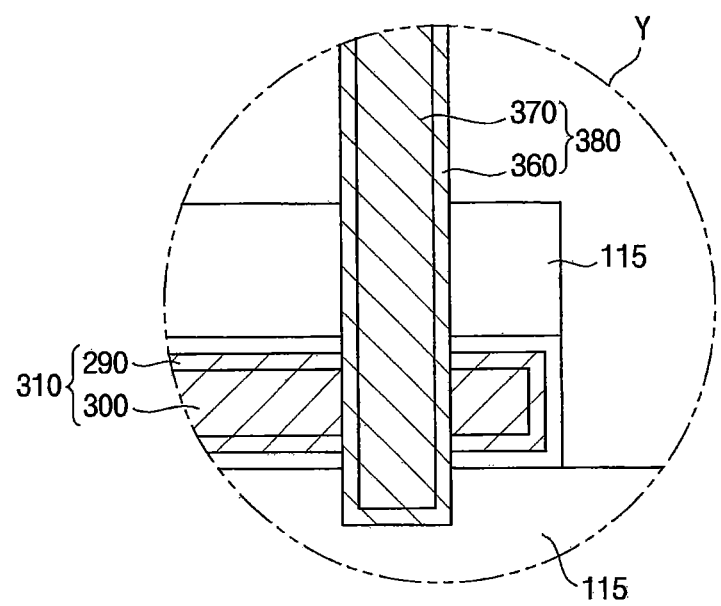
Figure 13:
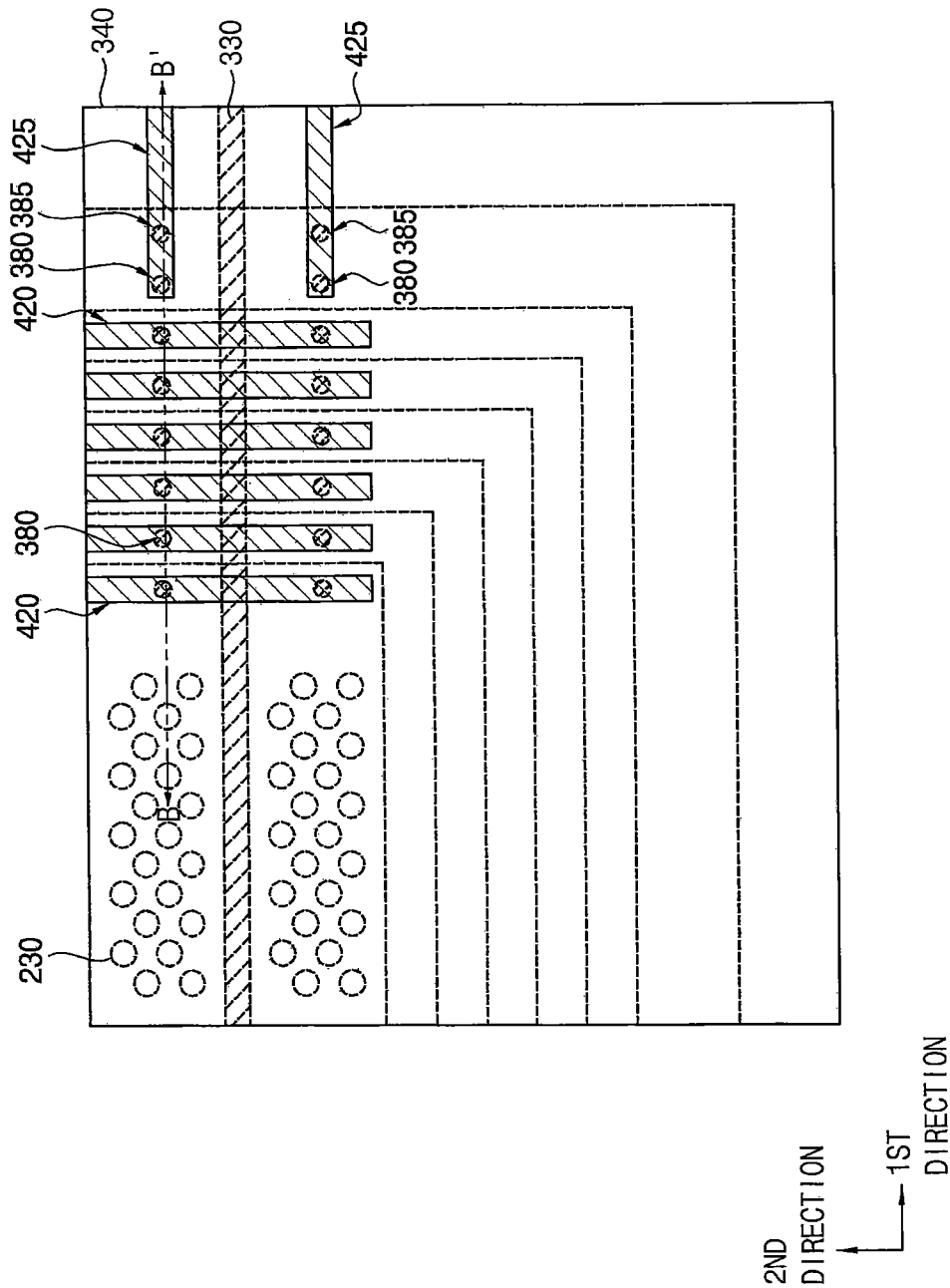

Referring now to FIGS. 10 to 12 together with FIGS. 2-7, 8A, 8B, 8C and 9A, each of the first contact plugs 380 may penetrate or extend through the first to fourth insulating interlayers 130, 140, 240 and 340, the insulation pattern 115, the second blocking pattern 270 and the gate barrier pattern 290, and may contact (which may refer to herein as physical and/or electrical contact as appropriate) the gate conductive pattern 300. That is, each of the first contact plugs 380 may penetrate or extend through the first to fourth insulating interlayers 130, 140, 240 and 340, a portion of the insulation pattern 115 in each of the stairs not covered by upper stairs, and portions of the second blocking pattern 270 and the gate barrier pattern 290 under the portion of the insulation pattern 115, and may contact the gate conductive pattern 300. Each of the first contact plugs 380 may penetrate or extend through a portion of the gate barrier pattern 290 on a top surface of the gate conductive pattern 300 to contact the gate conductive pattern 300, and further contact an upper portion of the gate conductive pattern 300.

However, the inventive concepts may not be limited thereto, but any case in which each of the first contact plugs 380 may contact at least a portion of the gate electrode 310 may be included in the scope of the inventive concepts. In an example embodiment, referring to FIG. 10, each of the first contact plugs 380 may not penetrate or extend through the portion of the gate barrier pattern 290 on the top surface of the gate conductive pattern 300, but contact the top surface of the gate conductive pattern 300 only, or may partially penetrate or extend through the gate barrier pattern 290 not to contact the gate conductive pattern 300. Additionally or alternatively, referring to FIG. 11, each of the first contact plugs 380 may penetrate or extend through the portion of the gate barrier pattern 290 on the top surface of the gate conductive pattern 300 and the gate conductive pattern 300, and may contact or partially penetrate or extend through a portion of the gate barrier pattern 290 beneath on a bottom surface of the gate conductive pattern 300. Additionally or alternatively, referring to FIG. 12, each of the first contact plugs 380 may penetrate or extend through all (e.g., an entirety) of the gate conductive pattern 300, and the portions of the gate barrier pattern 290 on the top surface of and beneath the bottom surface of the gate conductive pattern 300, and accordingly, a bottom surface of each of the first contact plugs 380 may be located in the second blocking pattern 270 or in the insulation pattern 115 thereunder.

The first contact plug 380 exposing the gate electrode 310 at the uppermost level may not penetrate or extend through the first insulating interlayer 130.

Each of the first contact plugs 380 may be formed on a portion of a corresponding stair not covered by upper stairs. In example embodiments, the first contact plugs 380 may be disposed in the first direction at a constant or uniform distance. In an example embodiment, when viewed from above (e.g., in plan view), the first contact plugs 380 may be disposed in the same line as a channel column of each channel block, e.g., the second channel column. Additionally or alternatively, referring to FIG. 13, when viewed from above, the first contact plugs 380 may be disposed in the first direction at a central portion in the second direction of each channel block. That is, the first contact plugs 380 may be disposed in the first direction at any position in the second direction of each channel block.

Additionally or alternatively, the first contact plugs 380 may be disposed in a zigzag layout in the first direction.

In an example embodiment, the second contact plug 385 may penetrate or extend through the first to fourth insulating interlayers 130, 140, 240 and 340, the insulation pattern 115, the second blocking pattern 270 and the gate barrier pattern 290, and may contact the gate conductive pattern 300 of the first gate electrode 310. However, the inventive concepts may not be limited thereto. That is, the second contact plug 385, like the first contact plugs 380, may contact or partially penetrate or extend through a portion of the gate barrier pattern 290 on a top surface of the gate conductive pattern 300, or may penetrate or extend through the gate conductive pattern 300 to contact or partially penetrate or extend through a portion of the gate barrier pattern 290 beneath a bottom surface of the gate conductive pattern 300. Further, the second contact plug 385 may penetrate or extend through all (e.g., an entirety) of the gate conductive pattern 300, and the portions of the gate barrier pattern 290 on the top surface of and beneath the bottom surface of the gate conductive pattern 300, and accordingly, a bottom surface of the second contact plugs 385 may be located in the second blocking pattern 270 or in the insulation pattern 115 thereunder.

However, unlike the first contact plugs 380, in some cases, the second contact plugs 385 may not contact the gate electrode 310. That is, referring to FIG. 9B, the second contact plug 385 may contact or penetrate or extend through a portion of the second blocking pattern 270 on a top surface of the gate electrode 310, but may not contact the gate electrode 310. Further, a bottom surface of the second contact plug 385 may be located in the insulation pattern 115 over the gate electrode 310, and may not contact the second blocking pattern 270.

In example embodiments, the second contact plug 385 may be formed on the first gate electrode 310 adjacent the first contact plug 380 on the first gate electrode 310, and may be spaced apart from the first contact plug 380 on the first gate electrode 310 in the first direction at a distance substantially the same as that between the first contact plugs 380 in the first direction. That is, the first and second contact plugs 380 and 385 may be disposed in the same line in the first direction, Additionally or alternatively, when the first contact plugs 380 are disposed in a zigzag layout in the first direction, the first and second contact plugs 380 and 385 may be also disposed in a zigzag layout in the first direction.

As illustrated above, the first gate electrode 310 may be formed not only in the lowermost level stair but also in the uppermost level stair, and further may be formed in any level stair. Additionally, a plurality of first gate electrodes 310 may be formed. Accordingly, the second contact plug 385, which may be formed on the first gate electrode 310, may be also formed on the lowermost level stair, the uppermost level stair, or any level stair, and a plurality of second contact plugs 385 may be formed. Further, not only one second contact plug 385 but also a plurality of second contact plugs 385 may be formed on each of the first gate electrodes 310.

Hereinafter, only the case in which the first stair is the lowermost level stair and only one second contact plug 385 is formed on the first stair will be illustrated.

The first contact plug 380 may include a first conductive pattern 370, and a first barrier pattern 360 on or covering a bottom and a sidewall of the first conductive pattern 370.

The second contact plug 385 may include a second conductive pattern 375, and a second barrier pattern 365 on or covering a bottom and a sidewall of the second conductive pattern 375. Each of the first and second conductive patterns 370 and 375 may include a metal, e.g., tungsten, titanium, tantalum, etc., and each of the first and second barrier patterns 360 and 365 may include a metal nitride, e.g., titanium nitride, tantalum nitride, tungsten nitride, etc. Additionally or alternatively, each of the first and second barrier patterns 360 and 365 may have a multi-layered structure including a metal layer and a metal nitride layer.

The fifth to eighth insulating interlayers 390, 430, 560 and 630 may be sequentially stacked on the fourth insulating interlayer 340, and the first and second contact plugs 380 and 385, and may include an oxide, e.g., silicon oxide. Thus, some or all of the fifth to eighth insulating interlayers 390, 430, 560 and 630 may be merged with each other, and may be also merged with the underlying fourth insulating interlayer 340.

Each of the first to sixth wirings 420, 425, 460, 465, 660 and 690, and the first to sixth vias 490, 495, 550, 555, 590 and 620 may include a conductive pattern, and a barrier pattern on or covering a bottom and a sidewall of the conductive pattern. The conductive pattern may include a metal, e.g., copper, aluminum, tungsten, titanium, tantalum, etc., and the barrier pattern may include a metal nitride, e.g., titanium nitride, tantalum nitride, tungsten nitride, etc. Additionally or alternatively, the barrier pattern may have a multi-layered structure including a metal layer and a metal nitride layer.

Particularly, the first and second wirings 420 and 425 may penetrate or extend through the fifth insulating interlayer 390 to contact top surfaces of the first and second contact plugs 380 and 385. The first wiring 420 may include a third conductive pattern 410, and a third barrier pattern 400 on or covering a bottom and a sidewall of the third conductive pattern 410. The second wiring 425 may include a fourth conductive pattern 415, and a fourth barrier pattern 405 on or covering a bottom and a sidewall of the fourth conductive pattern 415.

In example embodiments, the first wiring 420 may extend in the second direction, and a plurality of first wirings 420 may be formed in the first direction. Additionally, the second wiring 425 may extend in the first direction. Each of the first wirings 420 may contact the top surface of the first contact plug 380, and the second wiring 425 may contact the top surfaces of the first and second contact plugs 380 and 385 on the first stair.

Each of the first wirings 420 may extend in the second direction to contact top surfaces of the first contact plugs 380 in some of the plurality of channel blocks disposed in the second direction. In an example embodiment, each of the first wirings 420 may extend in the second direction to contact top surfaces of the first contact plugs 380 in four channel blocks adjacent to each other in the second direction. The second wiring 425 may extend in the first direction to be connected to a wiring in the second region II, and thus an electrical signal may be applied thereto.

The third and fourth wirings 460 and 465 may penetrate or extend through an upper portion of the sixth insulating interlayer 430, and the first and second vias 490 and 495 may penetrate or extend through a lower portion of the sixth insulating interlayer 430 to contact top surfaces of the first and second wirings 420 and 425.

The third wiring 460 may include a fifth conductive pattern 450, and a fifth barrier pattern 440 on or covering a bottom and a sidewall of the fifth conductive pattern 450. The fourth wiring 465 may include a sixth conductive pattern 455, and a sixth barrier pattern 445 on or covering a bottom and a sidewall of the sixth conductive pattern 455. The first via 490 may include a seventh conductive pattern 480, and a seventh barrier pattern 470 on or covering a bottom and a sidewall of the seventh conductive pattern 480. The second via 495 may include an eighth conductive pattern 485, and an eighth barrier pattern 475 on or covering a bottom and a sidewall of the eighth conductive pattern 485. However, the first via 490 and the third wiring 460 sequentially stacked may be integrally formed, and the second via 495 and the fourth wiring 465 sequentially stacked may be also formed integrally.

In example embodiments, the third wiring 460 may extend in the second direction, and a plurality of third wirings 460 may be formed in the first direction. The fourth wiring 465 may extend in the first direction. The third wirings 460 may be electrically connected to the first wirings 420 through the first via 490, and the fourth wirings 465 may be electrically connected to the first wirings 420 through the second via 495.

In an example embodiment, each of the third wirings 460 may extend in the second direction to be formed on four channel blocks adjacent to each other in the second direction. The fourth wiring 465 may extend in the first direction to be connected to a wiring in the second region II, and thus an electrical signal may be applied thereto.

First and second connection wirings 520 and 525 may penetrate or extend through an upper portion of the sixth insulating interlayer 430, and the third and fourth vias 550 and 555 may penetrate or extend through a lower portion of the sixth insulating interlayer 430 and the third, fourth and fifth insulating interlayers 240, 340 and 390 to contact a top surface of the capping pattern 230.

The first connection wiring 520 may include a ninth conductive pattern 510, and a ninth barrier pattern 500 on or covering a bottom and a sidewall of the ninth conductive pattern 510. The second connection wiring 525 may include a tenth conductive pattern 515, and a tenth barrier pattern 505 on or covering a bottom and a sidewall of the tenth conductive pattern 515. The third via 550 may include an eleventh conductive pattern 540, and an eleventh barrier pattern 530 on or covering a bottom and a sidewall of the eleventh conductive pattern 540. The fourth via 555 may include a twelfth conductive pattern 545, and a twelfth barrier pattern 535 on or covering a bottom and a sidewall of the twelfth conductive pattern 545. The third via 550 and the first connection wiring 520 sequentially stacked may be integrally formed, and the fourth via 555 and the second connection wiring 525 sequentially stacked may be also formed integrally.

The third and fourth vias 550 and 555 may be formed on the capping patterns 230 on the channels 210, respectively. Each of the first and second connection wirings 520 and 525 may extend in the second direction, and the first and second connection wirings 520 and 525 may be electrically connected to the third and fourth vias 550 and 555, respectively. Thus, the first and second connection wirings 520 and 525 may electrically connect the channels 210 included in both channel blocks spaced apart from each other in the second direction by the CSL 330. In example embodiments, the first connection wiring 520 may connect the channels 210 included in the third and fourth channel columns of a first channel block and the channels 210 included in the first and second channel columns of a second channel block spaced apart from the first channel block in the second direction. The second connection wiring 525 may connect the channels 210 included in the third and fourth channel columns of the second channel block and the channels 210 included in the first and second channel columns of a third channel block spaced apart from the second channel block in the second direction.

The fifth and sixth vias 590 and 620 may penetrate or extend through the seventh insulating interlayer 560 to contact top surfaces of the third wiring 460, and the first and second connection wirings 520 and 525, respectively.

The fifth via 590 may include a thirteenth conductive pattern 580, and a thirteenth barrier pattern 570 on or covering a bottom and a sidewall of the thirteenth conductive pattern 580. The sixth via 620 may include a fourteenth conductive pattern 610, and a fourteenth barrier pattern 600 on or covering a bottom and a sidewall of the fourteenth conductive pattern 610.

The fifth and sixth wirings 660 and 690 may penetrate or extend through the eighth insulating interlayer 630 to contact top surfaces of the fifth and sixth vias 590 and 620, respectively.

The fifth wiring 660 may include a fifteenth conductive pattern 650, and a fifteenth barrier pattern 640 on or covering a bottom and a sidewall of the fifteenth conductive pattern 650. The sixth wiring 690 may include a sixteenth conductive pattern 680, and a sixteenth barrier pattern 670 on or covering a bottom and a sidewall of the sixteenth conductive pattern 680. In example embodiments, the fifth wiring 660 may extend in the first direction to be connected to a wiring in the second region II, and thus an electrical signal may be applied thereto. That is, an electrical signal applied from the wiring in the second region II may be transferred to the first contact plug 380 through the fifth wiring 660, the fifth via 590, the third wiring 460, the first via 490 and the first wiring 420. In example embodiments, the sixth wiring 690 may extend in the second direction, and may be electrically connected to the channel 210 through the sixth via 620, the first and second connection wirings 520 and 525, the third and fourth vias 550 and 555, and the capping pattern 230. The sixth wiring 690 may serve as a bit line.

As illustrated above, the vertical memory device may include the second contact plug 385 in addition to the first contact plug 380 on the first gate electrode 310 among the plurality of gate electrodes 310 stacked in the third direction. As will be illustrated later, the pattern loading effect may be reduced or prevented due to the second contact plug 385, so that each of the first contact plugs 380 may be formed to have a desired size and/or shape, and may better contact the underlying gate electrodes 310.

The second contact plug 385, and the first and second wirings 420 and 425 electrically connected thereto may be implemented to have various layouts, which may be illustrated with reference to FIGS. 45 through 70 later.

Hereinafter, a method of manufacturing a vertical memory device in accordance with example embodiments is illustrated. This method may be illustrated with reference to FIGS. 14 through 44 that may show the region X of FIG. 1.

Figure 40:
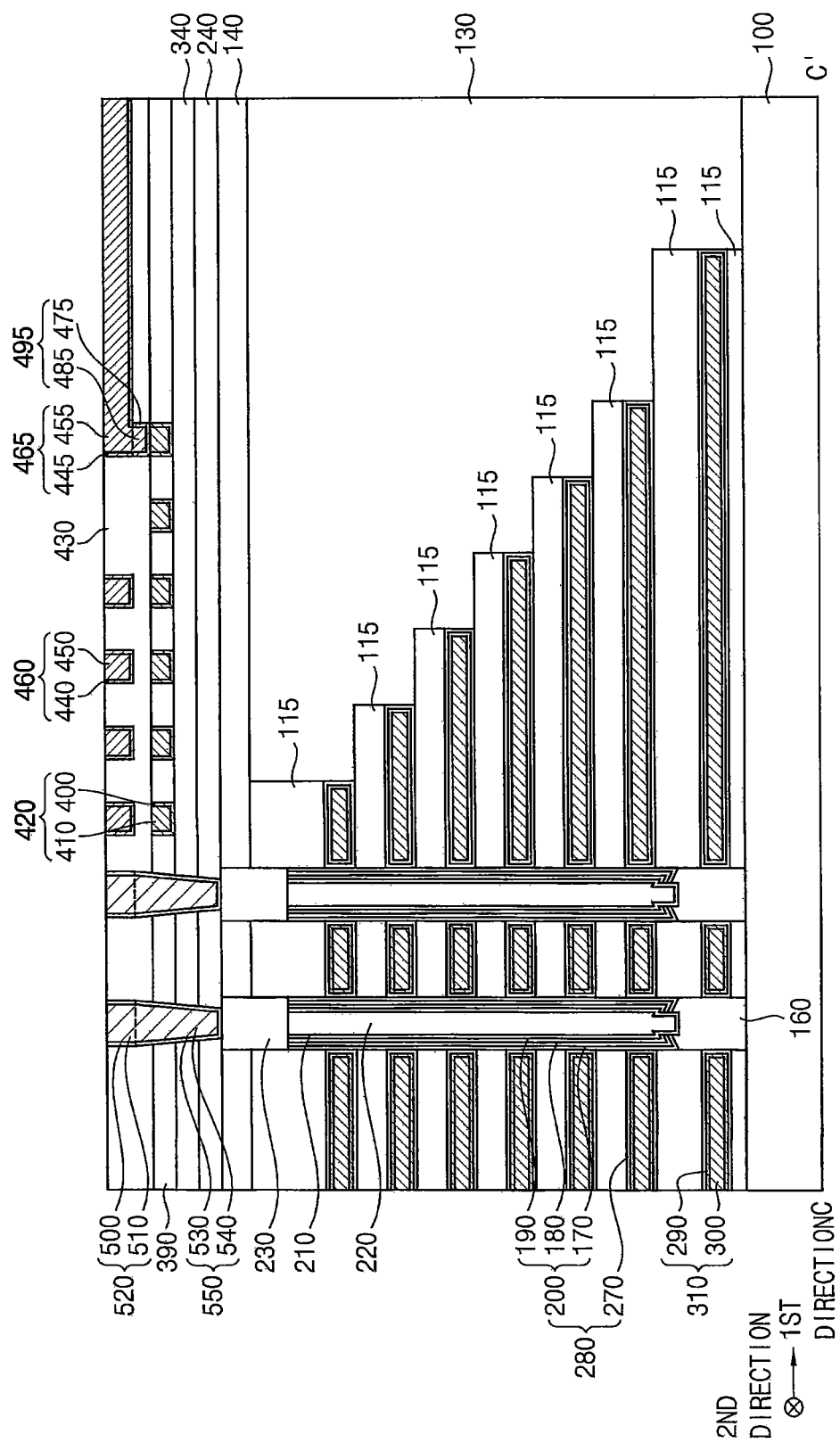
Figure 41:
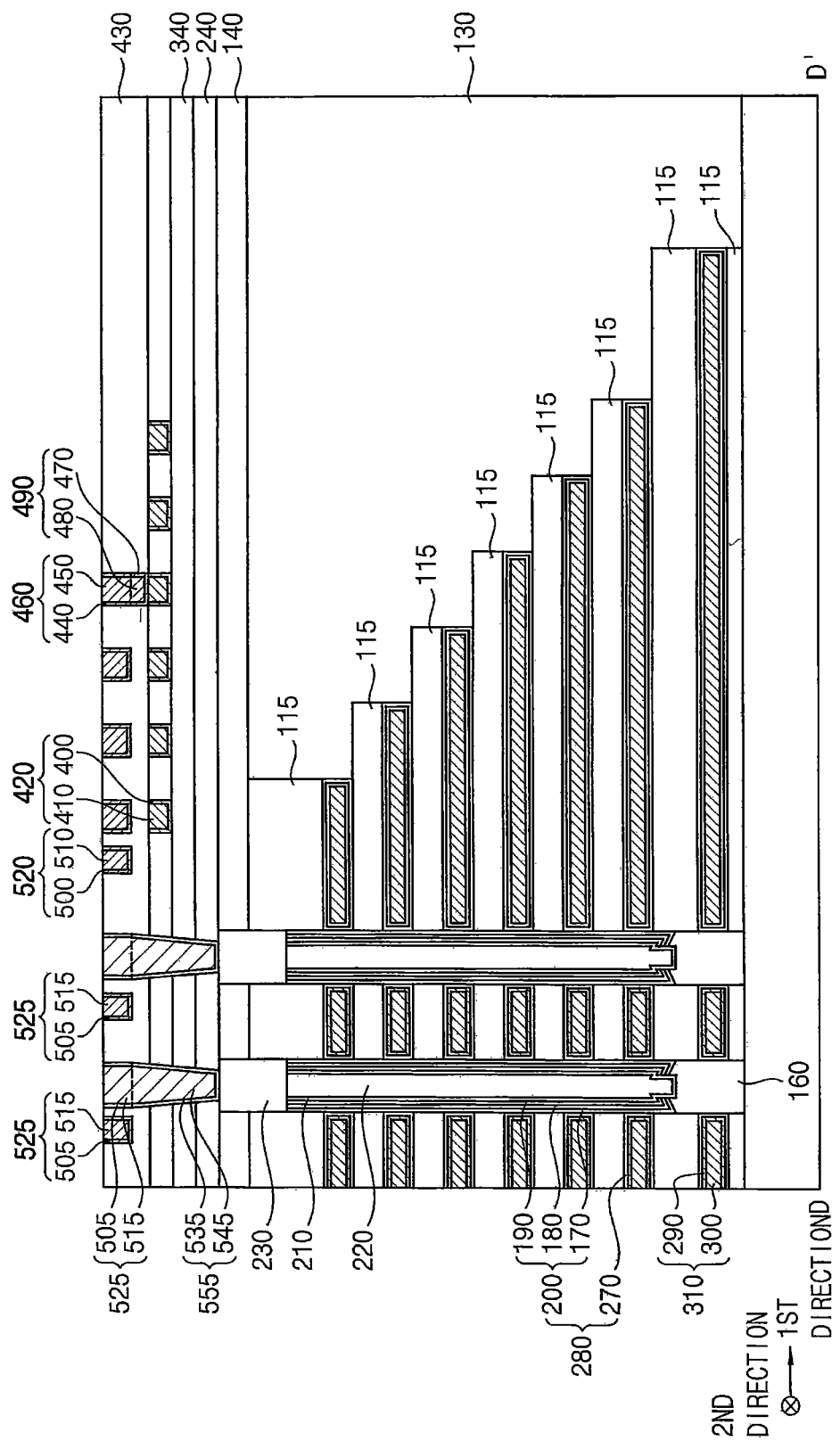

FIGS. 14 through 44 are plan views and cross-sectional views illustrating fabrication stages of a vertical memory device throughout a manufacturing method in accordance with example embodiments. Particularly, FIGS. 14, 16, 18, 20, 22, 24, 29, 31, 33, 35, 37 and 42 are plan views, and FIGS. 15, 17, 19, 21, 23, 25-28, 30, 32, 34, 36, 38-41 and 43-44 are cross-sectional views. Among the cross-sectional views, FIGS. 15, 17, 19, 21, 23, 25, 27, 30 and 38 are cross-sectional views along cutlines A-A' of corresponding plan views, FIGS. 26, 28, 32, 34, 36 and 39 are cross-sectional views along cutlines B-B' of corresponding plan views, FIG. 40 is a cross-sectional view along a cutline C-C' of a corresponding plan view, FIGS. 41 and 43 are cross-sectional views along cutlines D-D' of corresponding plan views, and FIG. 44 is a cross-sectional view along a cutline E-E' of a corresponding plan view.

Figure 14:
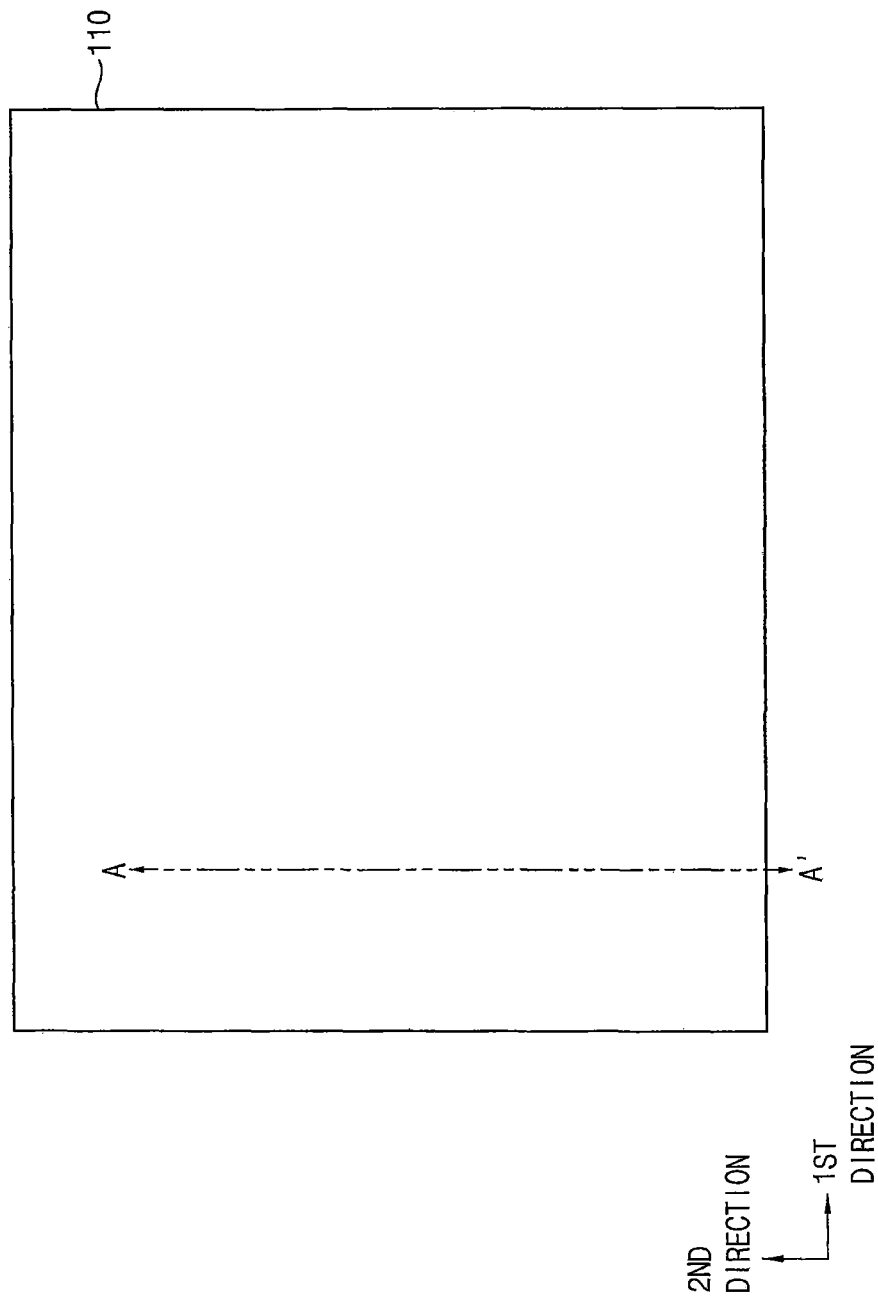
Figure 15:
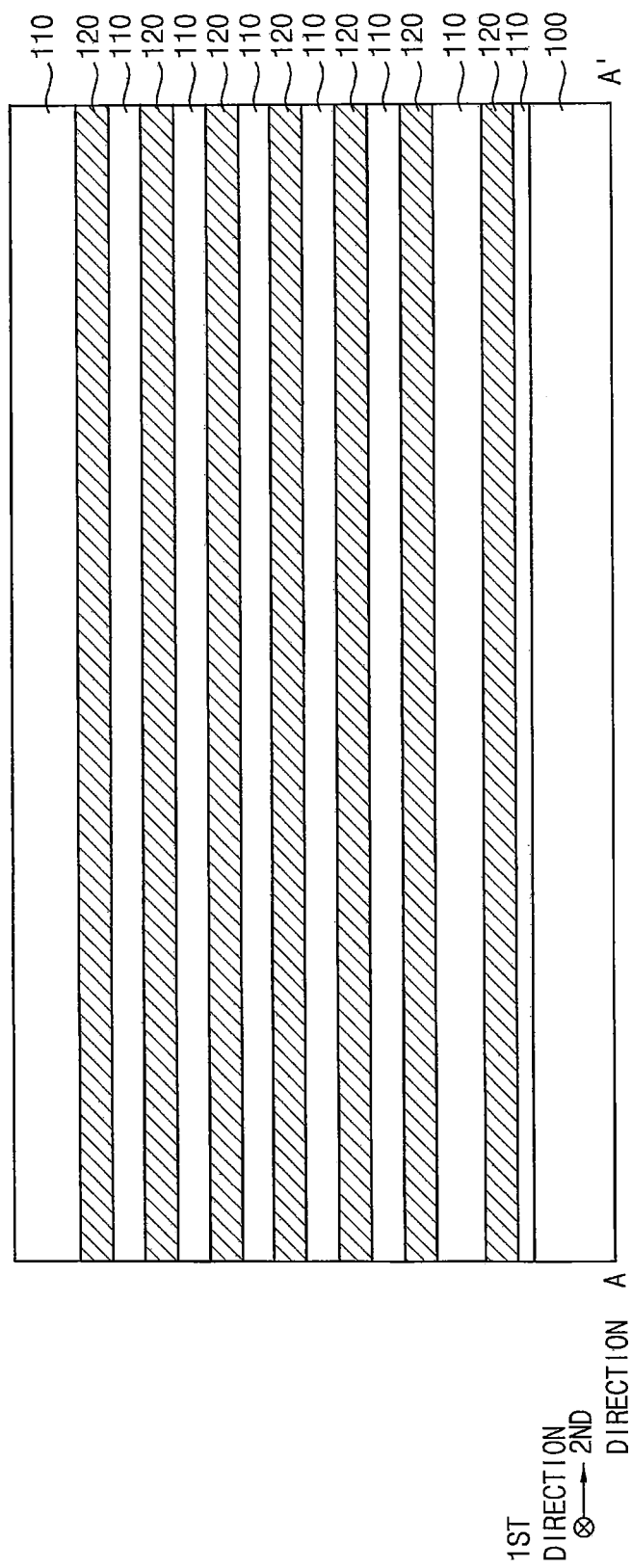

Referring to FIGS. 14 and 15, an insulation layer 110 and a sacrificial layer 120 may be alternately and repeatedly formed on a substrate 100. Thus, a plurality of insulation layers 110 and a plurality of sacrificial layers 120 may be alternately stacked on each other over the substrate 100 in the third direction. FIG. 1 shows for purposes of illustration eight insulation layers 110 and seven sacrificial layers 120 alternately stacked on the substrate 100. However, the inventive concepts may not be limited to any particular number of insulation layers 110 and sacrificial layers 120.

The substrate 100 may include a semiconductor material, e.g., silicon, germanium, and the like.

The insulation layers 110 and the sacrificial layers 120 may be formed by a chemical vapor deposition (CVD) process, a plasma chemical vapor deposition (PECVD) process, an atomic layer deposition (ALD) process, etc. In an example embodiment, a lowermost one of the plurality of insulation layers 110 directly formed on a top surface of the substrate 100 may be formed by a thermal oxidation process.

The insulation layers 110 may be formed of a silicon oxide, e.g., plasma enhanced tetraethylorthosilicate (PE-TEOS), high density plasma (HDP) oxide, plasma enhanced oxide (PEOX), etc. The sacrificial layers 120 may be formed of a material having an etching selectivity with respect to the insulation layers 110, e.g., silicon nitride.

Figure 16:
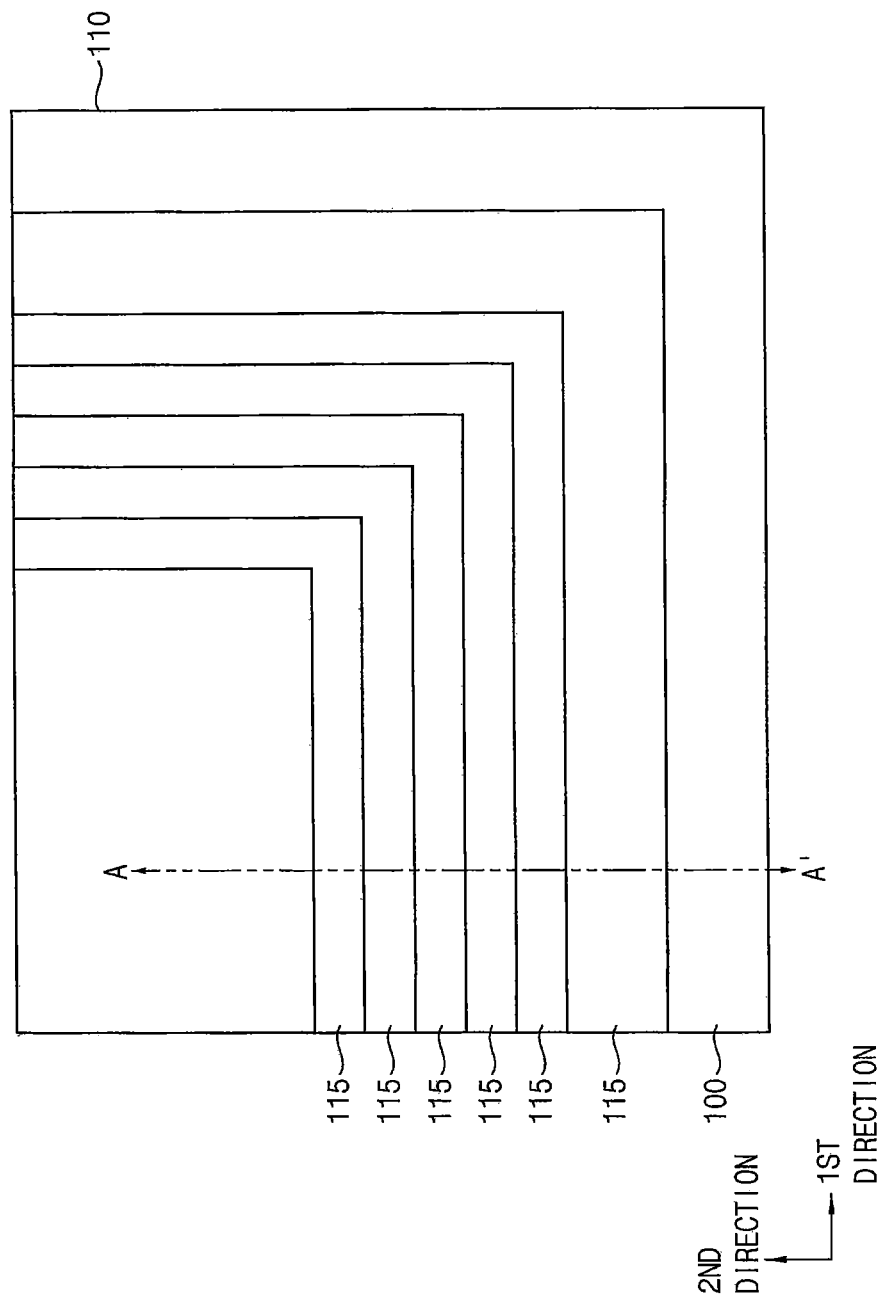
Figure 17:
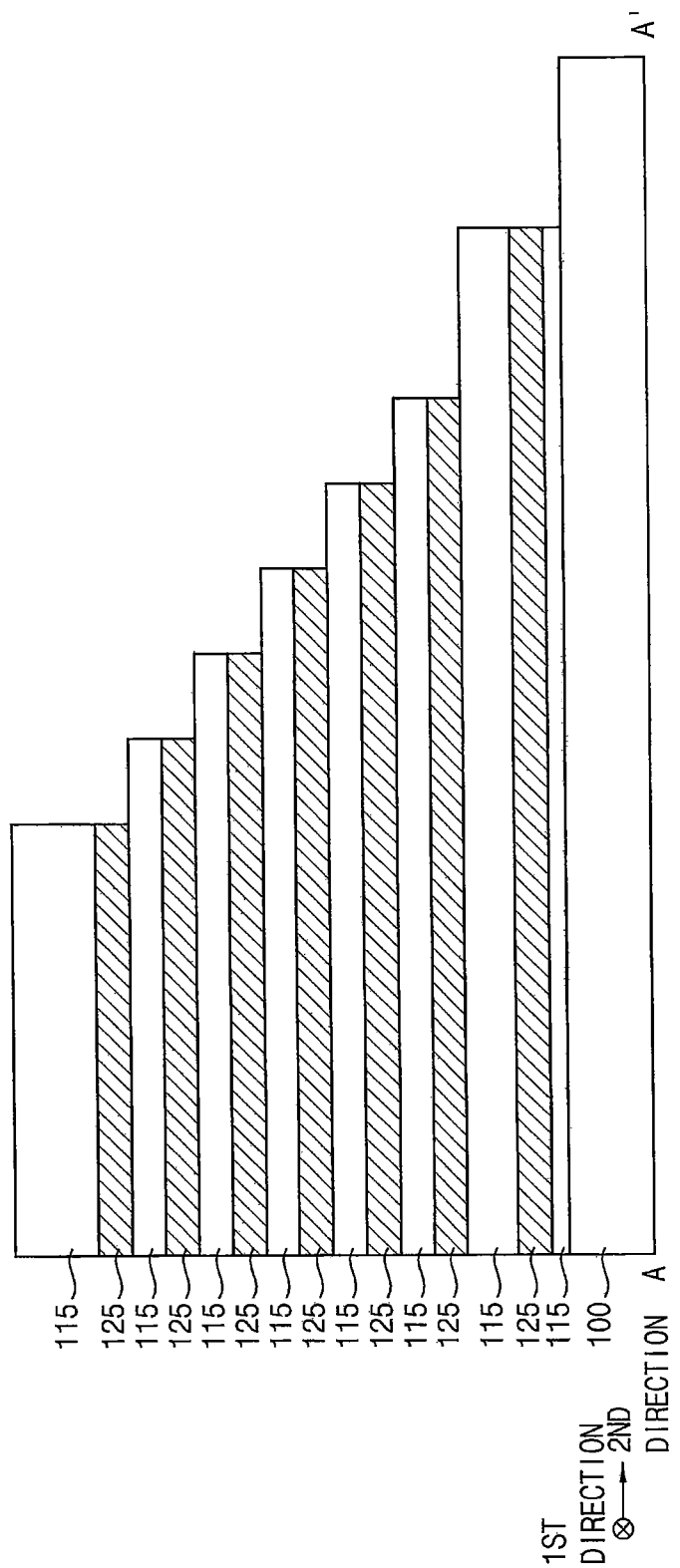

Referring to FIGS. 16 and 17, a photoresist pattern partially on or covering an uppermost insulation layer 110 may be formed thereon, and the uppermost insulation layer 110 and an uppermost sacrificial layer 120 thereunder may be etched using the photoresist pattern as an etching mask. Thus, a portion of the insulation layer 110 under the uppermost sacrificial layer 120 may be exposed. After reducing a size of the photoresist pattern, the uppermost insulation layer 110, the uppermost sacrificial layer 120, the exposed insulation layer 110 and a sacrificial layer thereunder may be etched using the reduced photoresist pattern as an etching mask, which may be referred to as a trimming process. The trimming process may be repeatedly performed to form a staircase structure including a plurality of stairs each having a sacrificial pattern 125 and an insulation pattern 115 sequentially stacked.

The stairs included in the staircase structure may have areas decreasing from a lower level toward an upper level, e.g., from a lowermost level toward an uppermost level. Thus, the stairs may have lengths along the first and second directions each decreasing from the lowermost level toward the uppermost level by a constant value, and portions of the stairs not covered by upper stairs but exposed may have lengths along the first and second directions that may be constant. However, in example embodiments, a portion of a lowermost level stair not covered by upper stairs but exposed may have lengths along the first and second directions that may be greater than those of portions of other level stairs not covered by upper stairs but exposed, which may be implemented by controlling the ratio of reduction of the photoresist pattern in the trimming process. In example embodiments, the portion of the lowermost level stair not covered by upper stairs but exposed may have lengths along the first and second directions that may be equal to or greater than twice of those of the portions of other level stairs not covered by upper stairs but exposed.

FIGS. 16 and 17 show that the exposed portion of the lowermost level stair has the lengths along the first and second directions greater than those of the exposed portions of other level stairs, however, the inventive concepts may not be limited thereto. That is, when a second contact hole 355 (refer to FIGS. 31 and 32) is formed in addition to first contact holes 350 (refer to FIGS. 31 and 32), an exposed portion of another level stair may be formed to have lengths along the first and second directions greater than those of the exposed portions of other level stairs, and hereinafter, a stair including an exposed portion having relatively large lengths along the first and second directions may be referred to as "a first stair." In example embodiments, the first stair may be formed not only at a lowermost level but also at any levels, and in some cases, a plurality of first stairs may be formed.

When the number of the insulation layers 110 and the sacrificial layers 120 is large, more than one photoresist pattern may be needed to perform the trimming process. Due to the limitation of thickness of the photoresist pattern, the number of trimming processes performed using the photoresist pattern as an etching mask may have a limitation, and thus a plurality of photoresist patterns may be sequentially used to perform the trimming process many times so that the insulation layers 110 and the sacrificial layers 120 may be etched to form the insulation patterns 115 and the sacrificial patterns 125, respectively.

When the plurality of photoresist patterns are used, in order to form another stair having relatively large lengths instead of (or in addition to) the lowermost level stair, the reduction ratio of the photoresist pattern may not be controlled in the trimming process. For example, a first trimming process may be performed with a first photoresist pattern decreasing at a constant ratio, and a second trimming process may be performed using a second photoresist pattern that may have a size much reduced from the photoresist pattern, so as to form a stair including an exposed portion having a large area. Then, the second trimming process may be also performed with the second photoresist pattern decreasing at a constant ratio.

Figure 18:
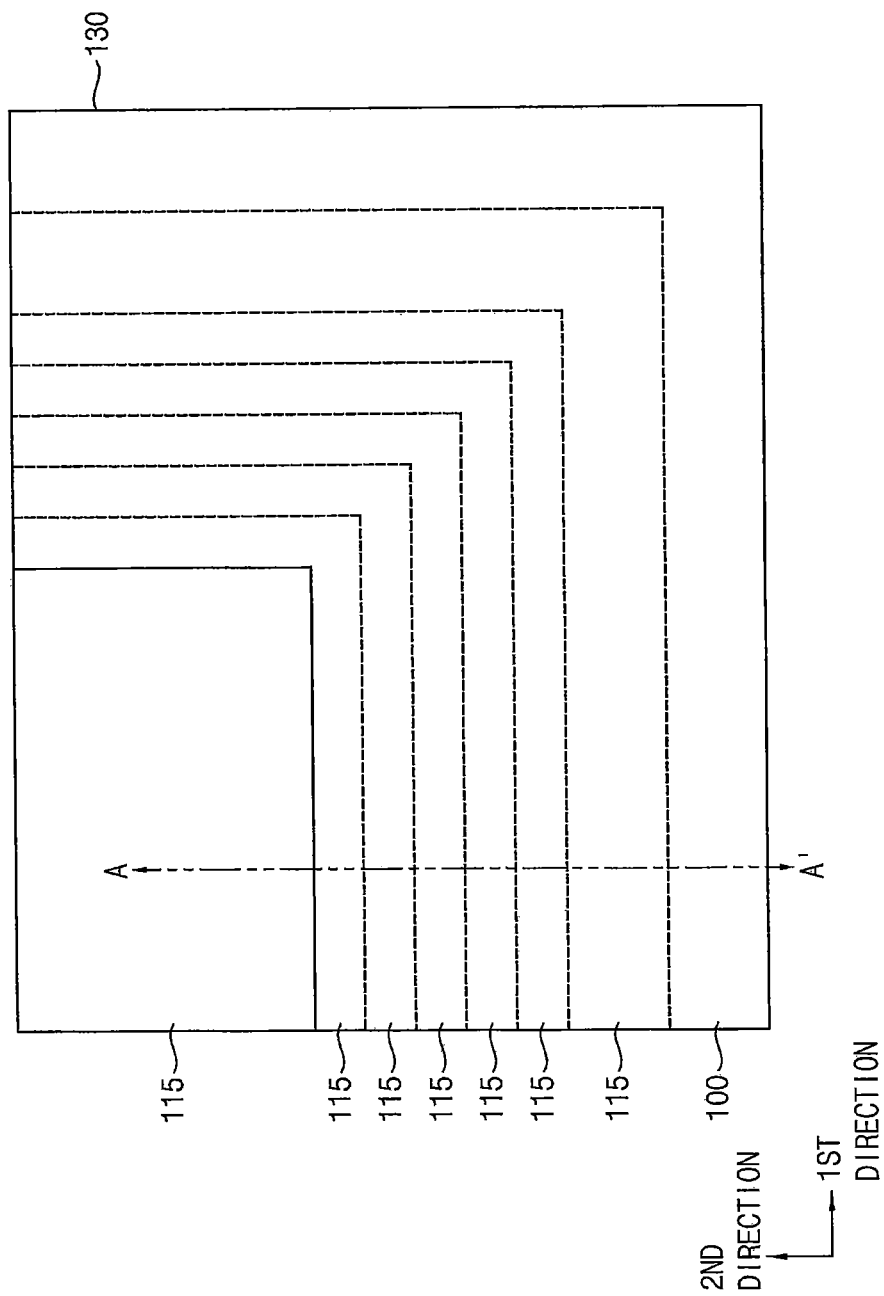
Figure 19:
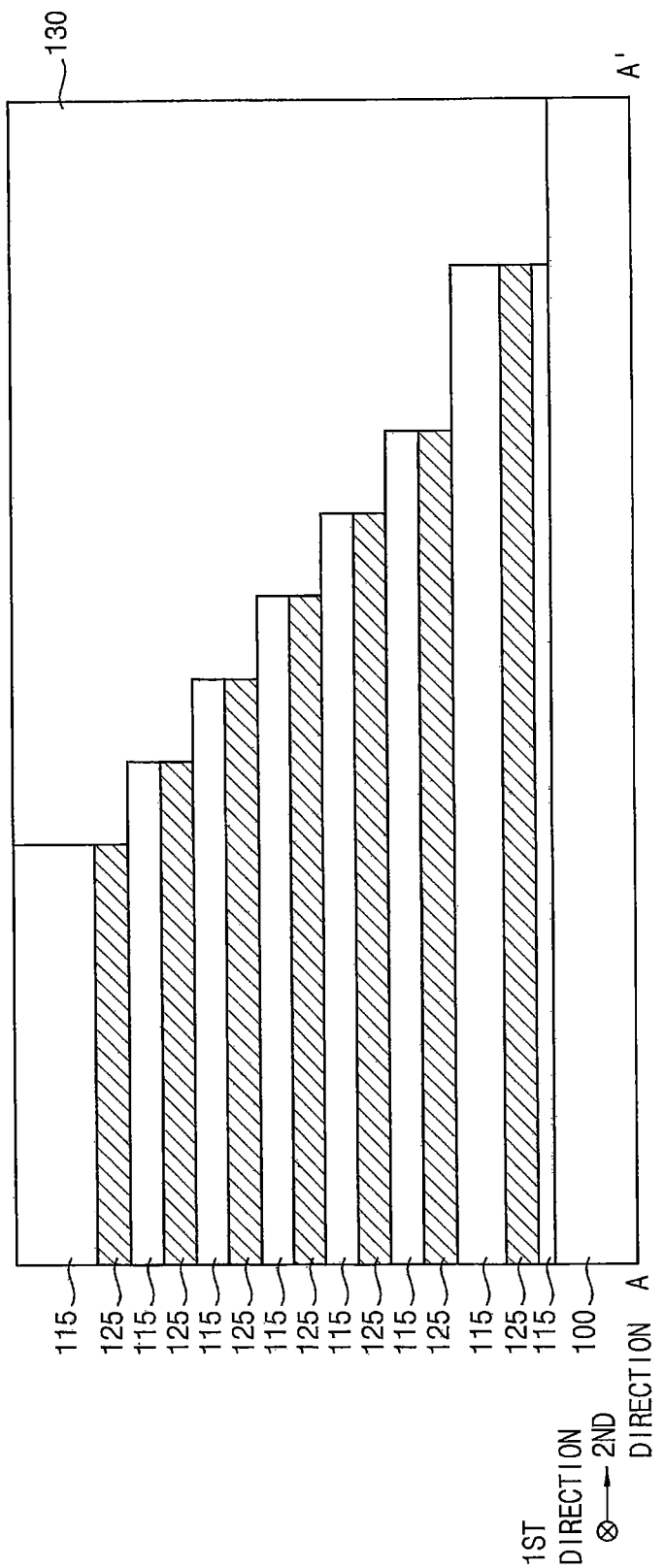

Referring to FIGS. 18 and 19, a first insulating interlayer 130 may be formed on the substrate 100 to cover the staircase structure, and an upper portion of the first insulating interlayer 130 may be planarized until a top surface of the uppermost insulation pattern 115 of the staircase structure may be exposed.

The first insulating interlayer 130 may be formed of an oxide, e.g., silicon oxide, and thus may be merged with the insulation pattern 115. The planarization process may be performed by a chemical mechanical polishing (CMP) process and/or an etch back process. The first insulating interlayer 130 may be formed to have a top surface of which a height may be relatively high on the staircase structure, and in some cases, an etching process may be performed on the relatively high upper portion, and then the planarization process may be performed.

Figure 20:
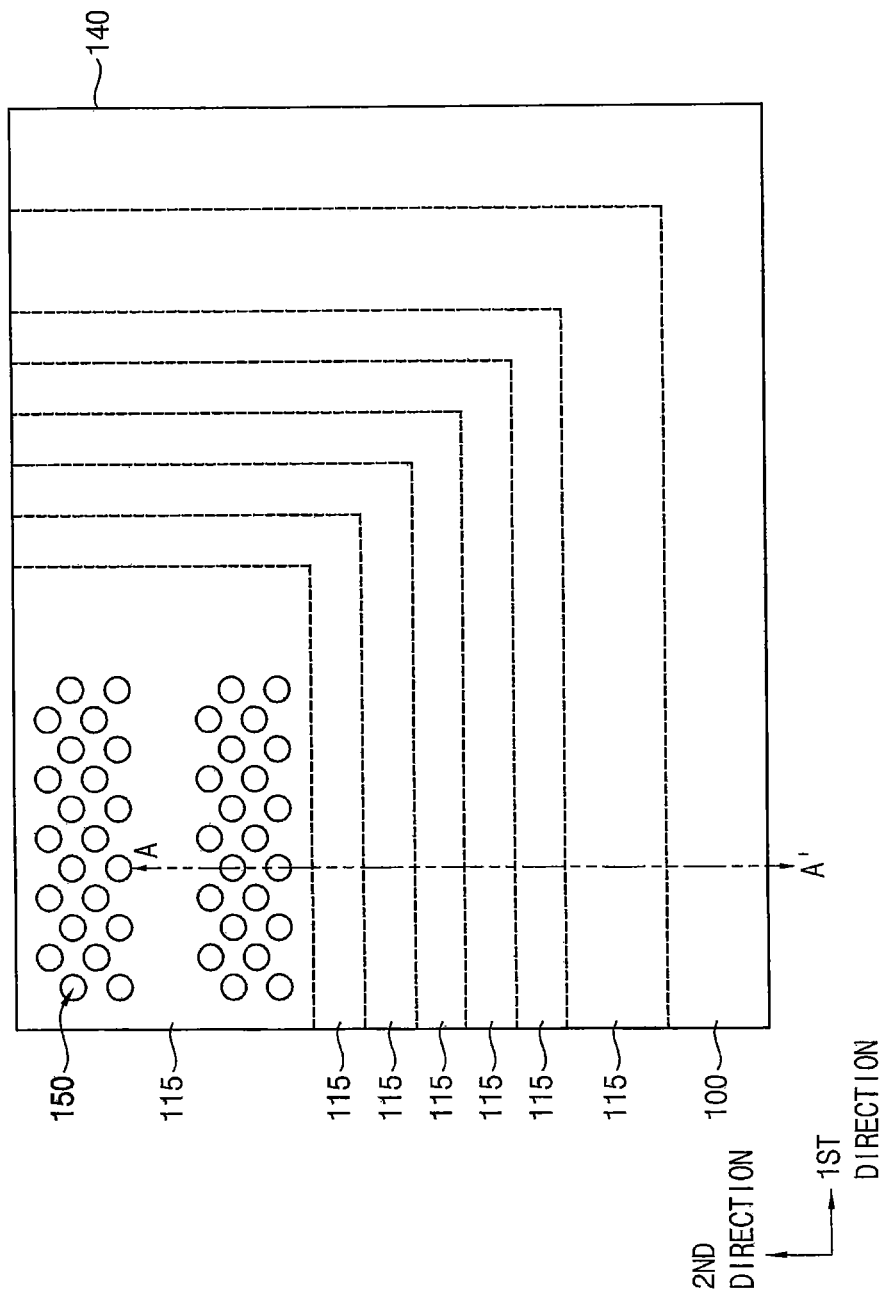
Figure 21:
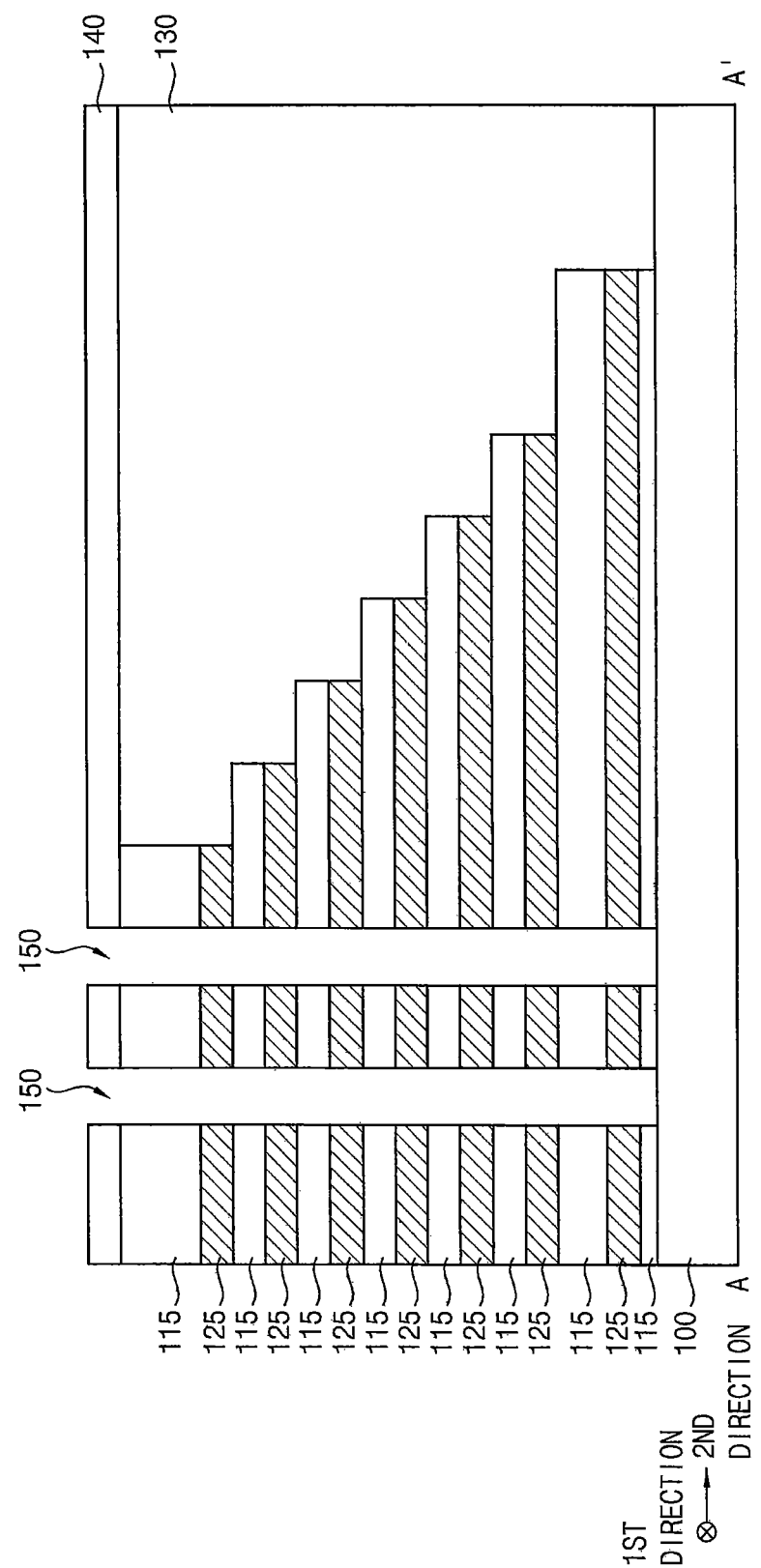

Referring to FIGS. 20 and 21, after forming a second insulating interlayer 140 on the staircase structure and the first insulating interlayer 130, and a photolithography process may be performed using a photoresist pattern. Thus, a plurality of channel holes 150 may be formed through the second insulating interlayer 140, the insulation patterns 115 and the sacrificial patterns 125 to expose a top surface of the substrate 100.

The second insulating interlayer 140 may be formed of an oxide, e.g., silicon oxide, and thus may be merged with the first insulating interlayer 130 and/or the uppermost insulation pattern 115.

In example embodiments, the plurality of channel holes 150 may be formed both in the first and second directions, and may define a channel hole array. In example embodiments, the channel hole array may include a first channel hole column including a plurality of first channel holes 150 disposed in the first direction, and a second channel hole column including a plurality of second channel holes 150 disposed in the first direction, which may be spaced apart from the first channel hole column in the second direction. The first channel holes 150 may be disposed at acute angles from the second channel holes 150 along the first direction or the second direction. Thus, the first and second channel holes 150 may be arranged in a zigzag layout in the first direction so as to be densely formed in a unit area.

The first and second channel hole columns may be disposed alternately and repeatedly in the second direction. In example embodiments, the first and second channel hole columns may be disposed in the second direction twice to form a channel hole block, and a plurality of channel hole blocks may be formed in the second direction to be spaced apart from each other. Hereinafter, four channel hole columns adjacent an edge of the uppermost insulation pattern 115 along the second direction among the plurality of channel hole columns in each channel hole block may be referred to as first, second, third and fourth channel hole columns in this order. That is, FIG. 20 shows two channel hole blocks spaced apart from each other in the second direction, and each channel hole block includes first, second, third and fourth channel hole columns disposed in the second direction.

In other example embodiments, the channel hole array may include a plurality of channel holes 150 arranged in a layout which differs from a zigzag layout.

Figure 22:
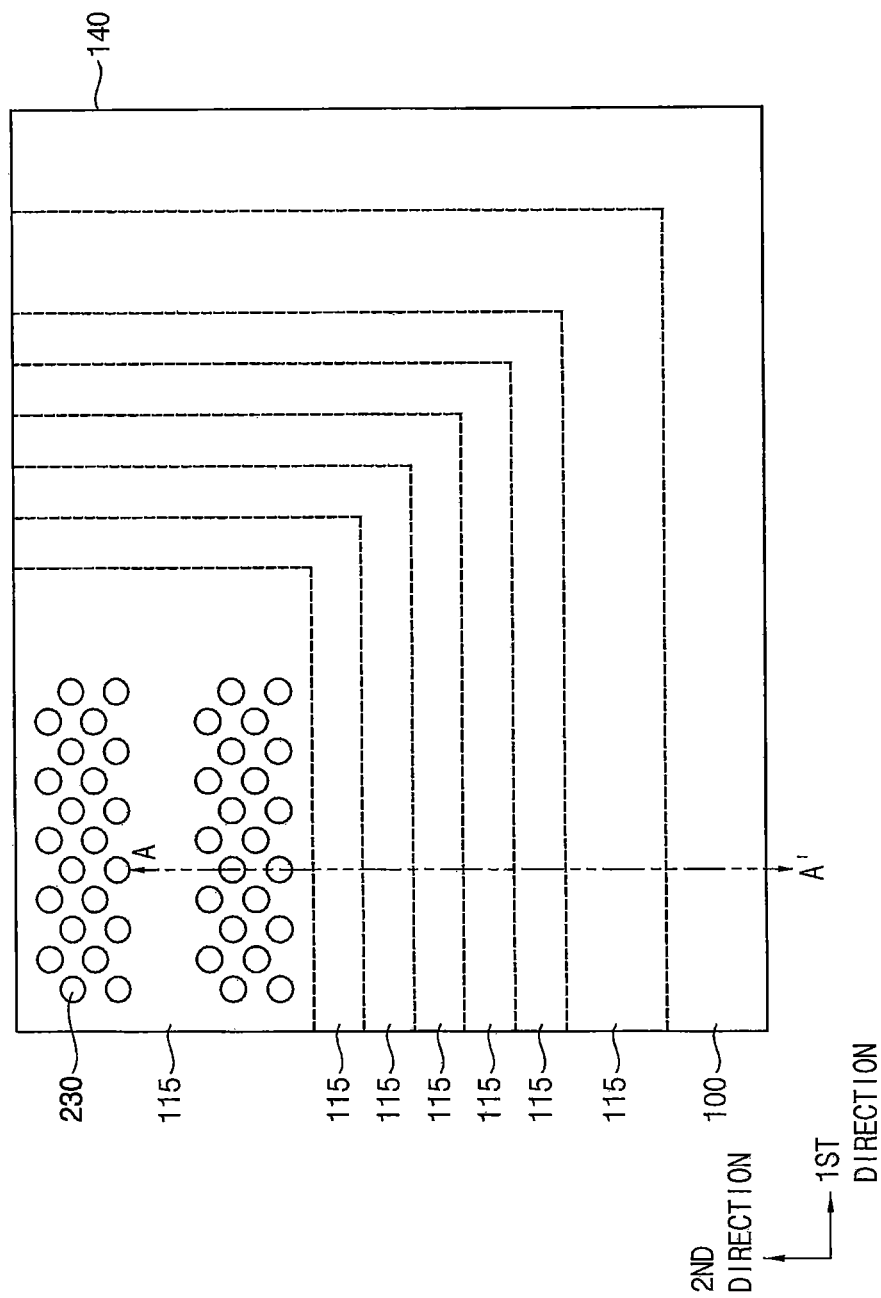
Figure 23:
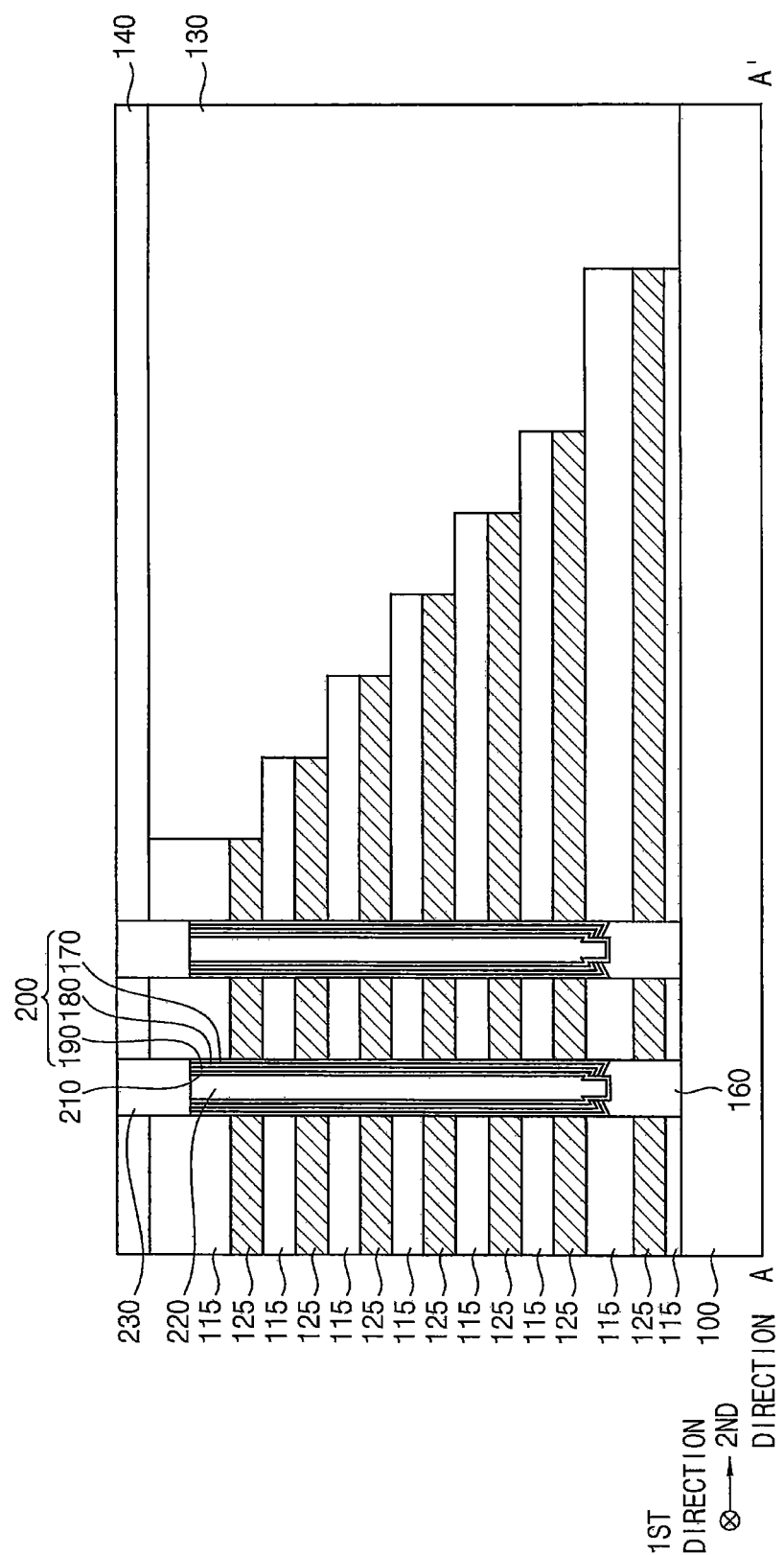

Referring to FIGS. 22 and 23, a semiconductor pattern 160 may be formed to partially fill each channel hole 150.

Particularly, a selective epitaxial growth (SEG) process may be performed using the exposed top surface of the substrate 100 as a seed to form the semiconductor pattern 160 partially filling the channel holes 150. Thus, the semiconductor pattern 160 may be formed to include single crystalline silicon, single crystalline germanium, or other material according to the material of the substrate 100, and in some cases, impurities may be doped thereinto. Additionally or alternatively, an amorphous silicon layer may be formed to fill the channel holes 150, and a laser epitaxial growth (LEG) process or a solid phase epitaxy (SPE) process may be performed on the amorphous silicon layer to form the semiconductor pattern 160. In example embodiments, a top surface of the semiconductor pattern 160 may be formed to be located between a top surface and a bottom surface of one of the insulation patterns 115, which may be formed at a second level from the top surface of the substrate 100.

A first blocking layer, a charge storage layer, a tunnel insulation layer and a first spacer layer may be sequentially formed on inner walls of the channel holes 150, top surfaces of the semiconductor patterns 160, and a top surface of the second insulating interlayer 140, and the first spacer layer may be anisotropically etched to form first spacers on the inner walls of the channel holes 150, respectively. The tunnel insulation layer, the charge storage layer and the first blocking layer may be etched using the first spacers as an etching mask to form a tunnel insulation pattern 190, a charge storage pattern 180 and a first blocking pattern 170, respectively, in each channel hole 150. Each of the tunnel insulation pattern 190, the charge storage pattern 180 and the first blocking pattern 170 may have a cup shape of which a central bottom is opened, and thus a top surface of the semiconductor pattern 160 may be exposed. The tunnel insulation pattern 190, the charge storage pattern 180 and the first blocking pattern 170 may form a first charge storage structure 200.

In example embodiments, the first blocking layer may be formed of an oxide, e.g., silicon oxide, the charge storage layer may be formed of a nitride, e.g., silicon nitride, the tunnel insulation layer may be formed of an oxide, e.g., silicon oxide, and the first spacer layer may be formed of a nitride, e.g., silicon nitride.

After removing the first spacers, a channel layer may be formed on the exposed top surface of the semiconductor pattern 160, the tunnel insulation patterns 190, and the second insulating interlayer 140, and a filling layer may be formed on the channel layer to sufficiently fill remaining portions of the channel holes 150.

In example embodiments, the channel layer may be formed of doped or undoped polysilicon or amorphous silicon. When the channel layer is formed of amorphous silicon, a laser epitaxy growth (LEG) process or a solid phase epitaxy (SPE) process may be further performed so that the amorphous silicon layer may be changed to a crystalline silicon layer. The filling layer may be formed of an oxide, e.g., silicon oxide.

The filling layer and the channel layer may be planarized until the top surface of the second insulating interlayer 140 may be exposed to form a filling pattern 220 filling a remaining portion of each channel hole 150, and the channel layer may be formed into a channel 210 in each channel hole 150.

Thus, the first charge storage structure 200, the channel 210 and the filling pattern 220 may be sequentially stacked on the semiconductor pattern 160 in each channel hole 150. The first charge storage structure 200 may have a cup-like shape of which a central bottom is opened, the channel 210 may have a cup-like shape, and the filling pattern 220 may have a pillar shape.

According as the channel holes 150 for forming the channels 210 may define the channel hole block including the first to fourth channel hole columns, and the channel hole array including a plurality of channel hole blocks, the channels 210 may also define a channel block and a channel array.

An upper portion of a first structure including the filling pattern 220, the channel 210, and the first charge storage structure 200 sequentially stacked in each channel hole 150 may be removed to form a trench, and a capping pattern 230 filling the trench may be formed on the first structure in each channel hole 150.

Particularly, after removing the upper portions of the first structures by an etch back process to form the trenches, a capping layer filling the trenches may be formed on the first structures and the second insulating interlayer 140, and an upper portion of the capping layer may be planarized until the top surface of the second insulating interlayer 140 may be exposed to form the capping pattern 230. In example embodiments, the capping layer may be formed of doped or undoped polysilicon or amorphous silicon. When the capping layer is formed to include amorphous silicon, a crystallization process may be further performed thereon.

The capping patterns 230 may be formed on the channels 210, and thus may form a capping pattern block and a capping pattern array in accordance with the channel block and the channel array, respectively.

The first structure, the semiconductor pattern 160 and the capping pattern 230 in each channel hole 150 may form a second structure.

Figure 24:
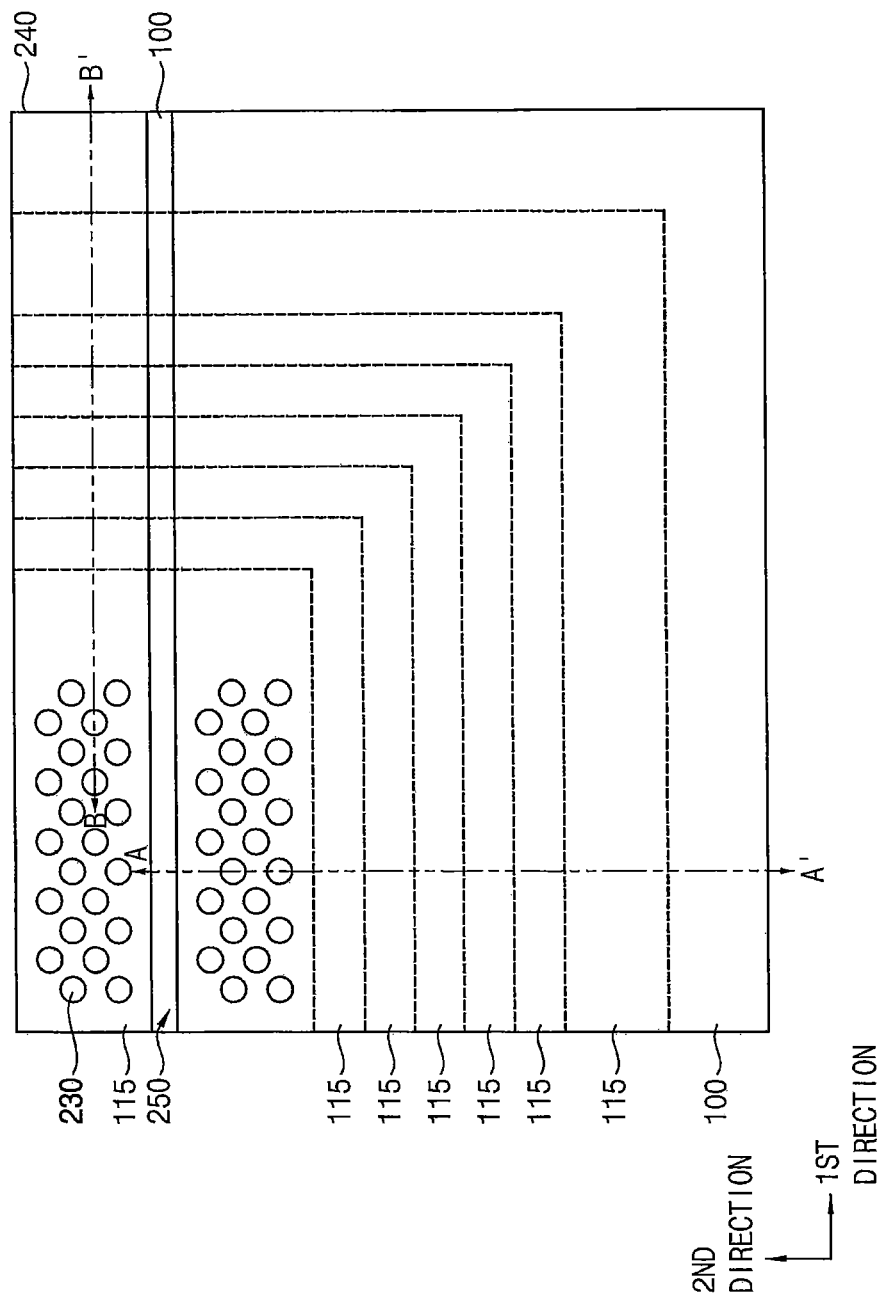
Figure 25:
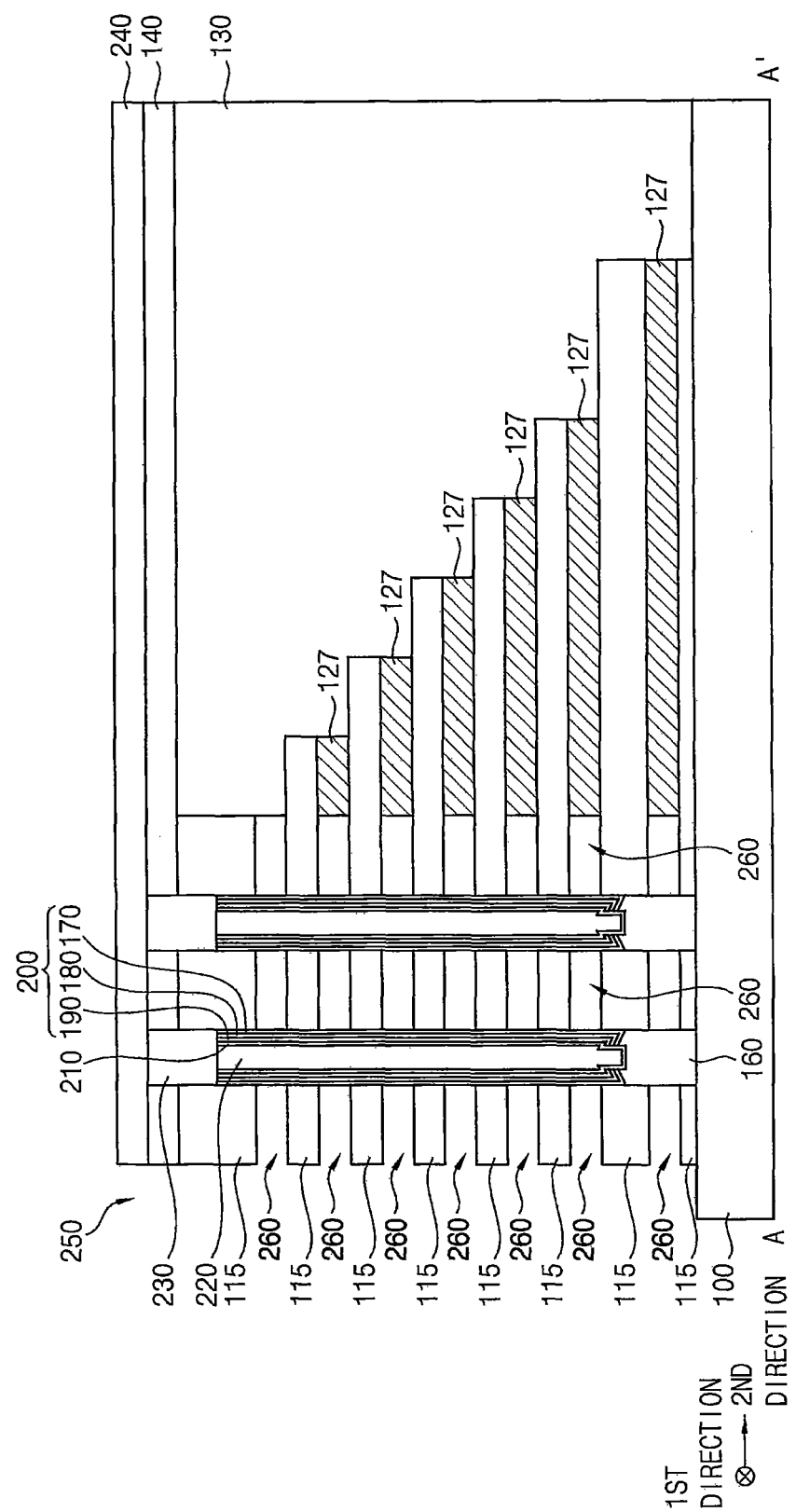
Figure 26:
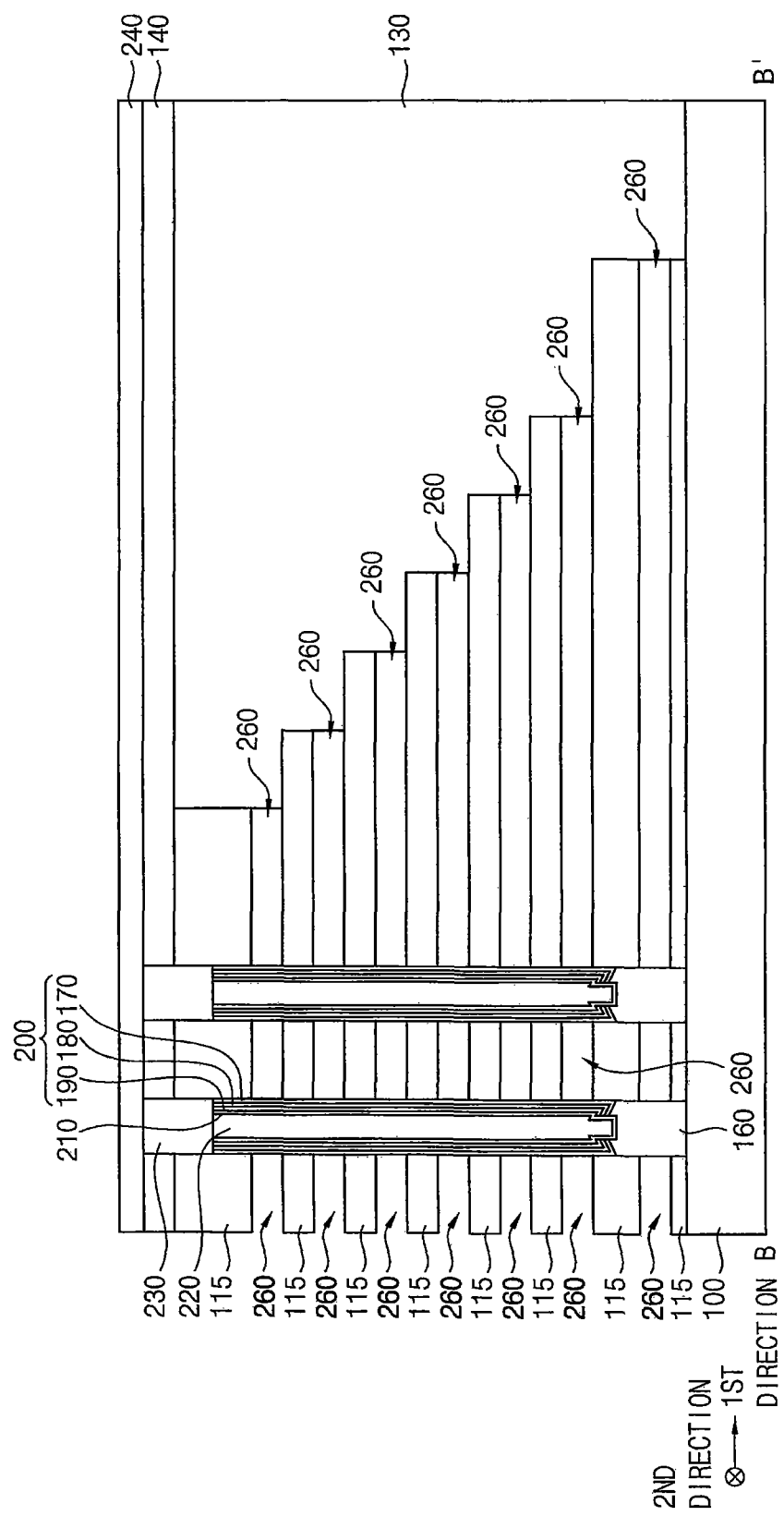

Referring to FIGS. 24 to 26, after forming a third insulating interlayer 240 on the second insulating interlayer 140 and the capping pattern 230, an opening 250 may be formed through the second and third insulating interlayers 140 and 240, the insulation patterns 115 and the sacrificial patterns 125 to expose a top surface of the substrate 100.

The third insulating interlayer 240 may be formed of an oxide, e.g., silicon oxide, and thus may be merged with the second insulating interlayer 140.

In example embodiments, a plurality of openings 250 may be formed in the second direction, and each of the openings 250 may extend in the first direction between the channel blocks. According as the plurality of openings 250 is formed in the second direction, a plurality of channel columns may be formed between the openings 250, and FIG. 26 illustratively shows four channel columns are disposed between neighboring two openings 250, however, the number of the channel columns therebetween may not limited thereto. That is, according to the number of the channel columns included in each of the channel blocks, the number of the channel columns between the neighboring two openings 250 may be changed.

The sacrificial patterns 125 exposed by the openings 250 may be removed to form a gap 260 between the insulation patterns 115 at neighboring levels, and portions of outer sidewalls of the first blocking patterns 170 and sidewalls of the semiconductor patterns 160 may be exposed by the gaps 260. In example embodiments, the sacrificial patterns 125 exposed by the openings 250 may be removed by, for example, a wet etch process using an etch solution including phosphoric acid and/or sulfuric acid.

However, portions of the sacrificial patterns 125 may not be removed by the wet etching process but may remain, which may be referred to as insulation pads 127.

Figure 27:
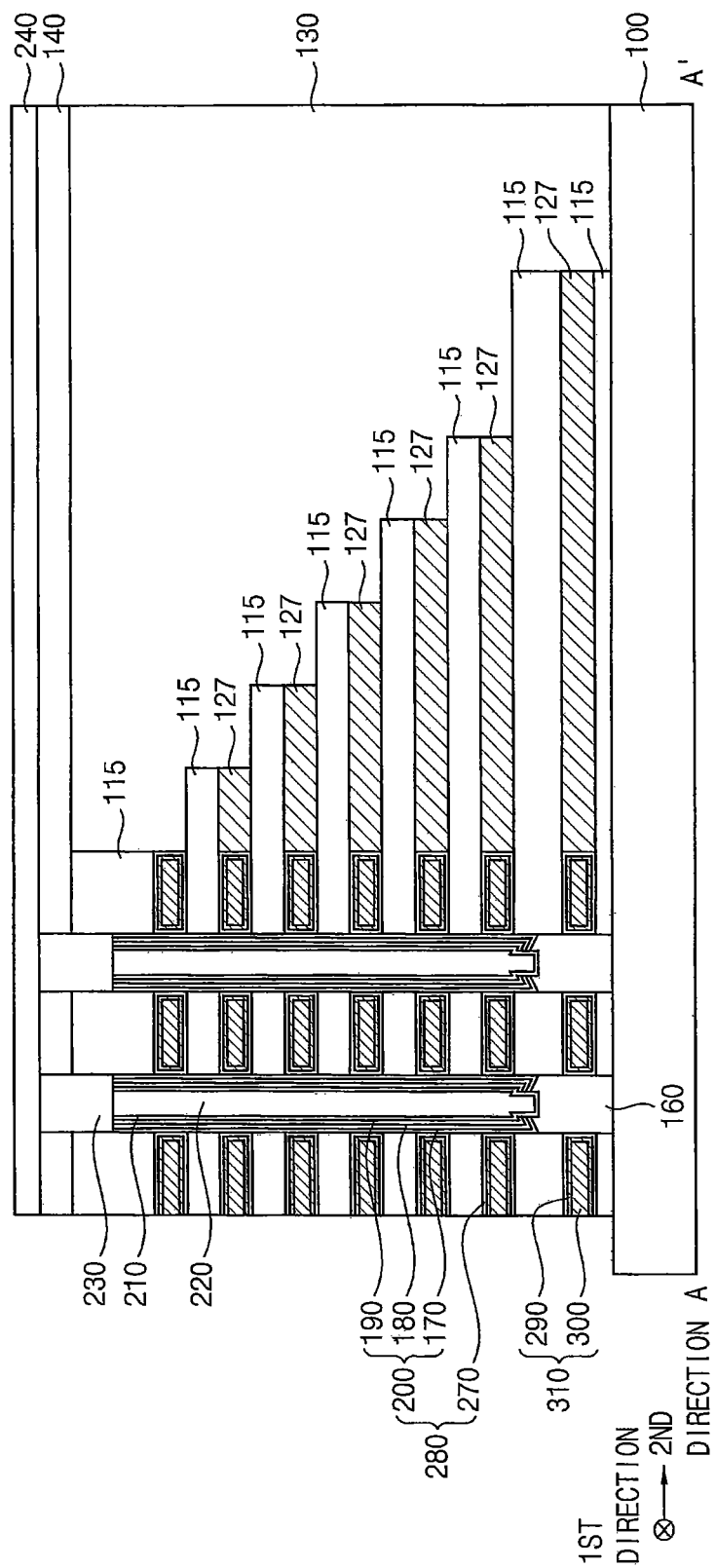
Figure 28:
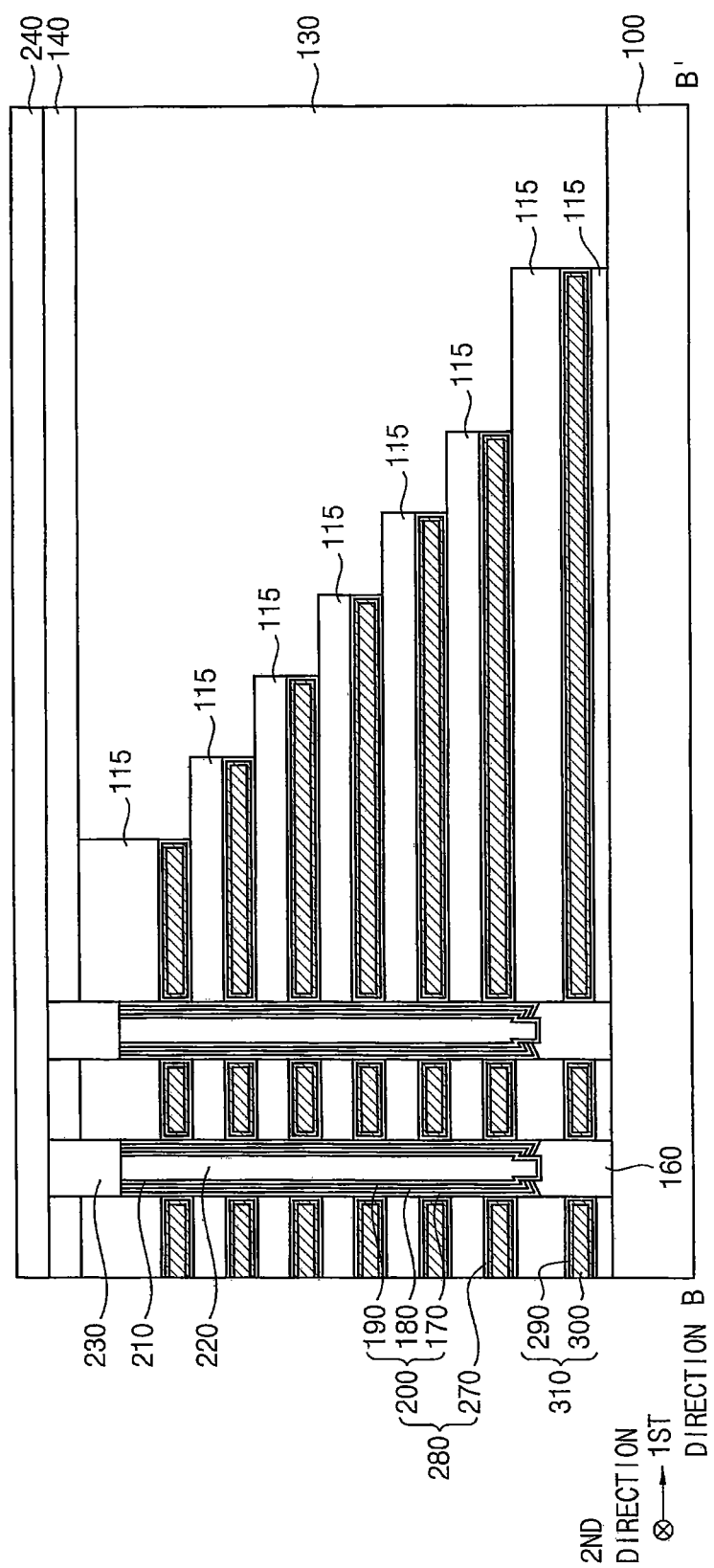

Referring to FIGS. 27 and 28, a second blocking layer may be formed on the exposed portions of the outer sidewalls of the first blocking patterns 170, the exposed portions of the sidewalls of the semiconductor patterns 160, inner walls of the gaps 260, surfaces of the insulation patterns 115, the exposed top surface of the substrate 100 and a top surface of the third insulating interlayer 240. A gate barrier layer may be formed on the second blocking layer, and a gate conductive layer may be formed on the gate barrier layer to sufficiently fill remaining portions of the gaps 260.

The second blocking layer may be formed of a metal oxide, e.g., aluminum oxide, hafnium oxide, lanthanum oxide, lanthanum aluminum oxide, lanthanum hafnium oxide, hafnium aluminum oxide, titanium oxide, tantalum oxide and/or zirconium oxide. The gate conductive layer may be formed of a metal having a low resistance, e.g., tungsten, titanium, tantalum, platinum, etc., and the gate barrier layer may be formed of a metal nitride, e.g., titanium nitride, tantalum nitride, etc. Additionally or alternatively, the gate barrier layer may be formed to include a metal layer and a metal nitride layer sequentially stacked.

The gate conductive layer and the gate barrier layer may be partially removed to form a gate conductive pattern 300 and a gate barrier pattern 290, respectively, which may form a gate electrode 310. In example embodiments, the gate conductive layer and the gate barrier layer may be partially removed by a wet etching process.

In example embodiments, the gate electrode 310 may be formed to extend in the first direction, and a plurality of gate electrodes 310 may be formed in the second direction. That is, a plurality of gate electrodes 310 each extending in the first direction may be spaced apart from each other by the opening 250. A gate electrode 310 in the first stair among the plurality of gate electrodes 310 may be referred to as a first gate electrode 310.

In example embodiments, the gate electrodes 310 may include a GSL, a word line and an SSL sequentially stacked in the third direction on the substrate 100. Each of the GSL, the word line and the SSL may be formed at a single level or at a plurality of levels. One or more than one dummy word lines may be further formed between the GSL and the word line and/or between the SSL and the word line.

In example embodiments, the GSL may be formed at one level, the SSL may be formed at two levels, and the word line may be formed at even numbers of levels between the GSL and the SSL. However, the numbers of the GSL, the word line and the SSL is not limited thereto. The GSL may be formed adjacent to the semiconductor patterns 160, and the word line and the SSL may be formed adjacent to the channels 210.

When the gate conductive layer and the gate barrier layer are partially removed, portions of the second blocking layer on surfaces of the insulation patterns 115, on the top surface of the substrate 100, on the top surface of the capping patterns 230 and on the top surface of the third insulating interlayer 240 may also be removed to form a second blocking pattern 270 surrounding a top, a bottom and at least a sidewall of the gate electrode 310. The first and second blocking patterns 170 and 270 may define a blocking pattern structure, and the tunnel insulation pattern 190, the charge storage pattern 180 and the blocking pattern structure may form a second charge storage structure 280.

As the gate conductive layer, the gate barrier layer and the second blocking layer are partially removed, the opening 250 exposing a top surface of the substrate 100 and extending in the first direction may be formed again.

Figure 29:
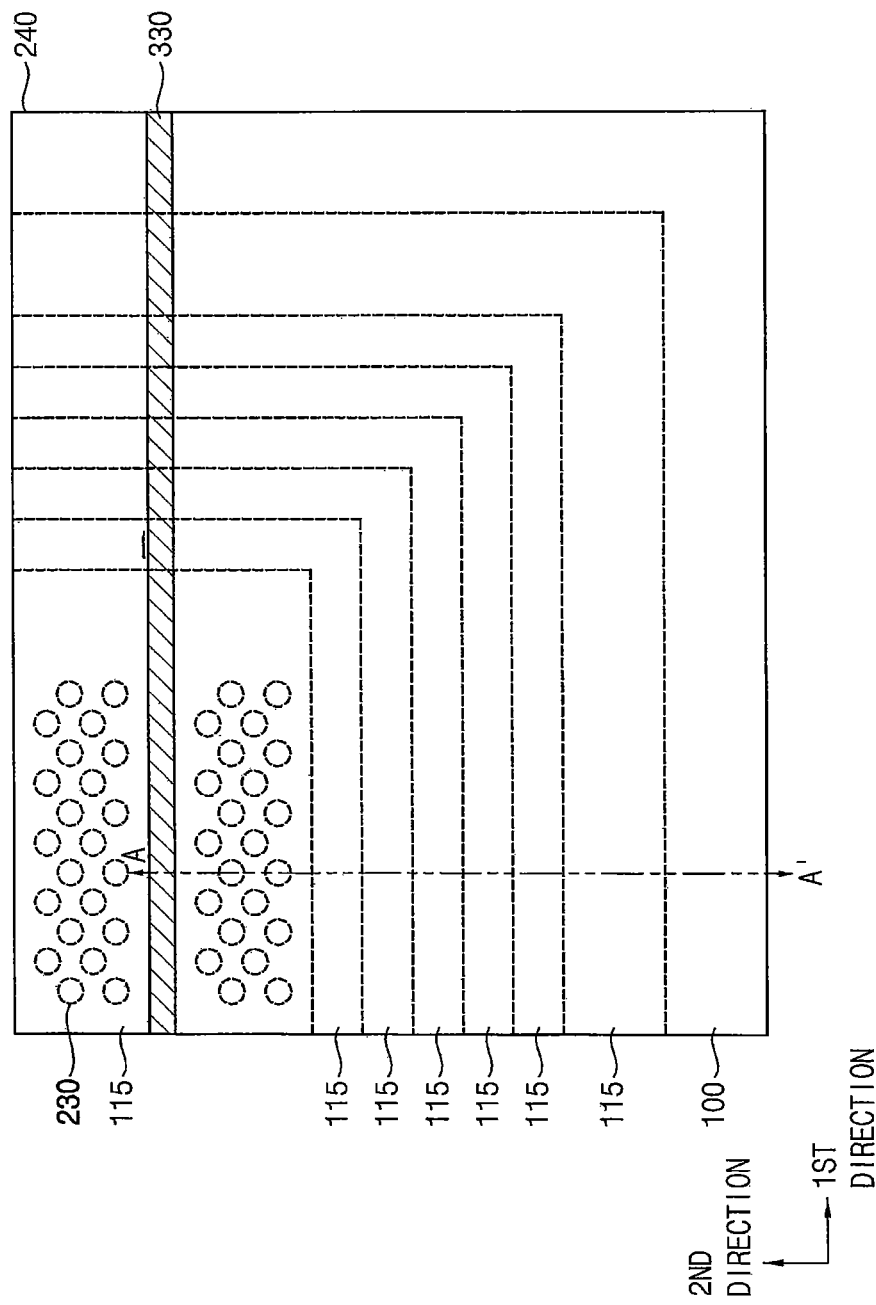
Figure 30:
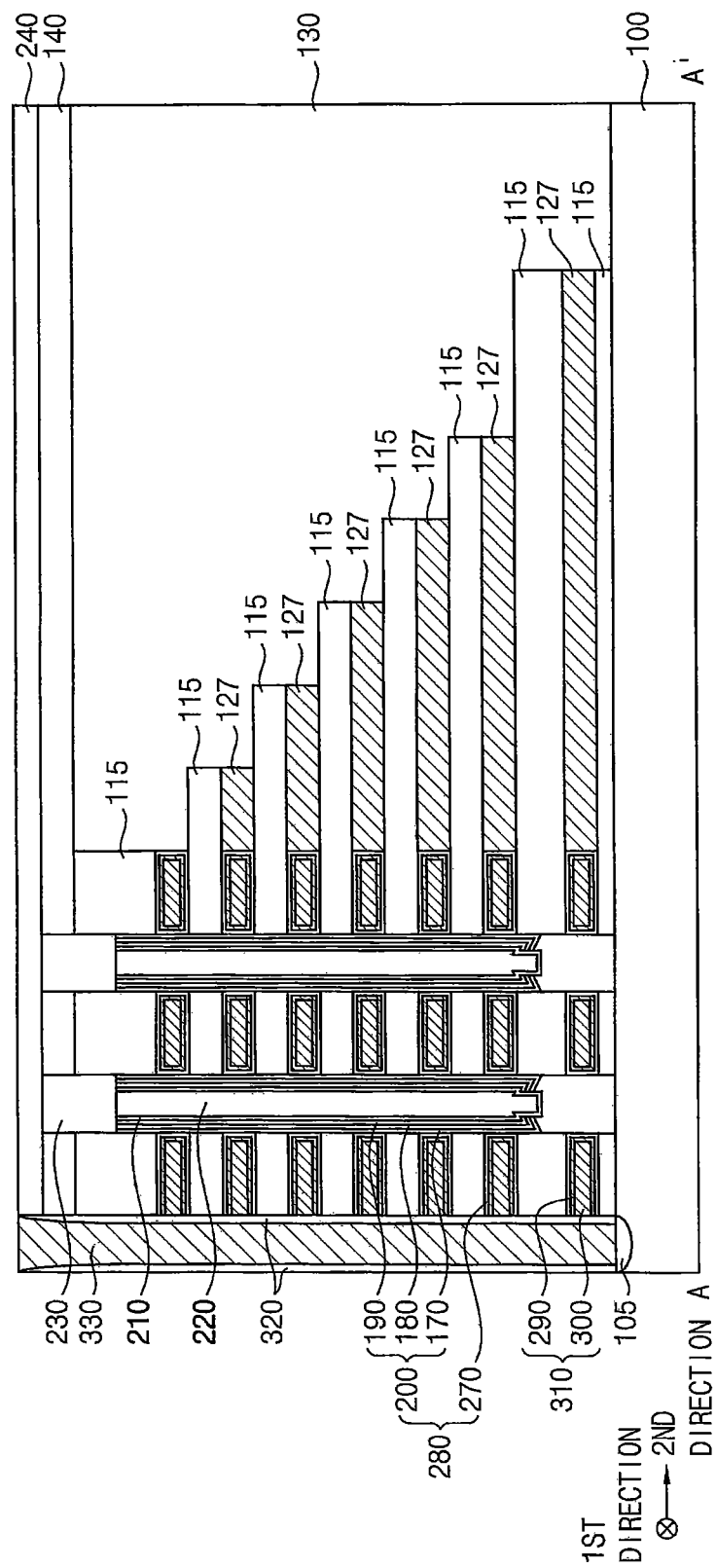

Referring to FIGS. 29 and 30, and impurities may be implanted into the exposed top surface of the substrate 100 to form an impurity region 105. In example embodiments, the impurities may include n-type impurities, for example, phosphorus and/or arsenic.

A second spacer layer may be formed on a top surface of the impurity region 105, a sidewall of the opening 250, and a top surface of the third insulating interlayer 240, and may be anisotropically etched to form a second spacer 320 on the sidewall of the opening 250. Accordingly, the impurity region 105 at an upper portion of the substrate 100 may be partially exposed. The second spacer layer may be formed of an oxide, e.g., silicon oxide.

A CSL 330 may be formed on the exposed impurity region 105 to fill a remaining portion of the opening 250. In example embodiments, The CSL 330 may be formed by forming a conductive layer on the exposed impurity region 105, the second spacer 320 and the third insulating interlayer 240, and planarizing the conductive layer until a top surface of the third insulating interlayer 240 may be exposed. The conductive layer may be formed of a metal, a metal nitride, and/or a metal silicide.

Figure 32A:
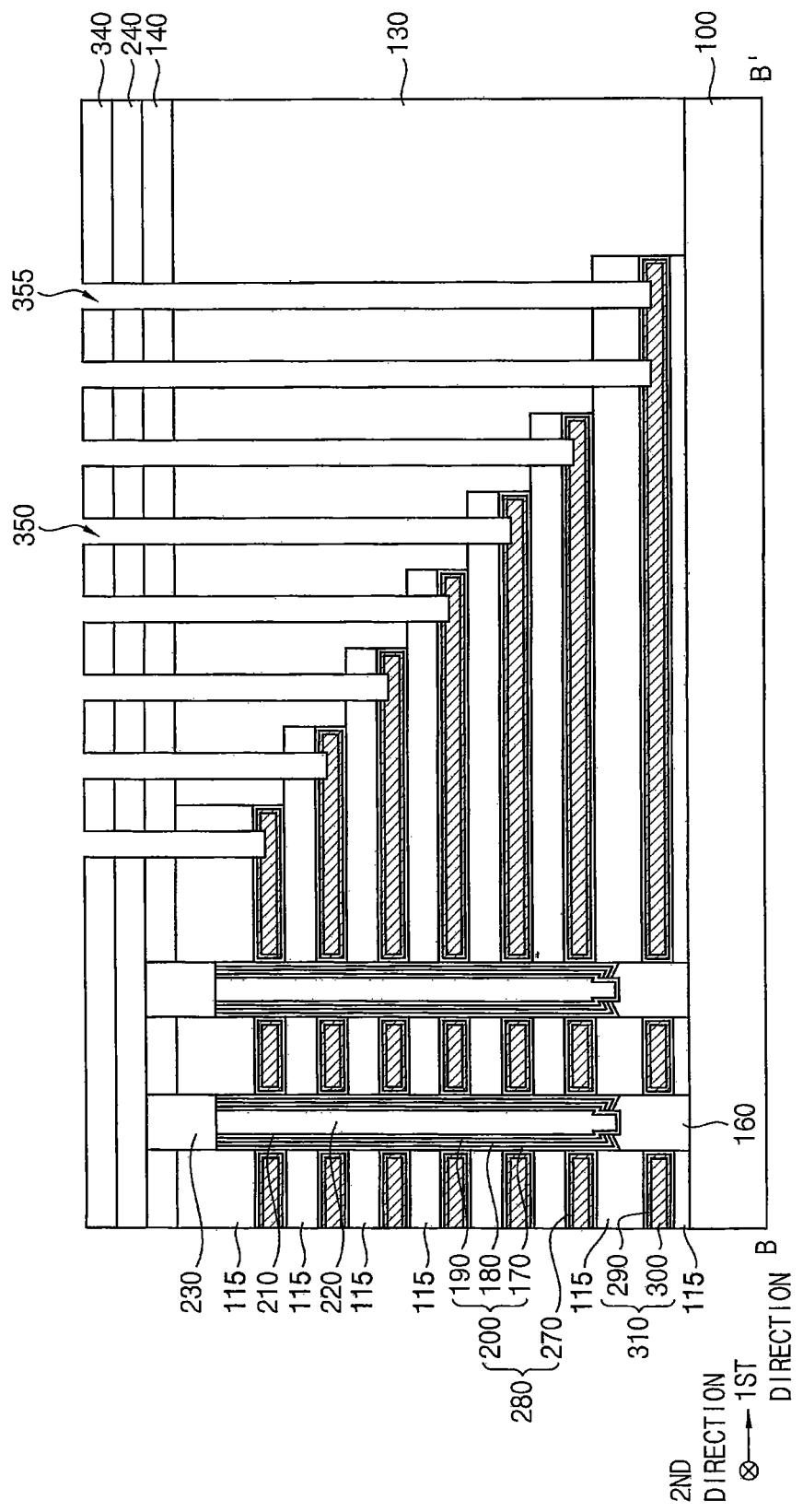
Figure 32B:
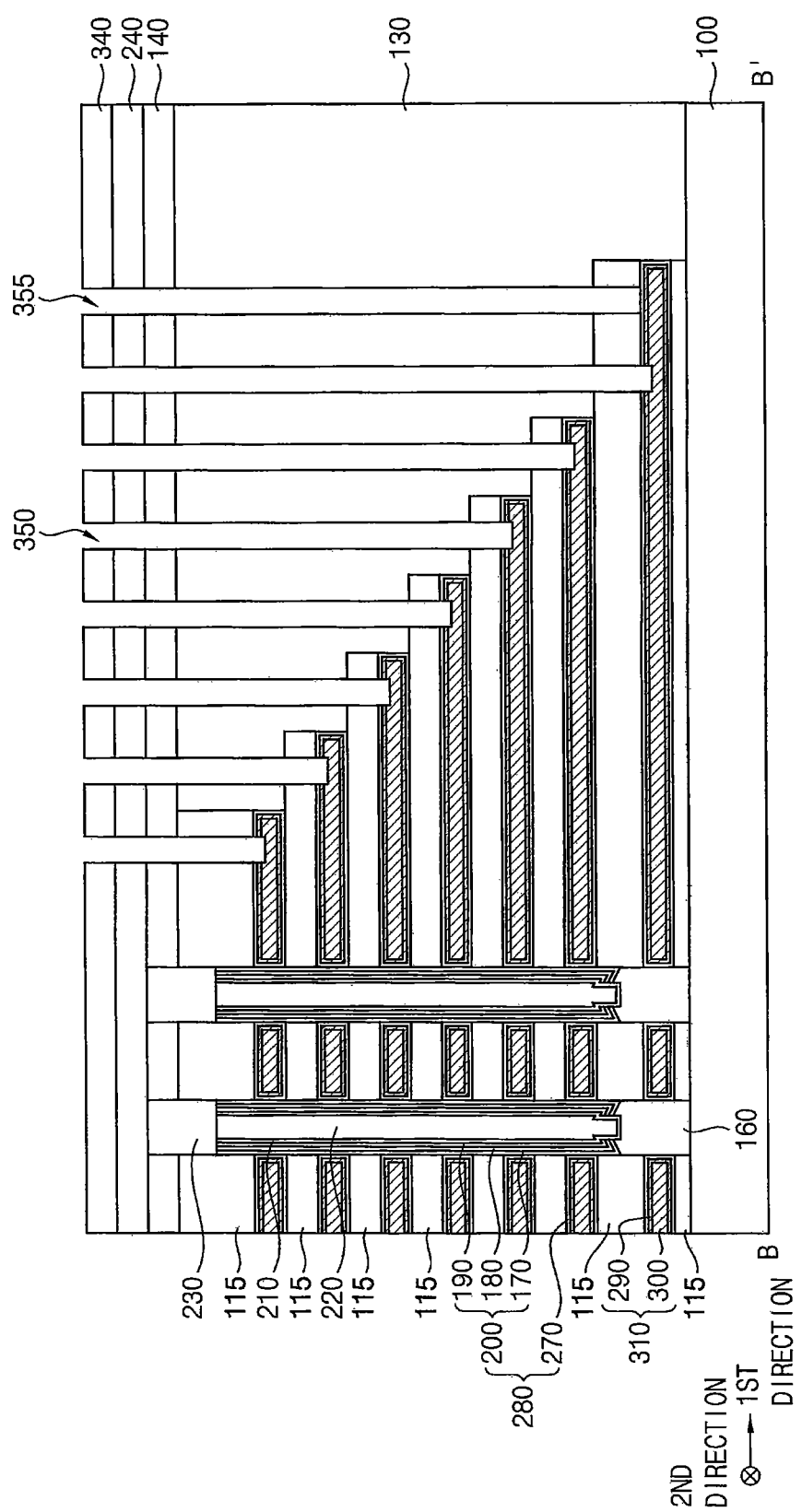

Referring to FIGS. 31 and 32A, a fourth insulating interlayer 340 may be formed on the third insulating interlayer 240 and the CSL 330, and a photolithography process may be performed using a photoresist pattern to form first and second contact holes 350 and 355.

Each of the first contact holes 350 may be formed through the first to fourth insulating interlayers 130, 140, 240 and 340, the insulation pattern 115, the second blocking pattern 270 and the gate barrier pattern 290 to expose the gate conductive pattern 300. That is, each of the first contact holes 350 may be formed through the first to fourth insulating interlayers 130, 140, 240 and 340, a portion of the insulation pattern 115 in each of the stairs not covered by upper stairs, and portions of the second blocking pattern 270 and the gate barrier pattern 290 under the portion of the insulation pattern 115 to expose the gate conductive pattern 300. Each of the first contact holes 350 may be formed through a portion of the gate barrier pattern 290 on a top surface of the gate conductive pattern 300 to expose the gate conductive pattern 300, and further expose an upper portion of the gate conductive pattern 300.

However, the inventive concepts may not be limited thereto, but any case in which each of the first contact holes 350 may expose at least a portion of the gate electrode 310 may be included in the scope of the inventive concepts. In an example embodiment, each of the first contact holes 350 may not be formed through the portion of the gate barrier pattern 290 on the top surface of the gate conductive pattern 300, but expose the top surface of the gate conductive pattern 300 only, or may be formed partially through the gate barrier pattern 290 not to expose the gate conductive pattern 300. Additionally or alternatively, each of the first contact holes 350 may be formed through the portion of the gate barrier pattern 290 on the top surface of the gate conductive pattern 300 and the gate conductive pattern 300, and may expose or may be formed partially through a portion of the gate barrier pattern 290 beneath on a bottom surface of the gate conductive pattern 300. Additionally or alternatively, each of the first contact holes 350 may be formed through all (e.g., an entirety) of the gate conductive pattern 300, and the portions of the gate barrier pattern 290 on the top surface of and beneath the bottom surface of the gate conductive pattern 300, and accordingly, a bottom of each of the first contact holes 350 may be located in the second blocking pattern 270 or in the insulation pattern 115 thereunder.

The first contact hole 350 exposing the gate electrode 310 at the uppermost level may not be formed through the first insulating interlayer 130.

Each of the first contact holes 350 may be formed on a portion of a corresponding stair not covered by upper stairs. In example embodiments, the first contact holes 350 may be formed in the first direction at a constant or uniform distance. In an example embodiment, when viewed from above (e.g., in plan view), the first contact holes 350 may be formed in the same line as a channel column of each channel block, e.g., the second channel column. Additionally or alternatively, when viewed from above, the first contact holes 350 may be disposed in the first direction at a central portion in the second direction of each channel block. That is, the first contact holes 350 may be formed in the first direction at any position in the second direction of each channel block.

Additionally or alternatively, the first contact holes 350 may be formed in a zigzag layout in the first direction.

In an example embodiment, the second contact hole 355 may be formed through the first to fourth insulating interlayers 130, 140, 240 and 340, the insulation pattern 115, the second blocking pattern 270 and the gate barrier pattern 290 to expose the gate conductive pattern 300 of the first gate electrode 310 in the first stair. However, the inventive concepts may not be limited thereto. That is, the second contact hole 355, like the first contact holes 350, may expose or may be formed partially through a portion of the gate barrier pattern 290 on a top surface of the gate conductive pattern 300, or may be formed through the gate conductive pattern 300 to expose or be formed partially through a portion of the gate barrier pattern 290 beneath a bottom surface of the gate conductive pattern 300. Further, the second contact hole 355 may be formed through all (e.g., an entirety) of the gate conductive pattern 300, and the portions of the gate barrier pattern 290 on the top surface of and beneath the bottom surface of the gate conductive pattern 300, and accordingly, a bottom of the second contact holes 355 may be located in the second blocking pattern 270 or in the insulation pattern 115 thereunder.

However, unlike the first contact holes 350, in some cases, the second contact hole 355 may not expose the gate electrode 310. That is, referring to FIG. 32B, the second contact hole 355 may expose or may be formed through a portion of the second blocking pattern 270 on a top surface of the gate electrode 310, but may not expose the gate electrode 310. Further, a bottom of the second contact hole 355 may be located in the insulation pattern 115 over the gate electrode 310, and may not expose the second blocking pattern 270.

In example embodiments, the second contact hole 355 may be formed on the first gate electrode 310 adjacent the first contact hole 350 on the first stair, and may be spaced apart from the first contact hole 350 on the first stair in the first direction at a distance substantially the same as that between the first contact holes 350 in the first direction. That is, the first and second contact holes 350 and 355 may be formed in the same line in the first direction. Additionally or alternatively, when the first contact holes 350 are formed in a zigzag layout in the first direction, the first and second contact holes 350 and 355 may be also formed in a zigzag layout in the first direction.

The first contact holes 350 may be formed by forming a photoresist pattern having holes therein, and etching underlying layers using the photoresist pattern as an etching mask. Due to the density difference of patterns, patterns at edge portions may not be formed to have a size and/or shape substantially the same as those of patterns at other portions, which may be known as a pattern loading effect. That is, when the holes are formed in the photoresist pattern, holes at edge portions of the photoresist pattern may be formed to have sizes and/or shapes different from those of holes at other portions, e.g., smaller sizes.

Additionally, when the first contact holes 350 are formed by etching the first to fourth insulating interlayers 130, 140, 240 and 340 partially through the stairs using the photoresist pattern as an etching mask, the first contact holes 350 may have depth difference therebetween according to the height difference between the stairs, and thus, for example, one of the first contact holes 350 partially through the lowermost level stair may not be formed to have a size and/or shape substantially the same as those of ones of the first contact holes 350 partially through other level stairs.

Accordingly, when only the first contact holes 350 are formed without the formation of the second contact hole 355, ones of the first contact holes 350 at edge portions in the first direction, i.e., ones of the first contact holes 359 on the lowermost level stair and the uppermost level stair may not be formed to have a desired size and/or shape due to the pattern loading effect. Particularly, one of the first contact holes 350 on the lowermost level stair having the largest depth may not be formed to have a desired size and/or shape.

However, in example embodiments, the second contact hole 355 may be formed to be adjacent the one of the first contact holes 350 on the lowermost level stair so that the pattern loading effect may not occur and the one of the first contact holes 350 on the lowermost level stair may have a desired size and/or shape. Accordingly, the lowermost level stair, i.e., the first stair on which the second contact hole 355 may be formed in addition to the first contact hole 350 may be formed to have a relatively long length in the first direction, as shown in FIGS. 16 and 17. The second contact hole 355 may be also formed on the uppermost level stair in addition to or instead of the second contact hole 355 on the lowermost level stair. However, the second contact hole 355 may be formed to have a size and/or shape different from those of the first contact holes 350 due to the pattern loading effect.

According to the process order or process conditions in an actual etching process, not only one of the first contact holes 350 on the lowermost level stair or on the uppermost level stair but also one of the first contact holes 350 on a middle level stair may not be formed to have a desired size and/or shape, and thus the second contact hole 355 may be also formed on the middle level stair. For example, when the first contact holes 350 are formed not by a single etching process but by a plurality of etching processes, e.g., two etching processes for lower stairs and upper stairs, respectively, not only one of the first contact holes 350 on the lowermost level stair and the uppermost level stair but also one of the first contact holes 350 on the middle level stair may not be formed to have a desired size and/or shape. Thus, the second contact holes 355 may be also formed on the middle level stair. However, in an example embodiment, after forming first and second contact plugs 380 and 385 to fill the first and second contact holes 350 and 355, respectively, on the lower stairs, an insulating interlayer may be formed to cover the first and second contact plugs 380 and 385, and first and second contact plugs 380 and 385 may be formed to fill the first and second contact holes 350 and 355, respectively, on the upper stairs.

That is, the "first stair" having a relative long length may include not only the lowermost level stair but also the middle level stair, and further a plurality of stairs. The second contact hole 355 may be formed on each of the plurality of first stairs. In example embodiments, one or a plurality of second contact holes 355 may be formed on each of the first stairs.

Hereinafter, only the case in which the first stair is the lowermost level stair and only one second contact plug 385 is formed on the first stair will be illustrated.

Figure 34:
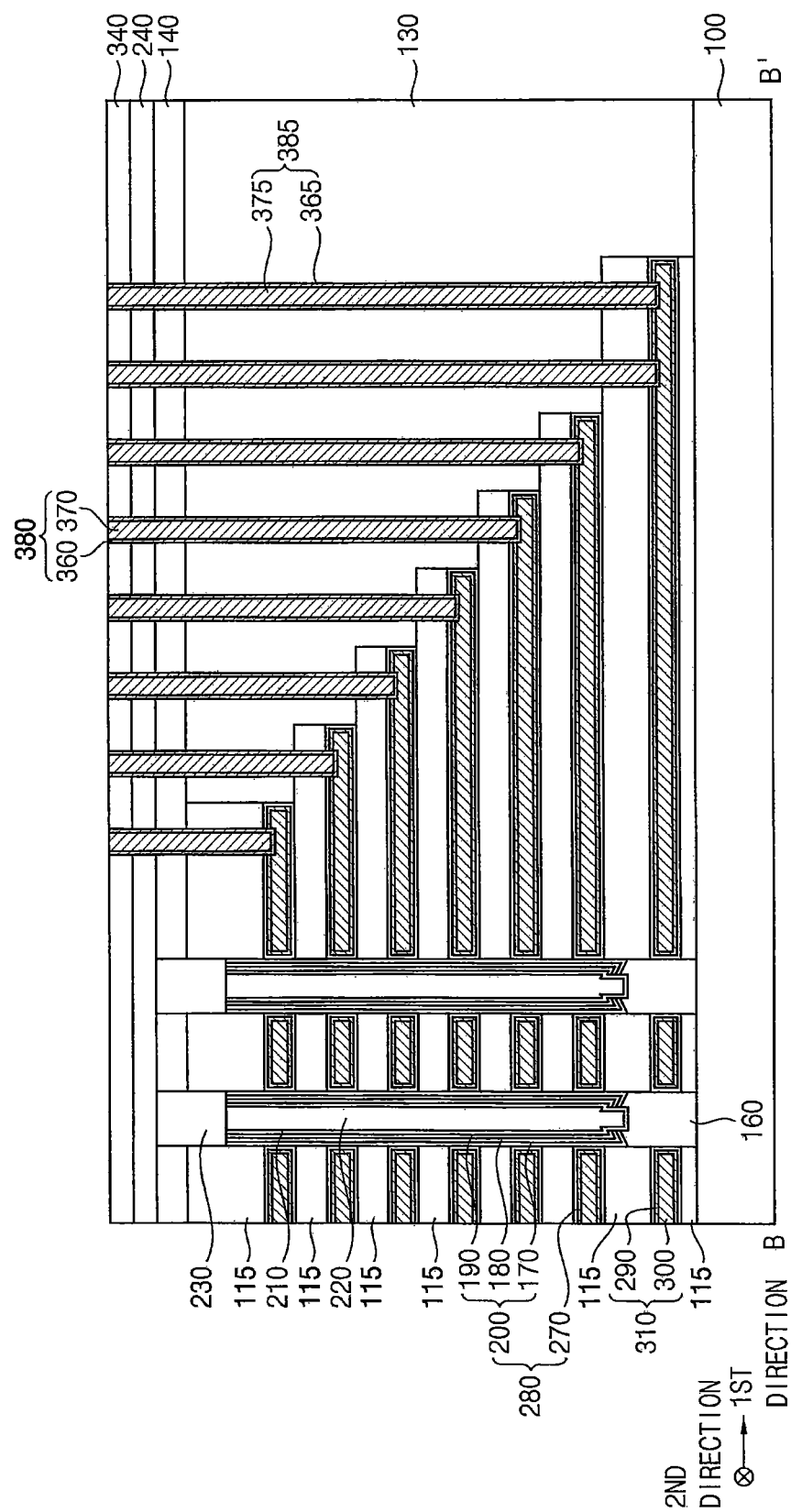

Referring to FIGS. 33 and 34, the first and second contact plugs 380 and 385 may be formed to fill the first and second contact holes 350 and 355, respectively.

In example embodiments, the first and second contact plugs 380 and 385 may be formed by forming a first barrier layer on the exposed portions of the gate electrode 310 by the first and second contact holes 350 and 355, inner walls of the first and second contact holes 350 and 355, and a top surface of the fourth insulating interlayer 340, forming a first conductive layer on the first barrier layer to fill remaining portions of the first and second contact holes 350 and 355, and planarizing the first conductive layer and the first barrier layer until the top surface of the fourth insulating interlayer 340 may be exposed.

The first conductive layer may be formed of a metal, e.g., tungsten, tantalum, titanium, etc., and the first barrier layer may be formed of a metal nitride, e.g., titanium nitride, tantalum nitride, tungsten nitride, etc. Additionally or alternatively, the first barrier layer may be formed to have a multi-layered structure including a metal layer and a metal nitride layer sequentially stacked.

The first contact plug 380 filling each of the first contact holes 350 may include a first conductive pattern 370, and a first barrier pattern 360 on or covering a bottom and a sidewall of the first conductive pattern 370. The second contact plug 385 filling each of the second contact holes 355 may include a second conductive pattern 375, and a second barrier pattern 365 on or covering a bottom and a sidewall of the second conductive pattern 375.

According to the layout of the first and second contact holes 350 and 355, the first and second contact plugs 380 and 385 may be formed in the same layout. In example embodiments, bottom surfaces of the first and second contact plugs 380 and 385 may not be formed at the same level, however, top surfaces of the first and second contact plugs 380 and 385 may be formed at substantially the same level, i.e., may be substantially coplanar with each other.

Figure 35:
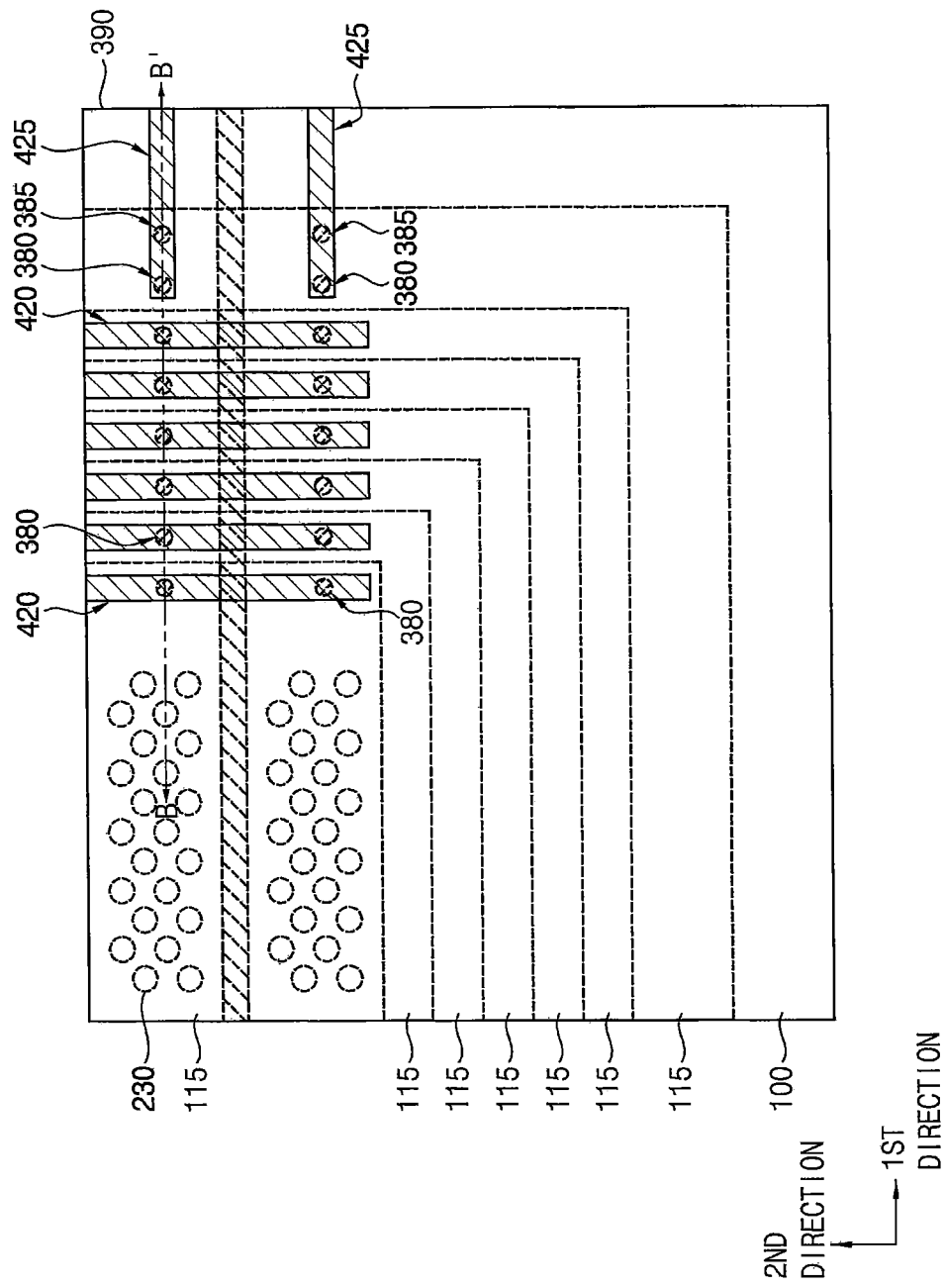
Figure 36:
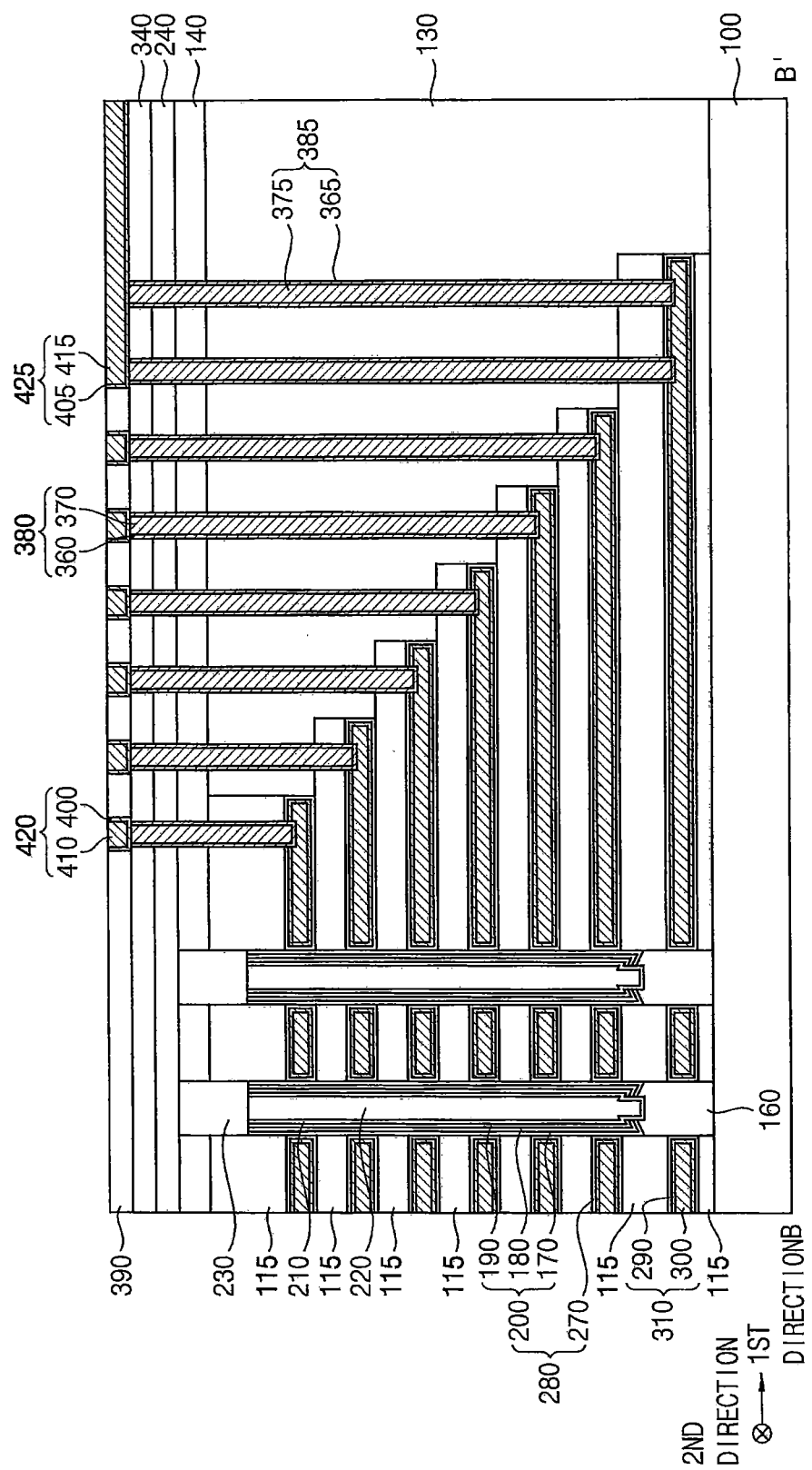
Figure 37:
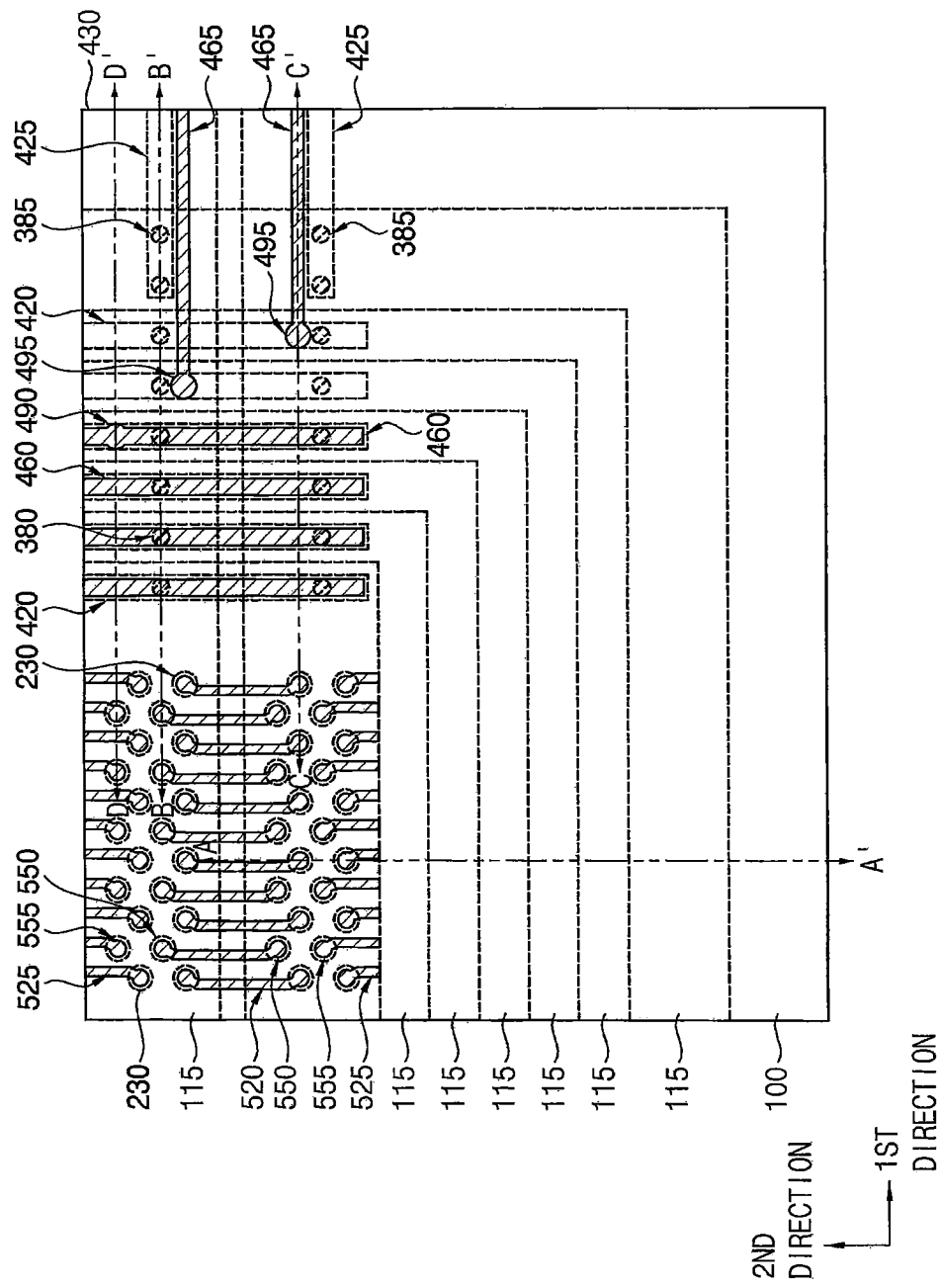
Figure 38:
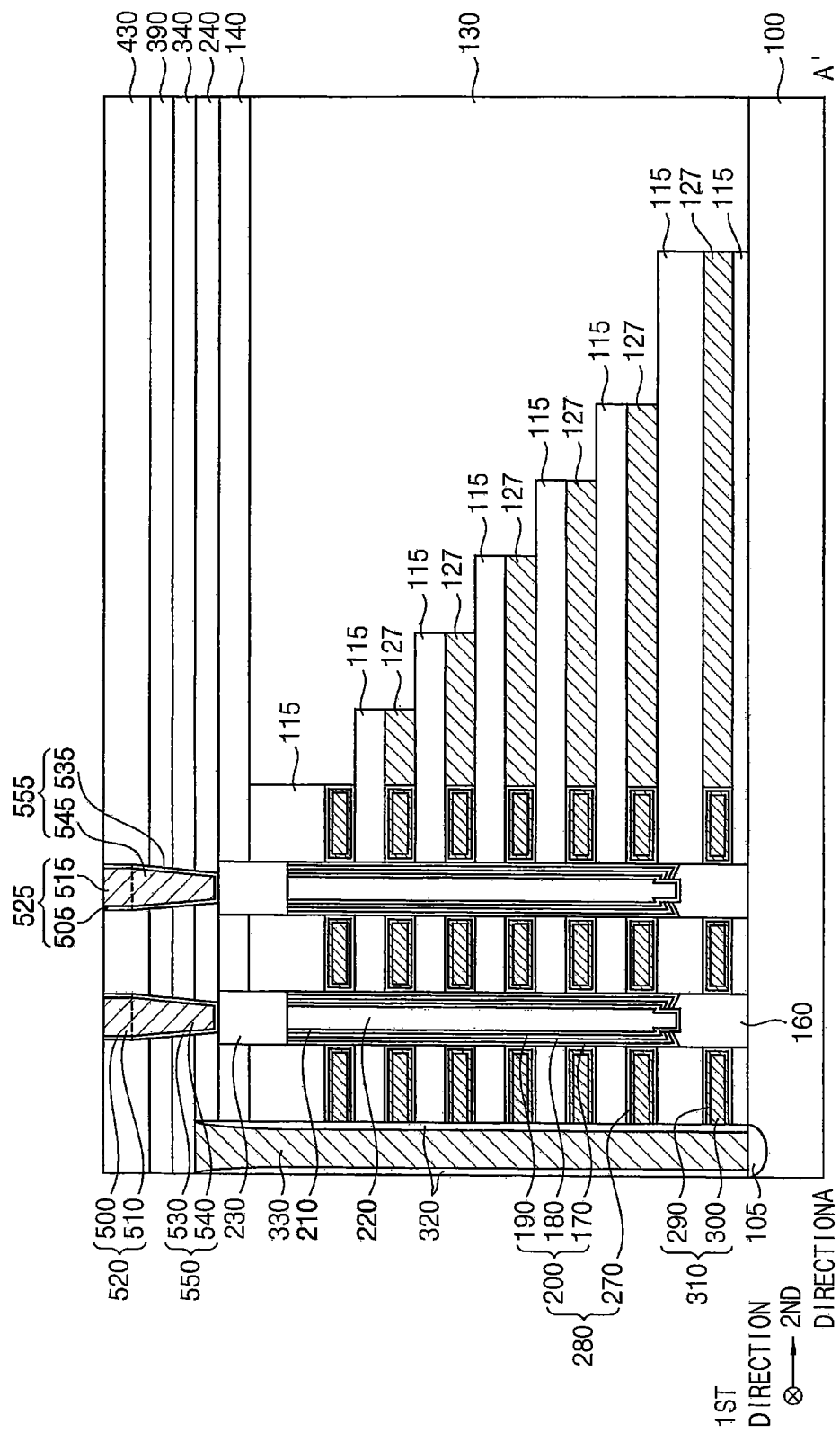
Figure 39:
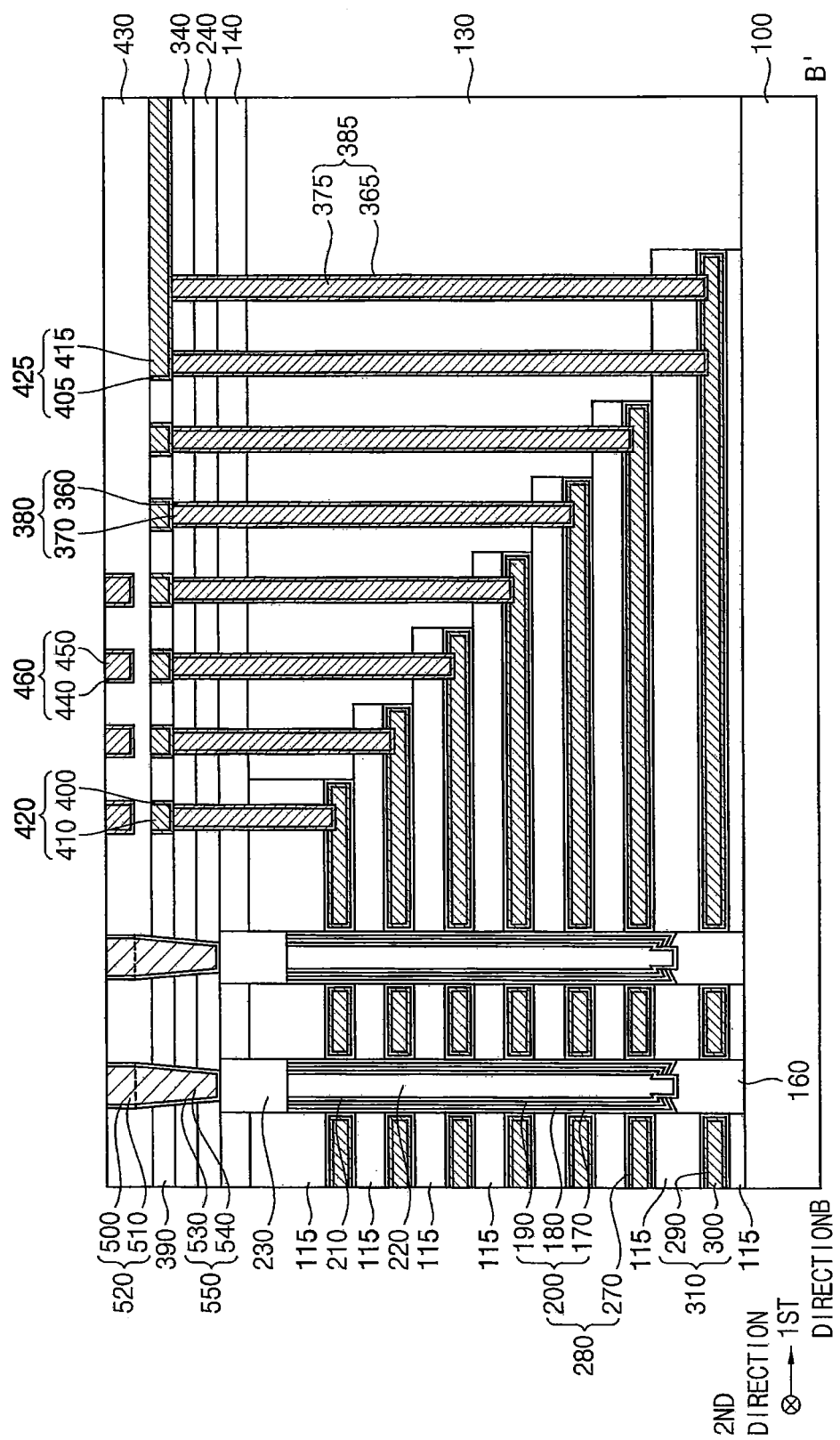

Referring to FIGS. 35 and 36, after forming a fifth insulating interlayer 390 on the fourth insulating interlayer 340 and the first and second contact plugs 380 and 385, first and second wirings 420 and 425 may be formed through the fifth insulating interlayer 390 to contact top surfaces of the first and second contact plugs 380 and 385.

The fifth insulating interlayer 390 may be formed of an oxide, e.g., silicon oxide, and thus may be merged with the fourth insulating interlayer 340.

The first and second wirings 420 and 425 may be formed by forming first and second openings through the fifth insulating interlayer 390 to expose top surfaces of the first and second contact plugs 380 and 385, forming a third barrier layer on the exposed top surfaces of the first and second contact plugs 380 and 385, inner walls of the first and second openings, and a top surface of the fifth insulating interlayer 390, forming a third conductive layer on the third barrier layer to fill remaining portions of the first and second openings, and planarizing the third conductive layer and the third barrier layer until the top surface of the fifth insulating interlayer 390 may be exposed.

The third conductive layer may be formed of a metal, e.g., tungsten, tantalum, titanium, etc., and the third barrier layer may be formed of a metal nitride, e.g., titanium nitride, tantalum nitride, tungsten nitride, etc. Additionally or alternatively, the third barrier layer may be formed to have a multi-layered structure including a metal layer and a metal nitride layer sequentially stacked.

The first wiring 420 filling the first opening may include a third conductive pattern 410, and a third barrier pattern 400 on or covering a bottom and a sidewall of the third conductive pattern 410. The second wiring 425 filling the second opening may include a fourth conductive pattern 415, and a fourth barrier pattern 405 on or covering a bottom and a sidewall of the fourth conductive pattern 415.

In example embodiments, the first wiring 420 may extend in the second direction, and a plurality of first wirings 420 may be formed in the first direction. Additionally, the second wiring 425 may extend in the first direction. Each of the first wirings 420 may contact the top surface of the first contact plug 380, and the second wiring 425 may contact the top surfaces of the first and second contact plugs 380 and 385 on the first stair.

Additionally or alternatively, the second wiring 425 may include a first portion extending in the first direction, and a second portion extending in the second direction. In this case, the second wiring 425 may contact the top surface of the first contact plug 380 on the first stair, and may not contact the top surface of the second contact plug 385. When the first and second contact plugs 380 and 385 are formed in a zigzag layout in the first direction, the second wiring 425 may extend in the first direction, but may contact the top surface of the first contact plug 380 on the first stair but may not contact the top surface of the second contact plug 385.

When the second contact plug 385 is not connected to the second wiring 425, no signal may be applied to the second contact plug 385, and the second contact plug 385 may be referred to as a dummy contact plug.

Each of the first wirings 420 may extend in the second direction to contact top surfaces of the first contact plugs 380 in some of the plurality of channel blocks disposed in the second direction. In an example embodiment, each of the first wirings 420 may extend in the second direction to contact top surfaces of the first contact plugs 380 in four channel blocks adjacent to each other in the second direction. The second wiring 425 may extend in the first direction to be connected to a wiring in the second region II, and thus an electrical signal may be applied thereto.

Referring to FIGS. 37 to 41, after forming a sixth insulating interlayer 430 on the fifth insulating interlayer 390 and the first and second wirings 420 and 425, first to fourth vias 490, 495, 550 and 555, third and fourth wirings 460 and 465, and first and second connection wirings 520 and 525 may be formed.

The sixth insulating interlayer 430 may be formed of an oxide, e.g., silicon oxide, and thus may be merged with the fifth insulating interlayer 390.

The third and fourth wirings 460 and 465, and the first and second vias 490 and 495 may be formed by removing an upper portion of the sixth insulating interlayer 430 to form first and second trenches, forming first and second via holes in communication with or exposing the first and second trenches, respectively, to expose top surfaces of the first and second wirings 420 and 425, forming a fifth barrier layer on the exposed top surfaces of the first and second wirings 420 and 425, inner walls of the first and second via holes, inner walls of the first and second trenches, and a top surface of the sixth insulating interlayer 430, forming a fifth conductive layer on the fifth barrier layer to fill remaining portions of the first and second via holes and the first and second trenches, and planarizing the fifth conductive layer and the fifth barrier layer until the top surface of the sixth insulating interlayer 430 may be exposed. In some case, before forming the first and second trenches, the first and second via holes may be formed.

The fifth conductive layer may be formed of a metal, e.g., copper, aluminum, tungsten, tantalum, titanium, etc., and the fifth barrier layer may be formed of a metal nitride, e.g., titanium nitride, tantalum nitride, tungsten nitride, etc. Additionally or alternatively, the fifth barrier layer may be formed to have a multi-layered structure including a metal layer and a metal nitride layer sequentially stacked.

The third wiring 460 filling the first trench may include a fifth conductive pattern 450, and a fifth barrier pattern 440 on or covering a bottom and a sidewall of the fifth conductive pattern 450. The fourth wiring 465 filling the second opening may include a sixth conductive pattern 455, and a sixth barrier pattern 445 on or covering a bottom and a sidewall of the sixth conductive pattern 455. Additionally, the first via 490 filling the first via hole may include a seventh conductive pattern 480, and a seventh barrier pattern 470 on or covering a bottom and a sidewall of the seventh conductive pattern 480. The second via 495 filling the second via hole may include an eighth conductive pattern 485, and an eighth barrier pattern 475 on or covering a bottom and a sidewall of the eighth conductive pattern 485. The first via 490 and the third wiring 460 sequentially stacked may be formed integrally, and the second via 495 and the fourth wiring 465 sequentially stacked may be also formed integrally.

In example embodiments, the third wiring 460 may extend in the second direction, and a plurality of third wirings 460 may be formed in the first direction. Additionally, the fourth wiring 465 may extend in the first direction. The third wirings 460 may be electrically connected to the first wirings 420, respectively, through the first via 490, and the fourth wirings 465 may be electrically connected to the first wirings 420, respectively, through the second via 495.

In an example embodiment, each of the third wirings 460 may extend in the second direction to be formed on four channel blocks adjacent to each other in the second direction. The fourth wiring 465 may extend in the first direction to be connected to a wiring in the second region II, and thus an electrical signal may be applied thereto.

The first and second connection wirings 520 and 525, and the third and fourth vias 550 and 555 may be formed by removing an upper portion of the sixth insulating interlayer 430 to form third and fourth trenches, forming third and fourth via holes in communication with or exposing the third and fourth trenches, respectively, to expose top surfaces of the capping patterns 230, forming a ninth barrier layer on the exposed top surfaces of the capping patterns 230, inner walls of the third and fourth via holes, inner walls of the third and fourth trenches, and a top surface of the sixth insulating interlayer 430, forming a ninth conductive layer on the ninth barrier layer to fill remaining portions of the third and fourth via holes and the third and fourth trenches, and planarizing the ninth conductive layer and the ninth barrier layer until the top surface of the sixth insulating interlayer 430 may be exposed. In some case, before forming the third and fourth trenches, the third and fourth via holes may be formed.

The ninth conductive layer may be formed of a metal, e.g., copper, aluminum, tungsten, tantalum, titanium, etc., and the ninth barrier layer may be formed of a metal nitride, e.g., titanium nitride, tantalum nitride, tungsten nitride, etc. Additionally or alternatively, the ninth barrier layer may be formed to have a multi-layered structure including a metal layer and a metal nitride layer sequentially stacked.

The first connection wiring 520 filling the third trench may include a ninth conductive pattern 510, and a ninth barrier pattern 500 on or covering a bottom and a sidewall of the ninth conductive pattern 510. The second connection wiring 525 filling the fourth trench may include a tenth conductive pattern 515, and a tenth barrier pattern 505 on or covering a bottom and a sidewall of the tenth conductive pattern 515. Additionally, the third via 550 filling the third via hole may include an eleventh conductive pattern 540, and an eleventh barrier pattern 530 on or covering a bottom and a sidewall of the eleventh conductive pattern 540. The fourth via 555 filling the fourth via hole may include a twelfth conductive pattern 545, and a twelfth barrier pattern 535 on or covering a bottom and a sidewall of the twelfth conductive pattern 545. The third via 550 and the first connection wiring 520 sequentially stacked may be formed integrally, and the fourth via 555 and the second connection wiring 525 sequentially stacked may be also formed integrally.

The third and fourth vias 550 and 555 may be formed on the capping patterns 230 on the channels 210, respectively. Each of the first and second connection wirings 520 and 525 may extend in the second direction, and the first and second connection wirings 520 and 525 may be electrically connected to the third and fourth vias 550 and 555, respectively. Thus, the first and second connection wirings 520 and 525 may electrically connect the channels 210 included in both channel blocks spaced apart from each other in the second direction by the CSL 330. In example embodiments, the first connection wiring 520 may connect the channels 210 included in the third and fourth channel columns of a first channel block and the channels 210 included in the first and second channel columns of a second channel block spaced apart from the first channel block in the second direction. The second connection wiring 525 may connect the channels 210 included in the third and fourth channel columns of the second channel block and the channels 210 included in the first and second channel columns of a third channel block spaced apart from the second channel block in the second direction.

Figure 42:
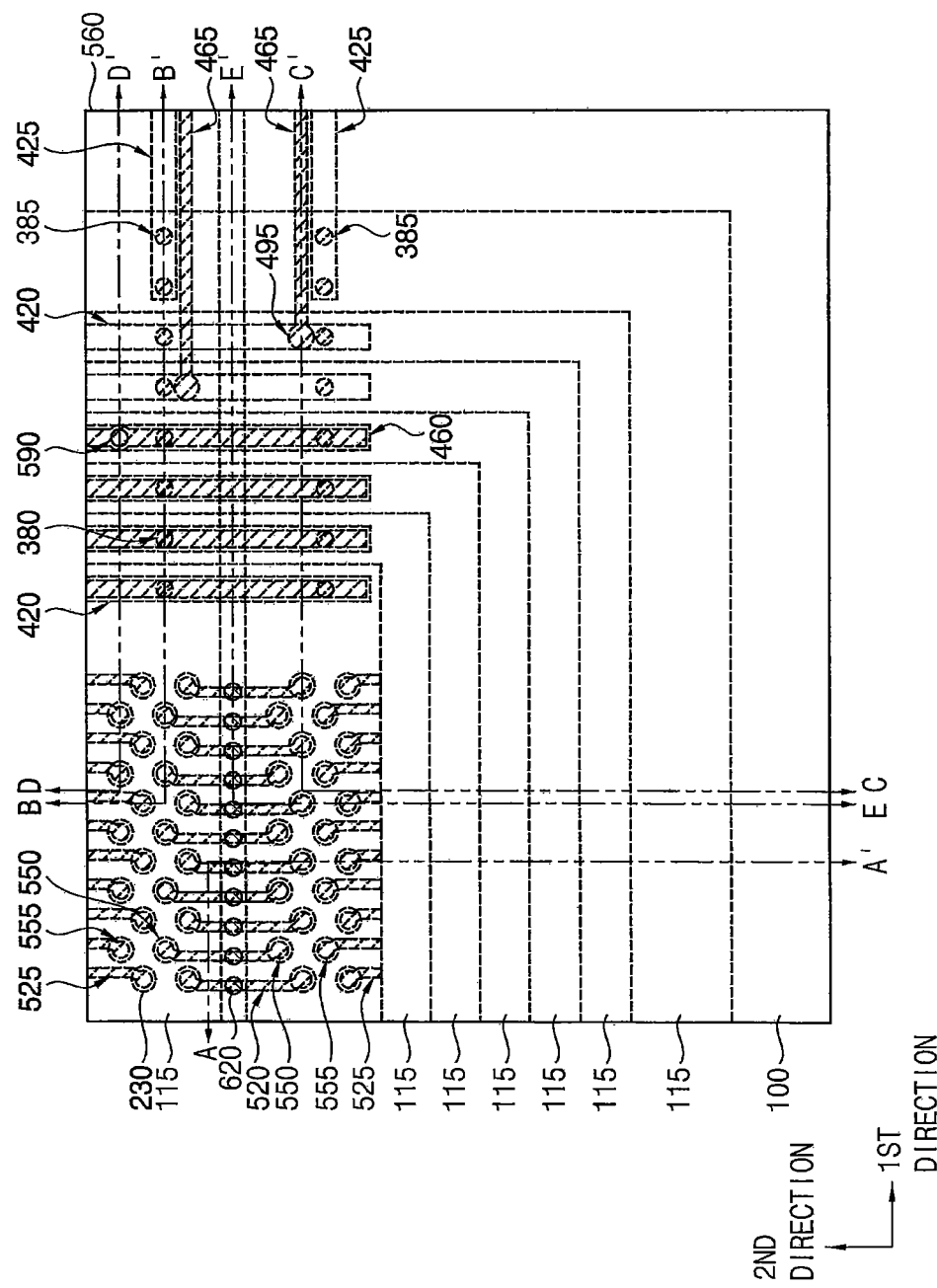
Figure 43:
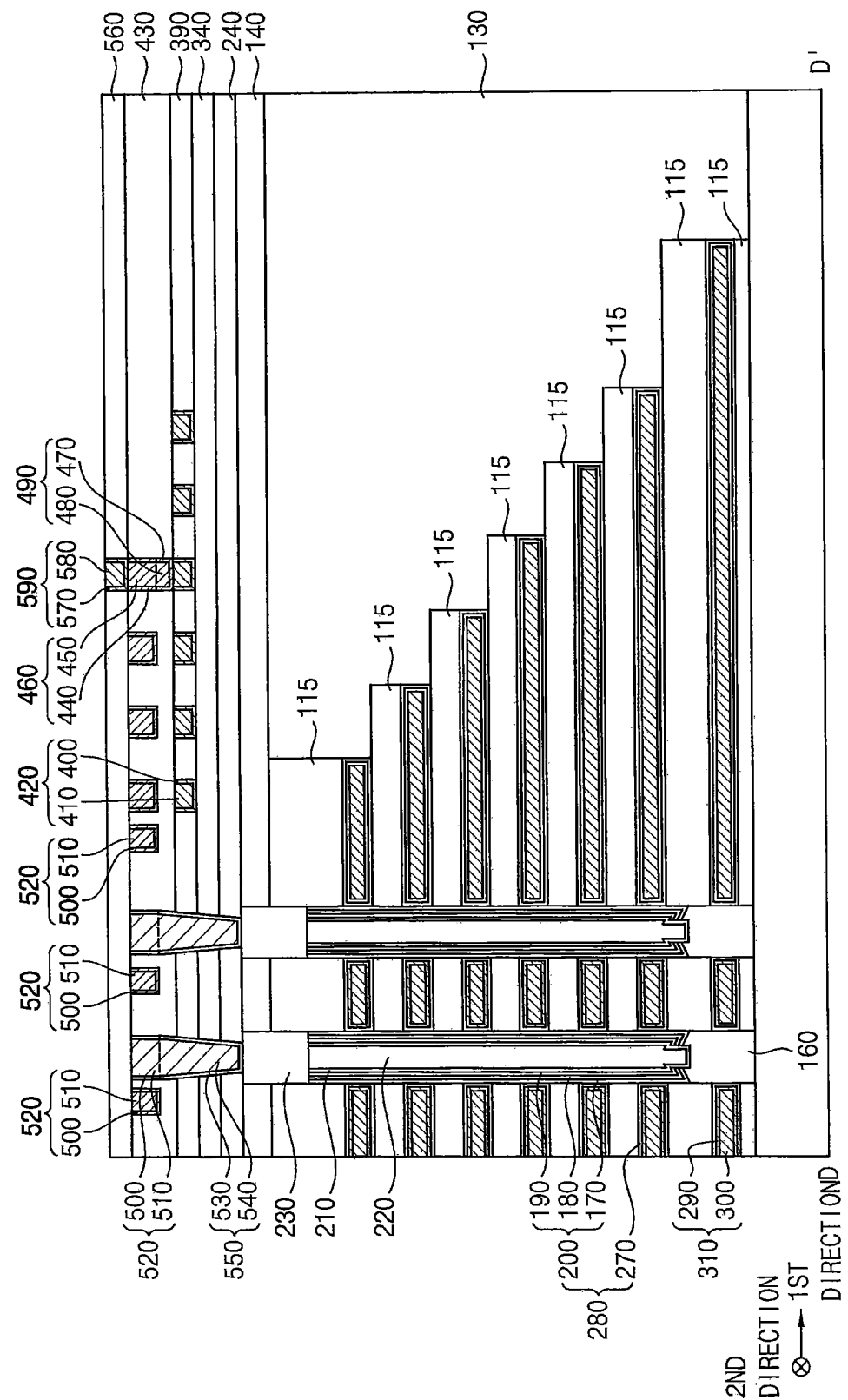
Figure 44:
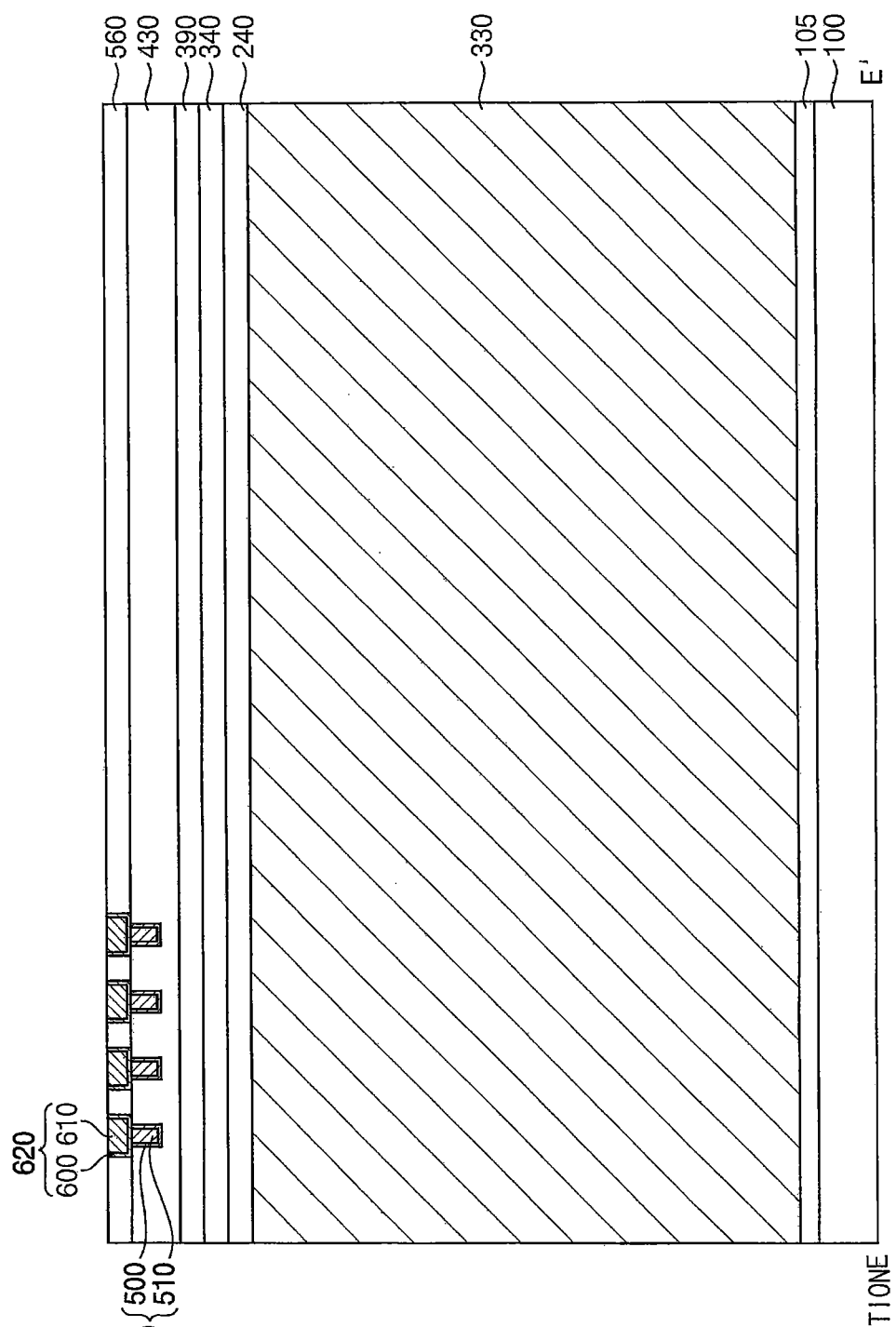

Referring to FIGS. 42 to 44, after forming a seventh insulating interlayer 560 on the sixth insulating interlayer 430, the third and fourth wirings 460 and 465, and first and second connection wirings 520 and 525, and fifth and sixth vias 590 and 620 may be formed.

The seventh insulating interlayer 560 may be formed of an oxide, e.g., silicon oxide, and thus may be merged with the sixth insulating interlayer 430.

The fifth and sixth vias 590 and 620 may be formed by forming fifth and sixth via holes through the seventh insulating interlayer 560 to expose top surfaces of third wiring 460 and the first and second connection wirings 520 and 525, forming a thirteenth barrier layer on the exposed top surfaces of third wiring 460 and the first and second connection wirings 520 and 525, inner walls of the fifth and sixth via holes, and a top surface of the seventh insulating interlayer 560, forming a thirteenth conductive layer on the thirteenth barrier layer to fill remaining portions of the fifth and sixth via holes, and planarizing the thirteenth conductive layer and the thirteenth barrier layer until the top surface of the seventh insulating interlayer 560 may be exposed.

The thirteenth conductive layer may be formed of a metal, e.g., copper, aluminum, tungsten, tantalum, titanium, etc., and the thirteenth barrier layer may be formed of a metal nitride, e.g., titanium nitride, tantalum nitride, tungsten nitride, etc. Additionally or alternatively, the thirteenth barrier layer may be formed to have a multi-layered structure including a metal layer and a metal nitride layer sequentially stacked.

The fifth via 590 filling the fifth via hole may include a thirteenth conductive pattern 580, and a thirteenth barrier pattern 570 on or covering a bottom and a sidewall of the thirteenth conductive pattern 580. The sixth via 620 filling the sixth via hole may include a fourteenth conductive pattern 610, and a fourteenth barrier pattern 600 on or covering a bottom and a sidewall of the fourteenth conductive pattern 610.

The fifth via 590 may be electrically connected to the third wiring 460, and the sixth via 620 may be electrically connected to the first and second connection wirings 520 and 525.

Referring to FIGS. 2 to 7 again, after forming an eighth insulating interlayer 630 on the seventh insulating interlayer 560, and the fifth and sixth vias 590 and 620, and fifth and sixth wirings 660 and 690 may be formed.

The eighth insulating interlayer 630 may be formed of an oxide, e.g., silicon oxide, and thus may be merged with the seventh insulating interlayer 560.

The fifth and sixth wirings 660 and 690 may be formed by forming third and fourth openings through the eighth insulating interlayer 630 to expose the fifth and sixth vias 590 and 620, respectively, forming a fifteenth barrier layer on the exposed top surfaces of the fifth and sixth vias 590 and 620, inner walls of the third and fourth openings, and a top surface of the eighth insulating interlayer 630, forming a fifteenth conductive layer on the fifteenth barrier layer to fill remaining portions of the third and fourth openings, and planarizing the fifteenth conductive layer and the fifteenth barrier layer until the top surface of the eighth insulating interlayer 630 may be exposed.

The fifteenth conductive layer may be formed of a metal, e.g., copper, aluminum, tungsten, tantalum, titanium, etc., and the fifteenth barrier layer may be formed of a metal nitride, e.g., titanium nitride, tantalum nitride, tungsten nitride, etc. Additionally or alternatively, the fifteenth barrier layer may be formed to have a multi-layered structure including a metal layer and a metal nitride layer sequentially stacked.

The fifth wiring 660 filling the third opening may include a fifteenth conductive pattern 650, and a fifteenth barrier pattern 640 on or covering a bottom and a sidewall of the fifteenth conductive pattern 650. The sixth wiring 690 filling the fourth opening may include a sixteenth conductive pattern 680, and a sixteenth barrier pattern 670 on or covering a bottom and a sidewall of the sixteenth conductive pattern 680.

In example embodiments, the fifth wiring 660 may extend in the first direction to be connected to a wiring in the second region II, and thus an electrical signal may be applied thereto. That is, an electrical signal applied from the wiring in the second region II may be transferred to the first contact plug 380 through the fifth wiring 660, the fifth via 590, the third wiring 460, the first via 490 and the first wiring 420.

In example embodiments, the sixth wiring 690 may extend in the second direction, and may be electrically connected to the channel 210 through the sixth via 620, the first and second connection wirings 520 and 525, the third and fourth vias 550 and 555, and the capping pattern 230. The sixth wiring 690 may serve as a bit line.

The vertical memory device may be manufactured by the above processes.

As illustrated above, in the method of manufacturing the vertical memory device, when the first contact plugs 380 are formed to be connected to the gate electrodes 310 in the stairs of the staircase structure, the second contact plugs 385 may be further formed on some of the stairs. Thus, the pattern loading effect may be reduced or prevented so that the first contact plugs 380 may be formed to contact the gate electrodes 310 well.

FIGS. 45 to 70 are plan views and cross-sectional views illustrating vertical memory devices in accordance with example embodiments. Particularly, FIGS. 45, 47, 49, 51, 53, 55, 57, 59, 61, 63, 65, 67 and 69 are plan views, and FIGS. 46, 48, 50, 52, 54, 56, 58, 60, 62, 64, 66, 68 and 70 are cross-sectional views. Each of the cross-sectional views shows a cross-section along a cutline B-B' of a corresponding plan view.

The vertical memory devices shown in FIGS. 45 to 70 may be substantially the same as that of FIGS. 1 to 13 except for the second contact plug and an upper wiring connected thereto. Thus, like reference numerals refer to like elements, and detailed descriptions thereon may be omitted below in the interest of brevity. For the convenience of explanation, FIGS. 45 to 70 show only the structure under the fifth insulating interlayer on the substrate as shown in FIGS. 8A and 8B.

Figure 45:
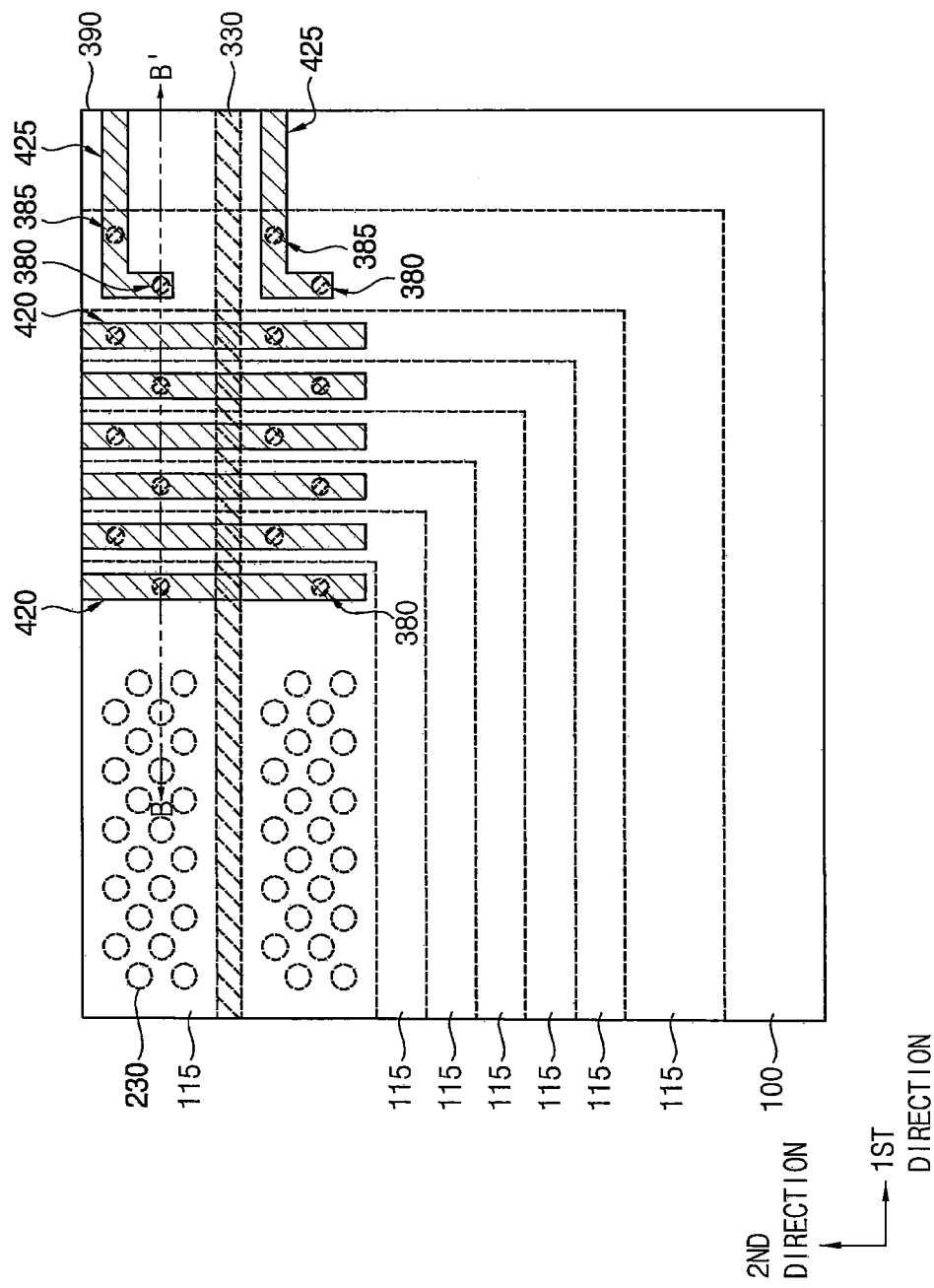
Figure 46:
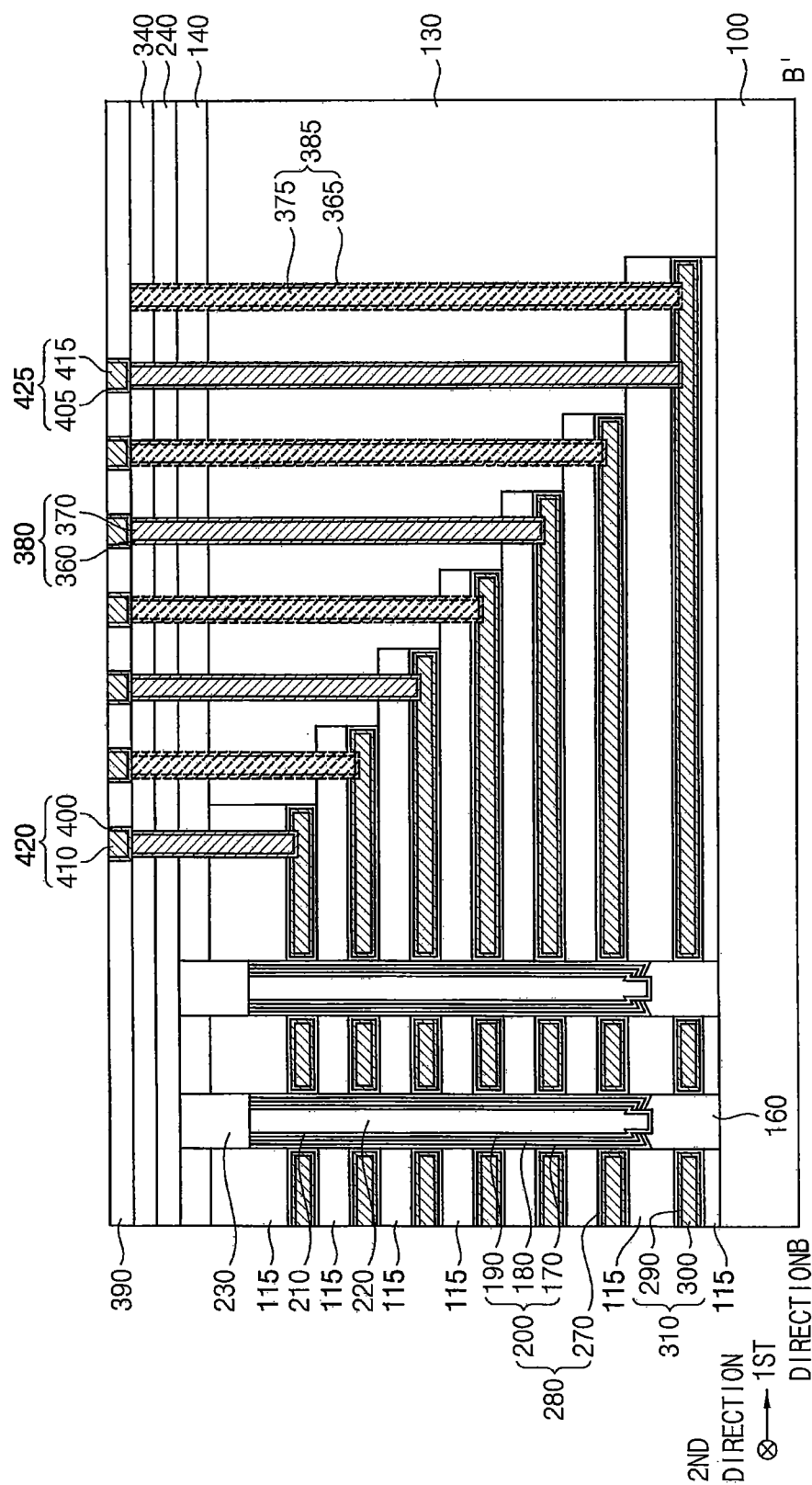

Referring to FIGS. 45 and 46, the first and second contact plugs 380 and 385 may be disposed in a zigzag layout in the first direction. Both of the first and second contact plugs 380 and 385 may be formed on the first gate electrode 310 in the lowermost level stair, and the second wiring 425, which may be commonly connected to the first and second contact plugs 380 and 385 and apply an electrical signal thereto, may include a first portion extending in the first direction, and a second portion extending in the second direction.

Figure 47:
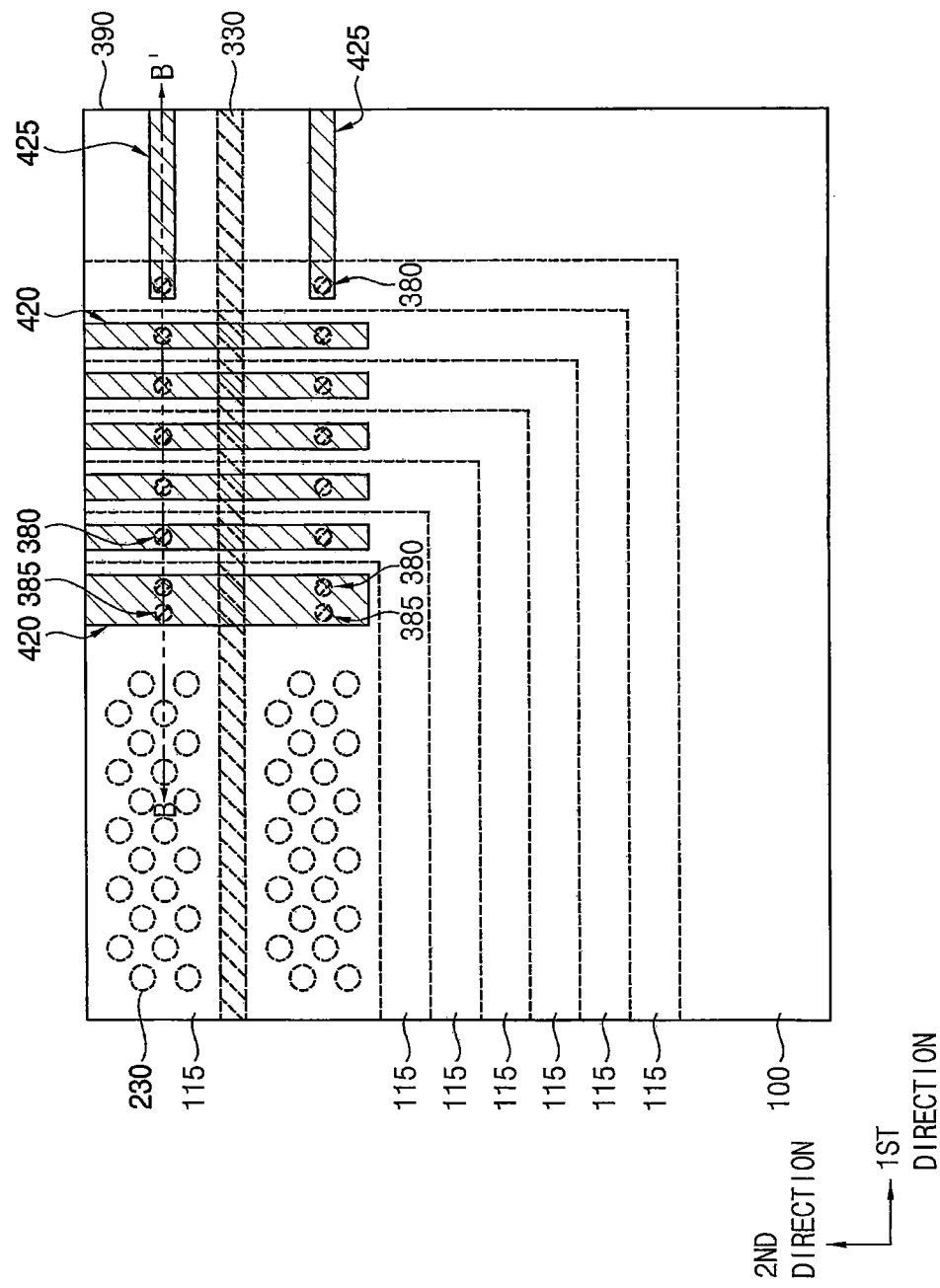
Figure 48:
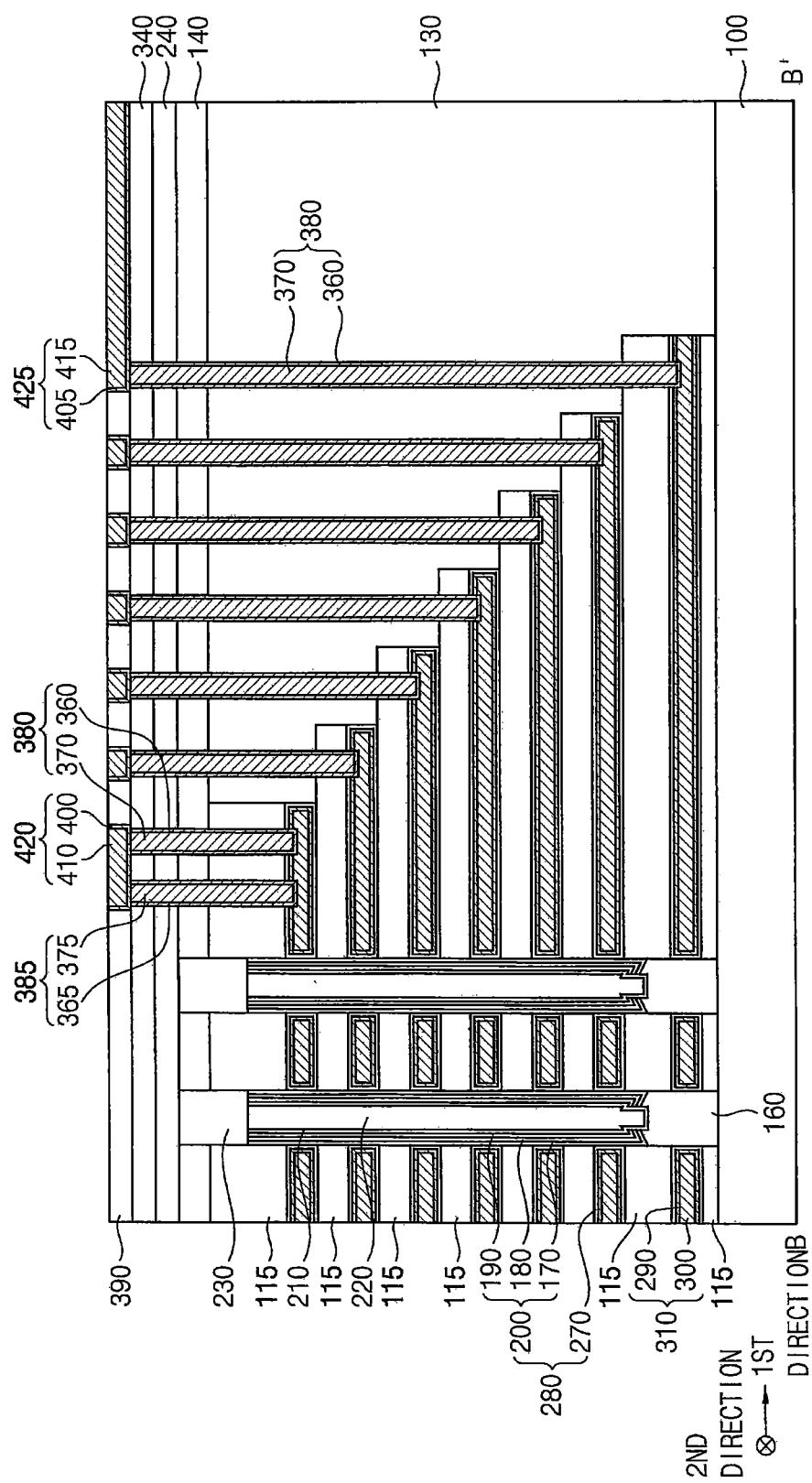

Referring to FIGS. 47 and 48, the first and second contact plugs 380 and 385 may be disposed in the same line in the first direction. Both of the first and second contact plugs 380 and 385 may be formed on the first gate electrode 310 in the uppermost level stair, and the second wiring 425, which may be commonly connected to the first and second contact plugs 380 and 385 and apply an electrical signal thereto, may extend in the second direction.

Figure 50A:
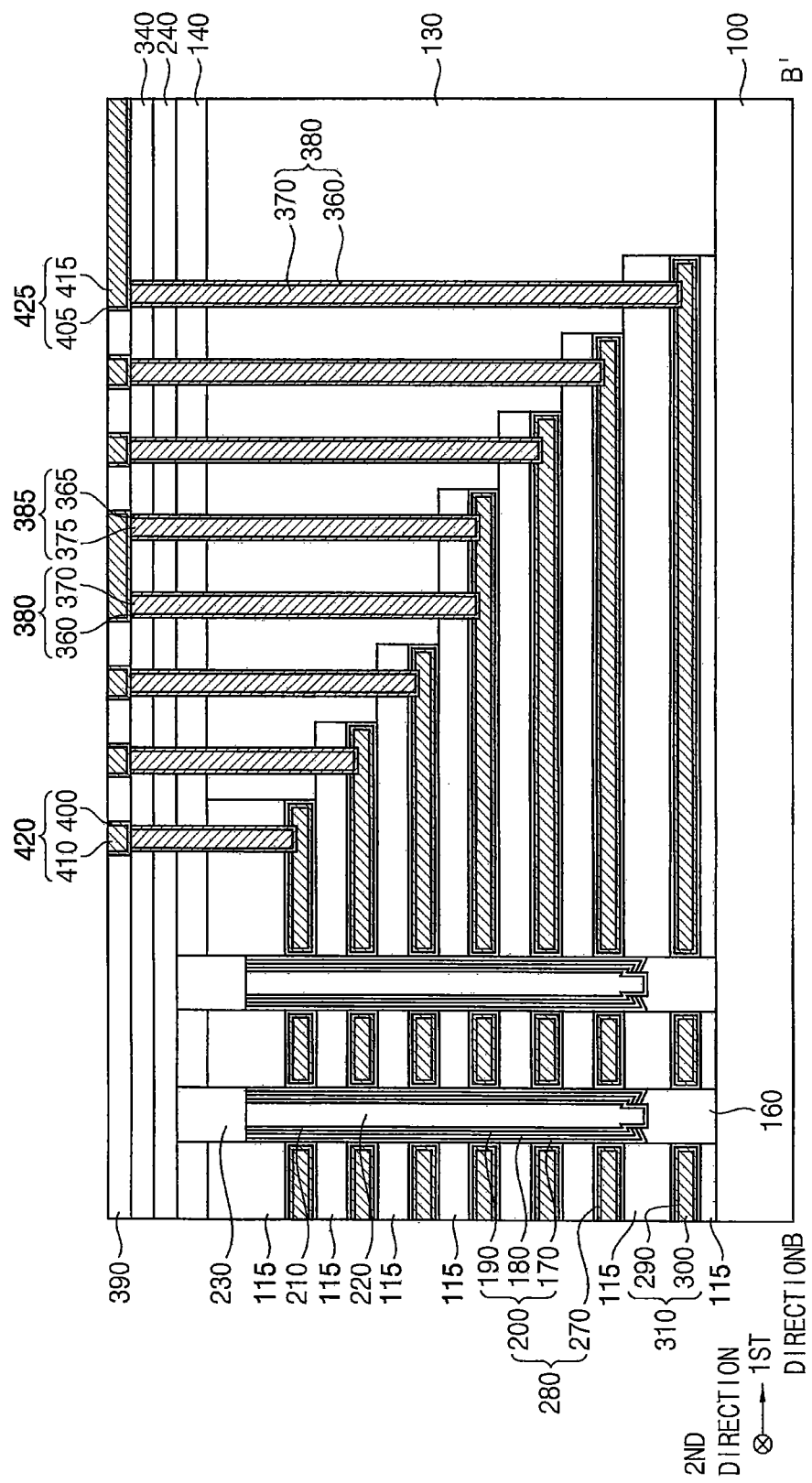

Referring to FIGS. 49 and 50A, the first and second contact plugs 380 and 385 may be disposed in the same line in the first direction. Both of the first and second contact plugs 380 and 385 may be formed on the first gate electrode 310 in the middle level stair, and the first wiring 420, which may be commonly connected to the first and second contact plugs 380 and 385 and apply an electrical signal thereto, may extend in the second direction.

Figure 50B:
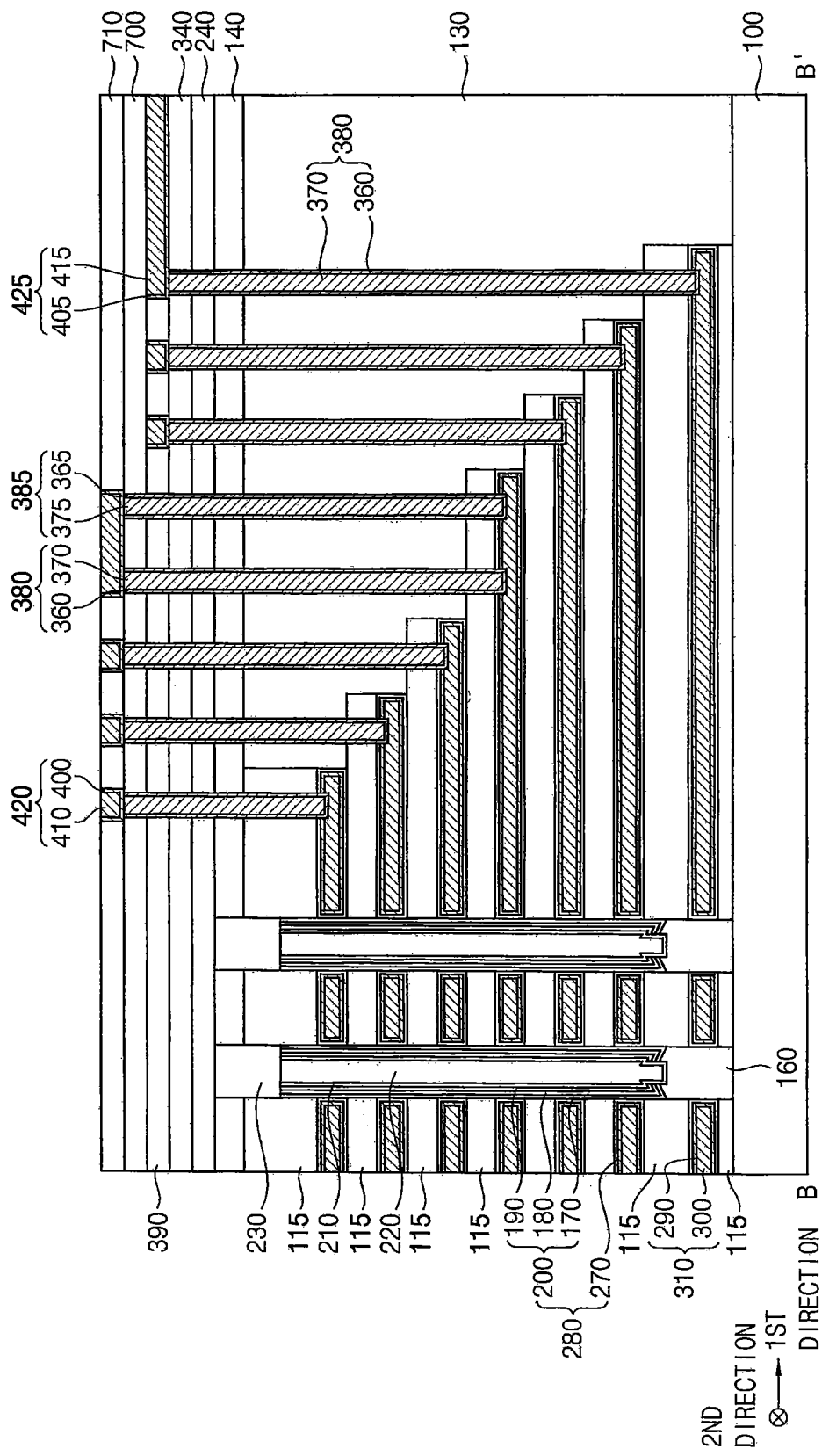

Referring to FIG. 50B, the first and second contact plugs 380 and 385 may be divided into two groups, e.g., upper and lower groups. That is, ninth and tenth insulating interlayers 700 and 710 may be further formed on the fifth insulating interlayer 390 and the first and second wirings 420 and 425 connected to the first and second contact plugs 380 and 385 on the lower stairs. The first and second contact plugs 380 and 385 on the upper stairs may penetrate or extend through the first to fifth insulating interlayers 130, 140, 240, 340 and 390, and the ninth insulating interlayer 700, and the first and second wirings 420 and 425 may be formed through the tenth insulating interlayer 710.

Figure 51:
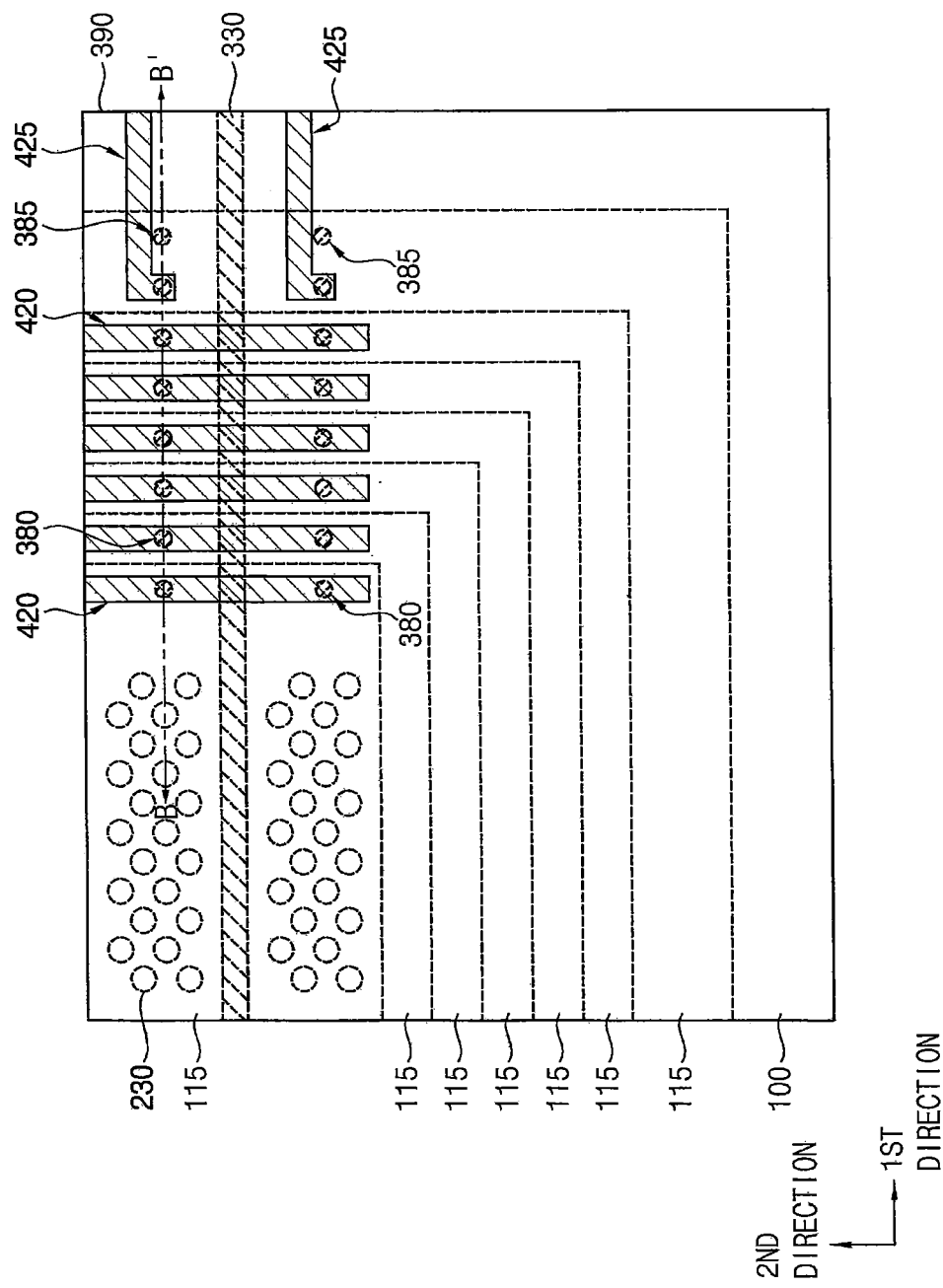
Figure 52:
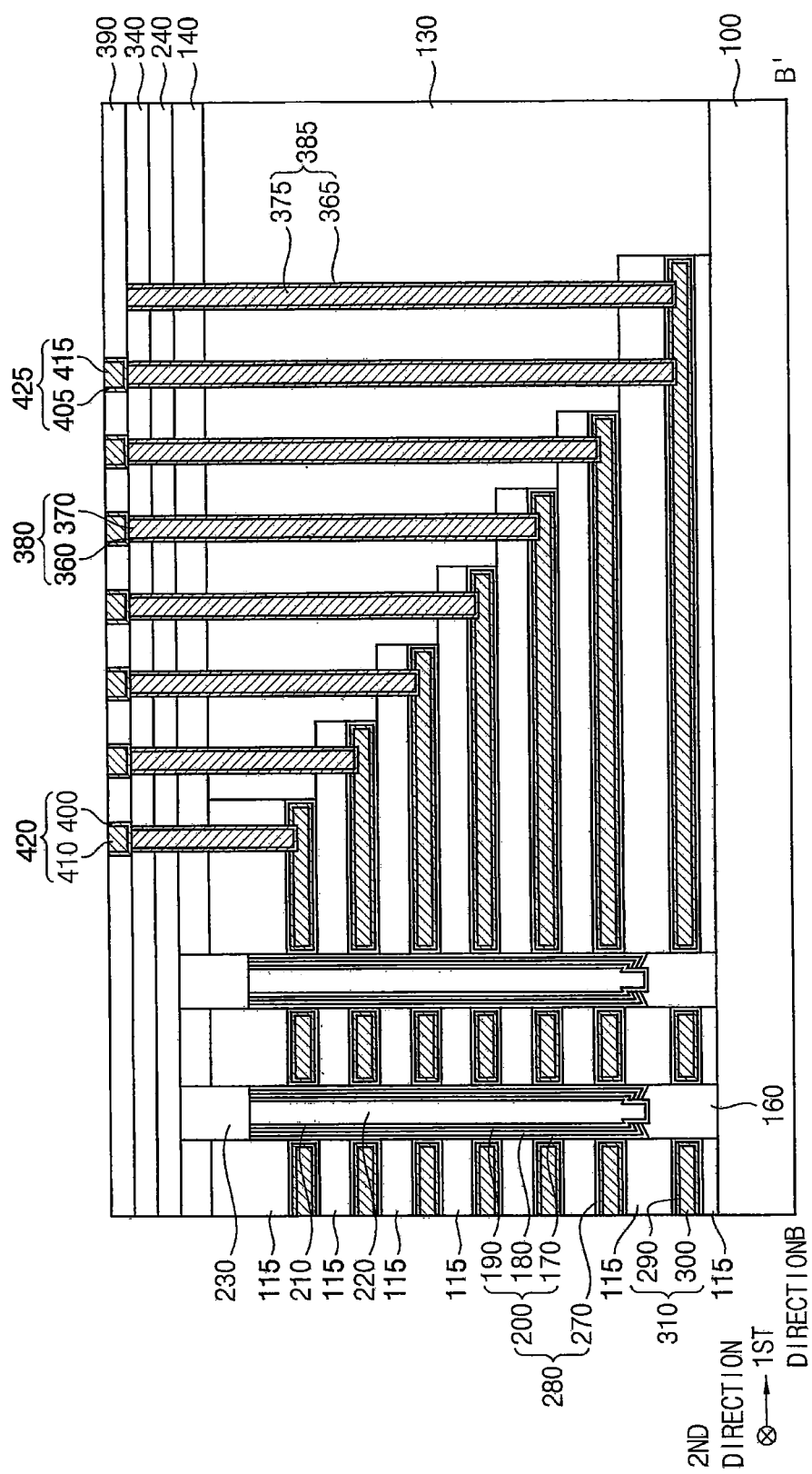

Referring to FIGS. 51 and 52, the first and second contact plugs 380 and 385 may be disposed in the same line in the first direction. Both of the first and second contact plugs 380 and 385 may be formed on the first gate electrode 310 in the lowermost level stair. The second wiring 425, which may be electrically connected to the first contact plug 380, may include a first portion extending in the first direction, and a second portion extending in the second direction, and may not contact a top surface of the second contact plug 385. Thus, no electrical signal may be applied to the second contact plug 385, and may be referred to as a dummy contact plug.

Figure 53:
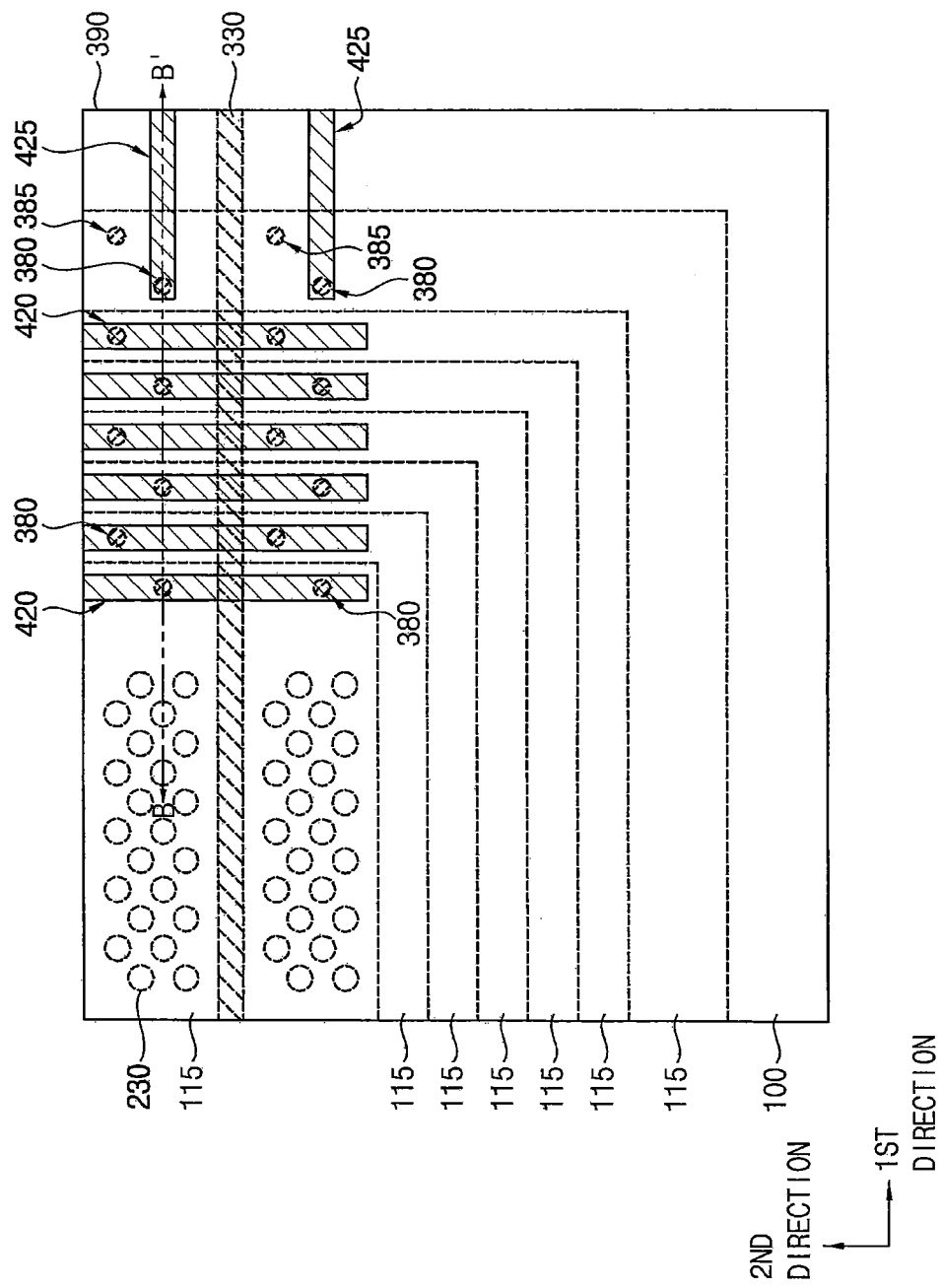
Figure 54:
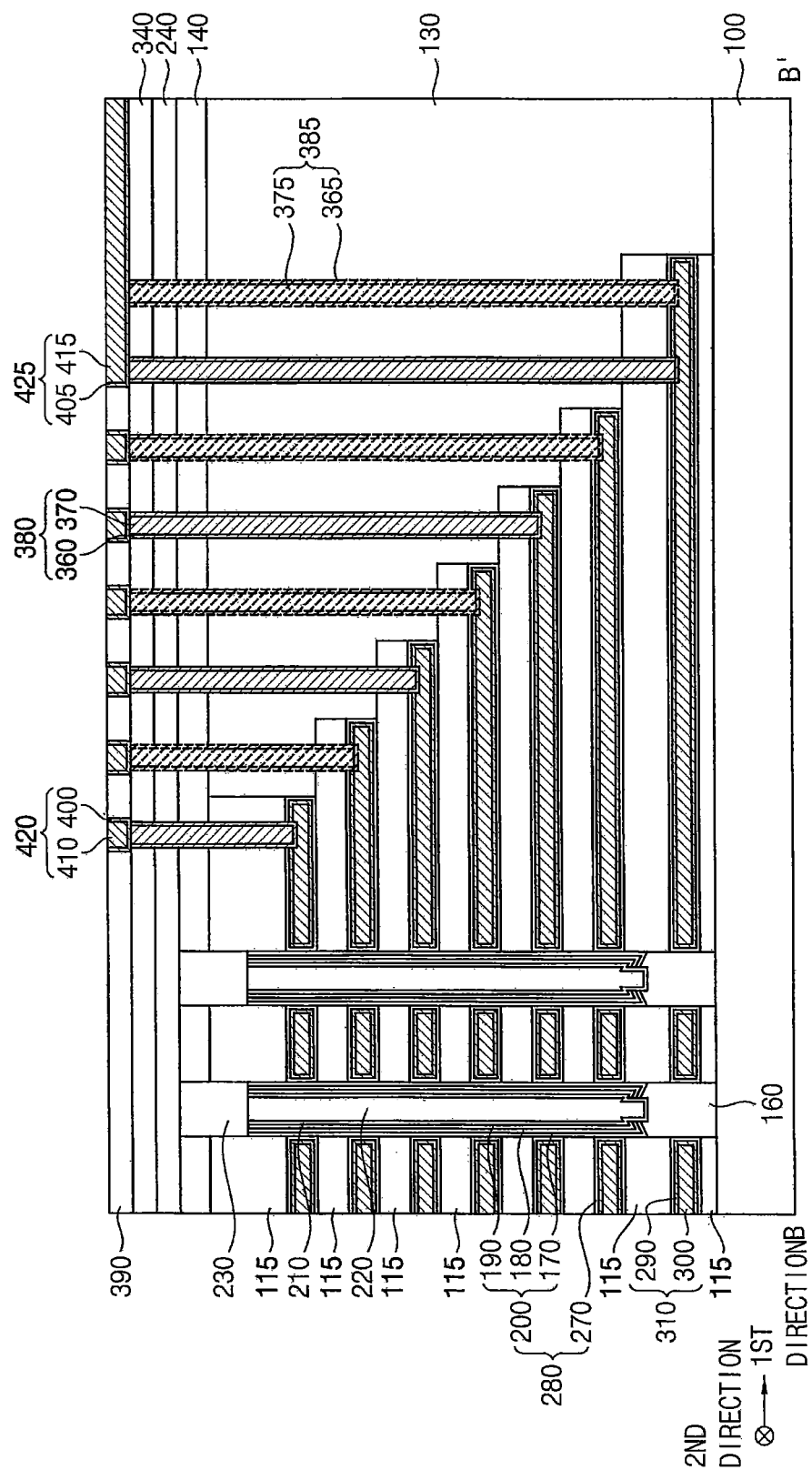

Referring to FIGS. 53 and 54, the first and second contact plugs 380 and 385 may be disposed in a zigzag layout in the first direction. Both of the first and second contact plugs 380 and 385 may be formed on the first gate electrode 310 in the lowermost level stair. The second wiring 425, which may be electrically connected to the first contact plug 380, may extend in the first direction, and may not contact a top surface of the second contact plug 385. Thus, the second contact plug 385 may be referred to as a dummy contact plug.

Figure 55:
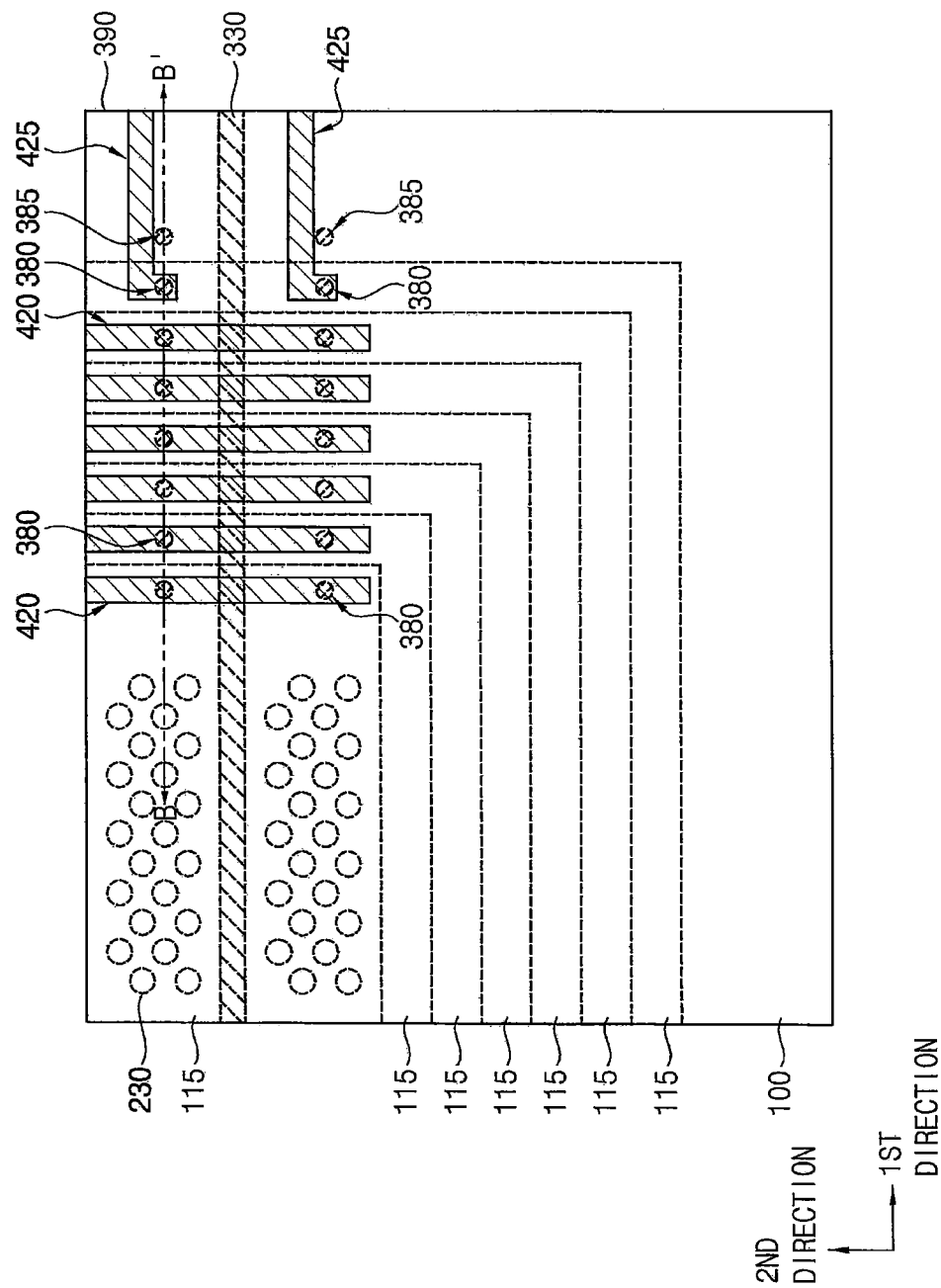
Figure 56:
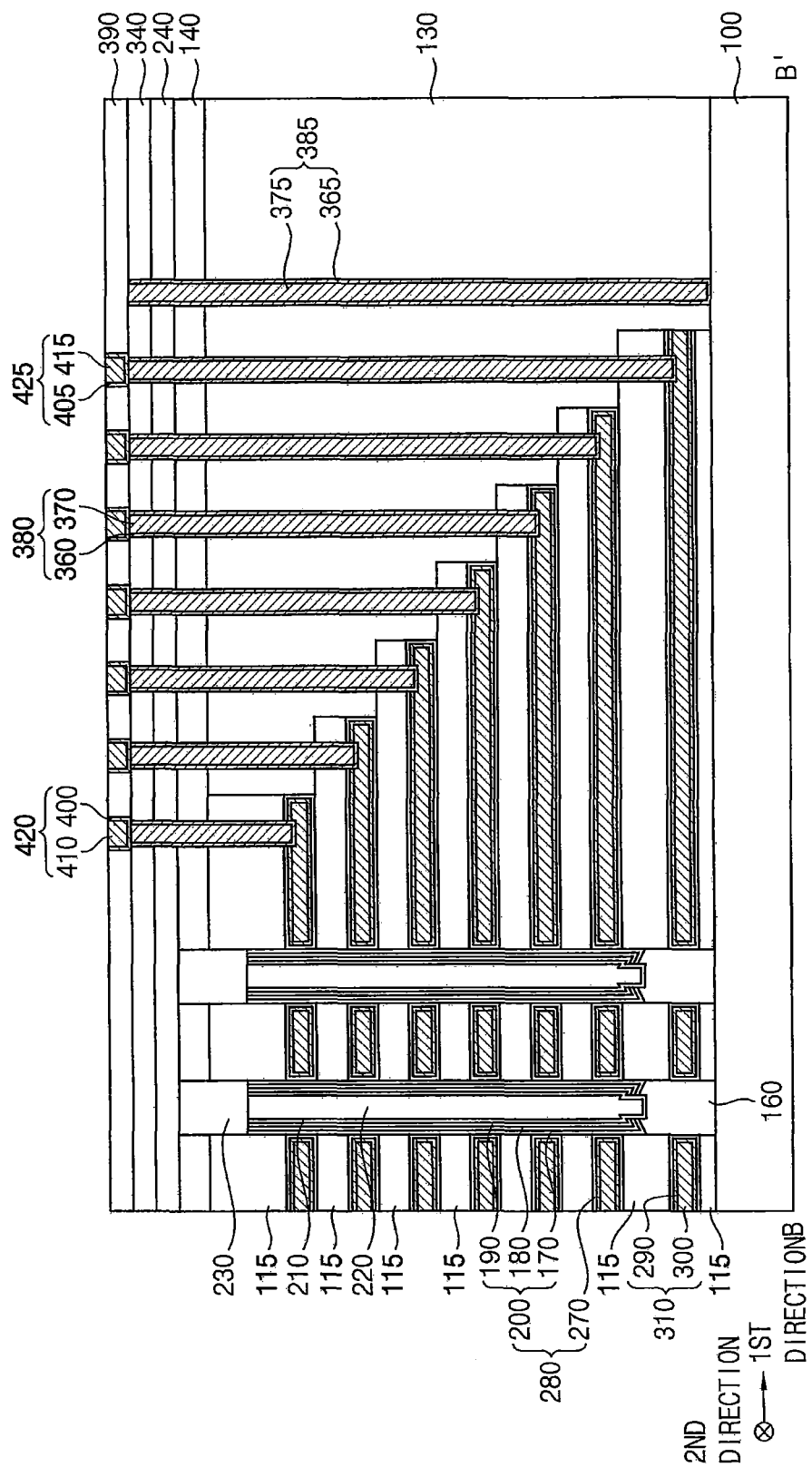

Referring to FIGS. 55 and 56, the first and second contact plugs 380 and 385 may be disposed in the same line in the first direction. The second contact plug 385 may not be formed on the gate electrode 310, but may be formed on a top surface of the substrate 100 adjacent the lowermost level stair in the first direction. The second wiring 425, which may be electrically connected to the first contact plug 380, may include a first portion extending in the first direction, and a second portion extending in the second direction, and may not contact a top surface of the second contact plug 385. Thus, the second contact plug 385 may be referred to as a dummy contact plug.

Figure 57:
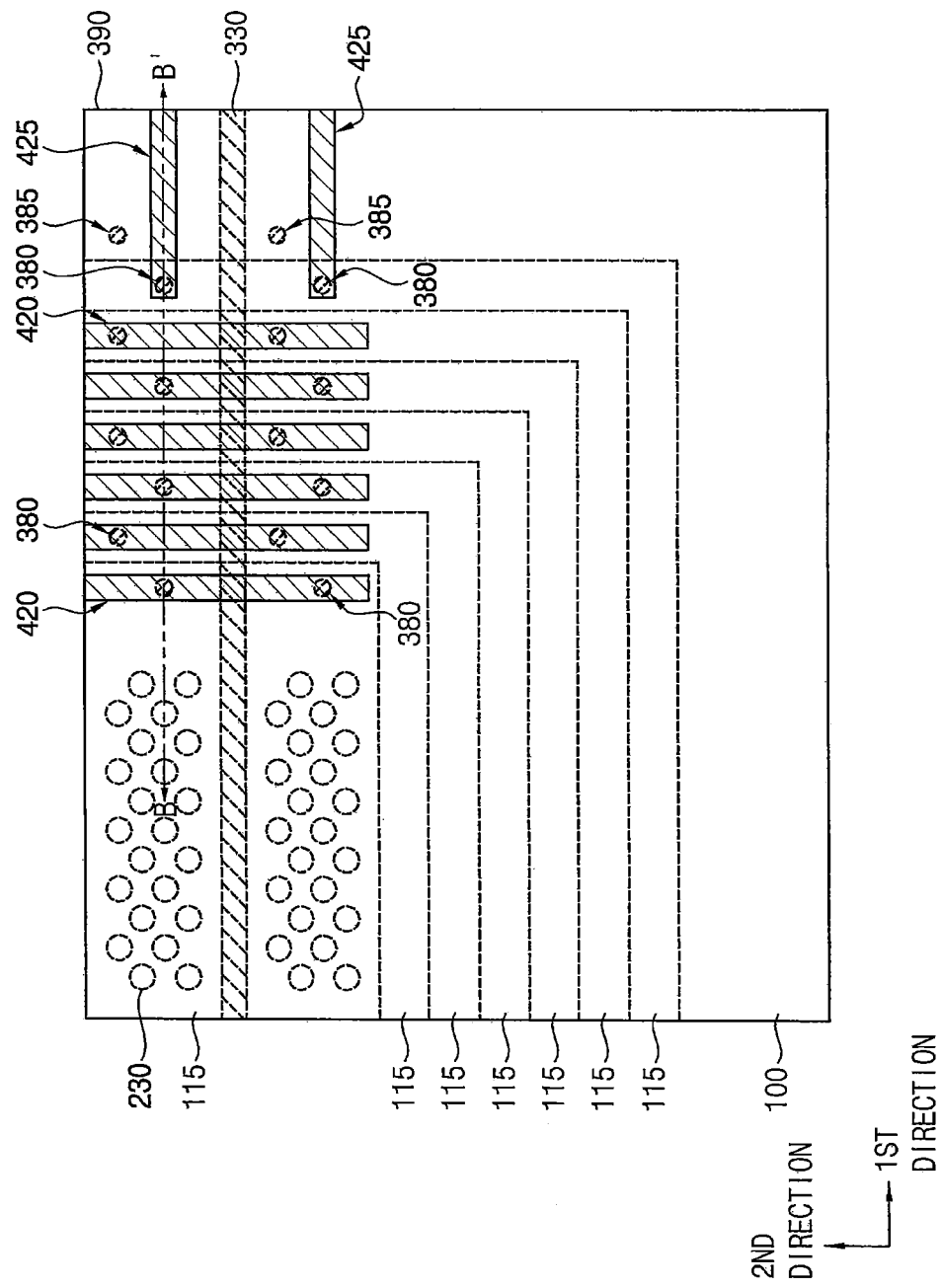
Figure 58:
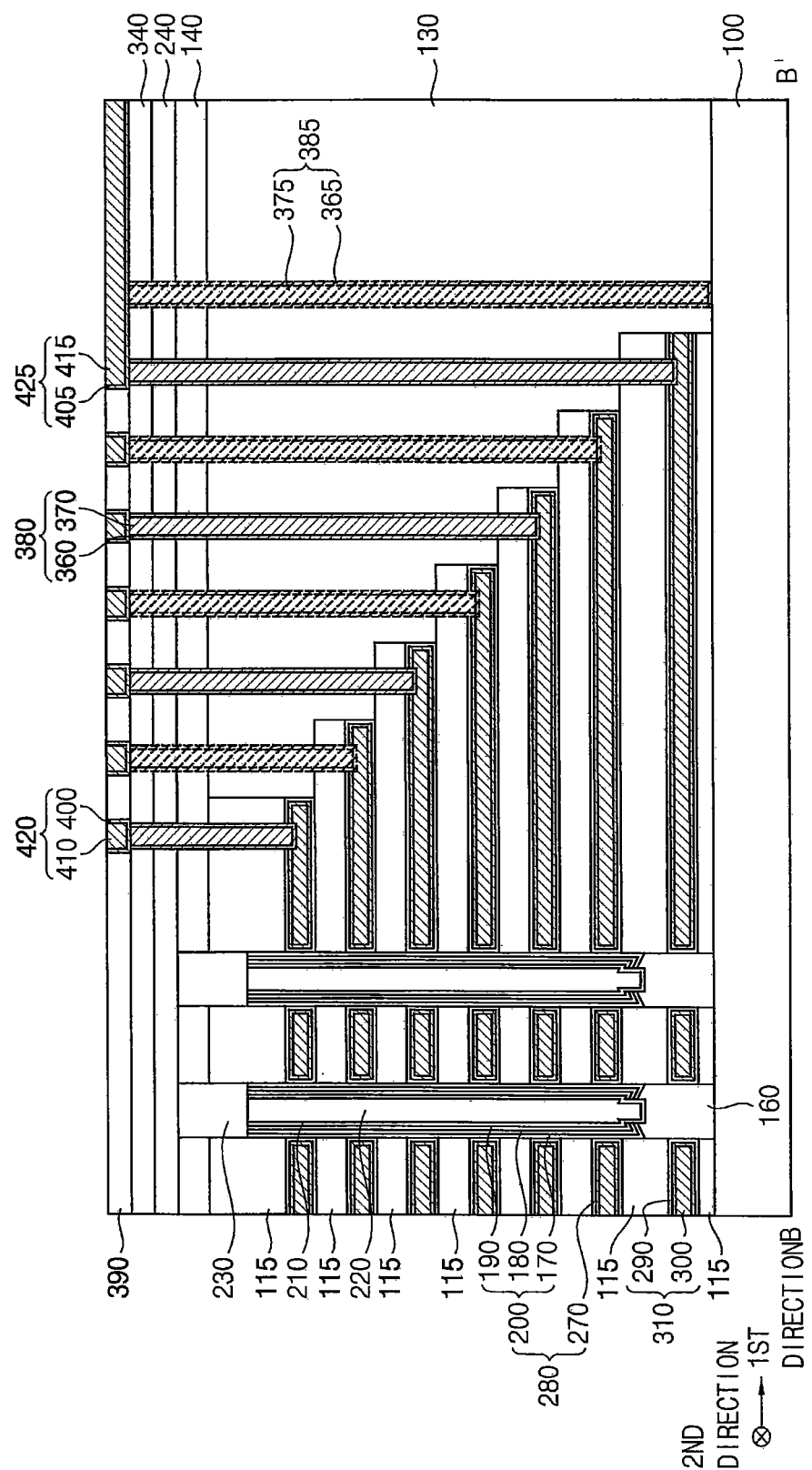

Referring to FIGS. 57 and 58, the first and second contact plugs 380 and 385 may be disposed in a zigzag layout in the first direction. The second contact plug 385 may not be formed on the gate electrode 310, but may be formed on a top surface of the substrate 100 adjacent the lowermost level stair in the first direction. The second wiring 425, which may be electrically connected to the first contact plug 380, may extend in the first direction, and may not contact a top surface of the second contact plug 385. Thus, the second contact plug 385 may be referred to as a dummy contact plug.

Figure 59:
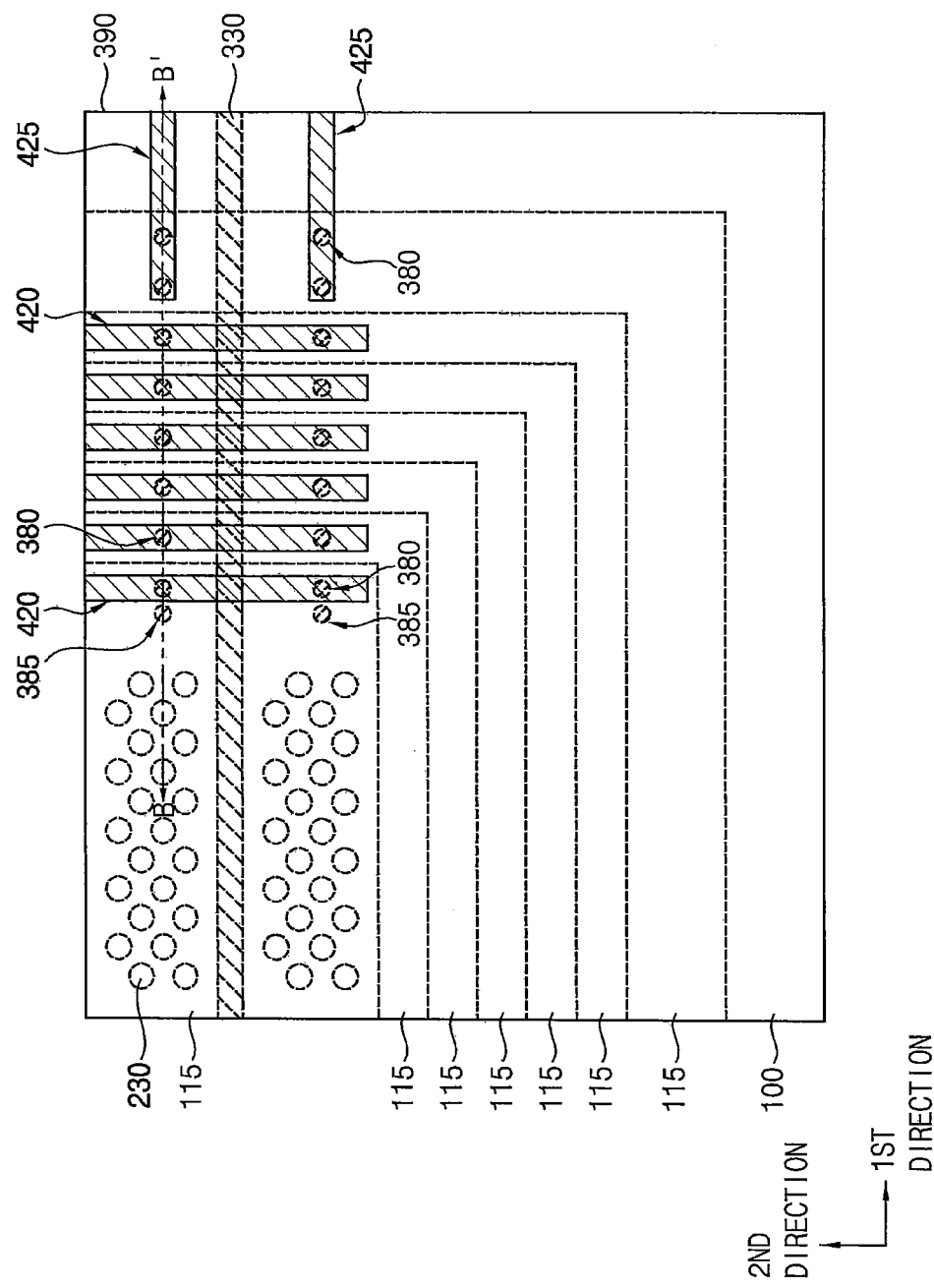
Figure 60:
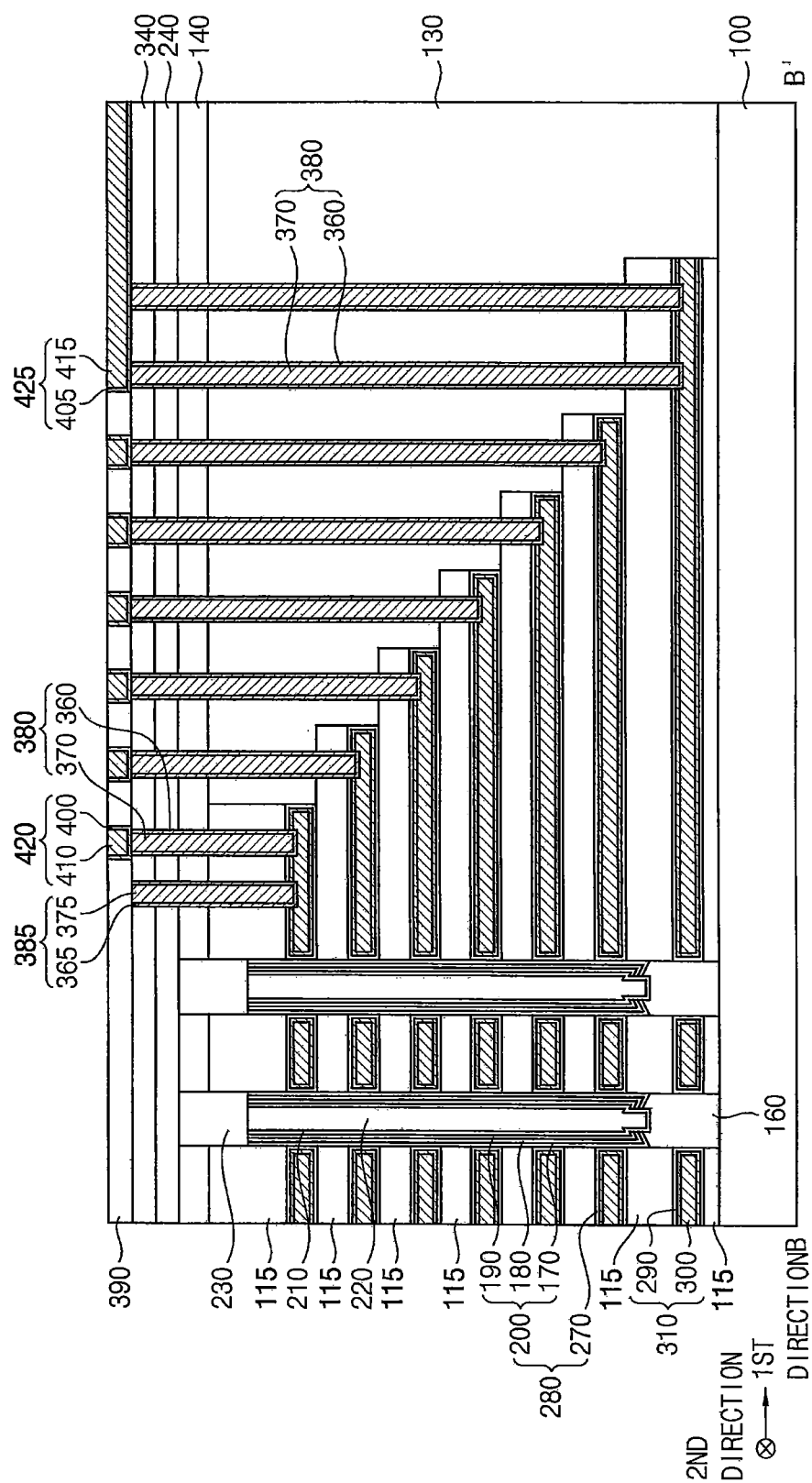

Referring to FIGS. 59 and 60, the first and second contact plugs 380 and 385 may be disposed in the same line in the first direction. Both of the first and second contact plugs 380 and 385 may be formed on the gate electrode 310 in the uppermost level stair. The first wiring 420, which may be electrically connected to the first contact plug 380, may extend in the first direction, and may not contact a top surface of the second contact plug 385. Thus, the second contact plug 385 may be referred to as a dummy contact plug.

Figure 61:
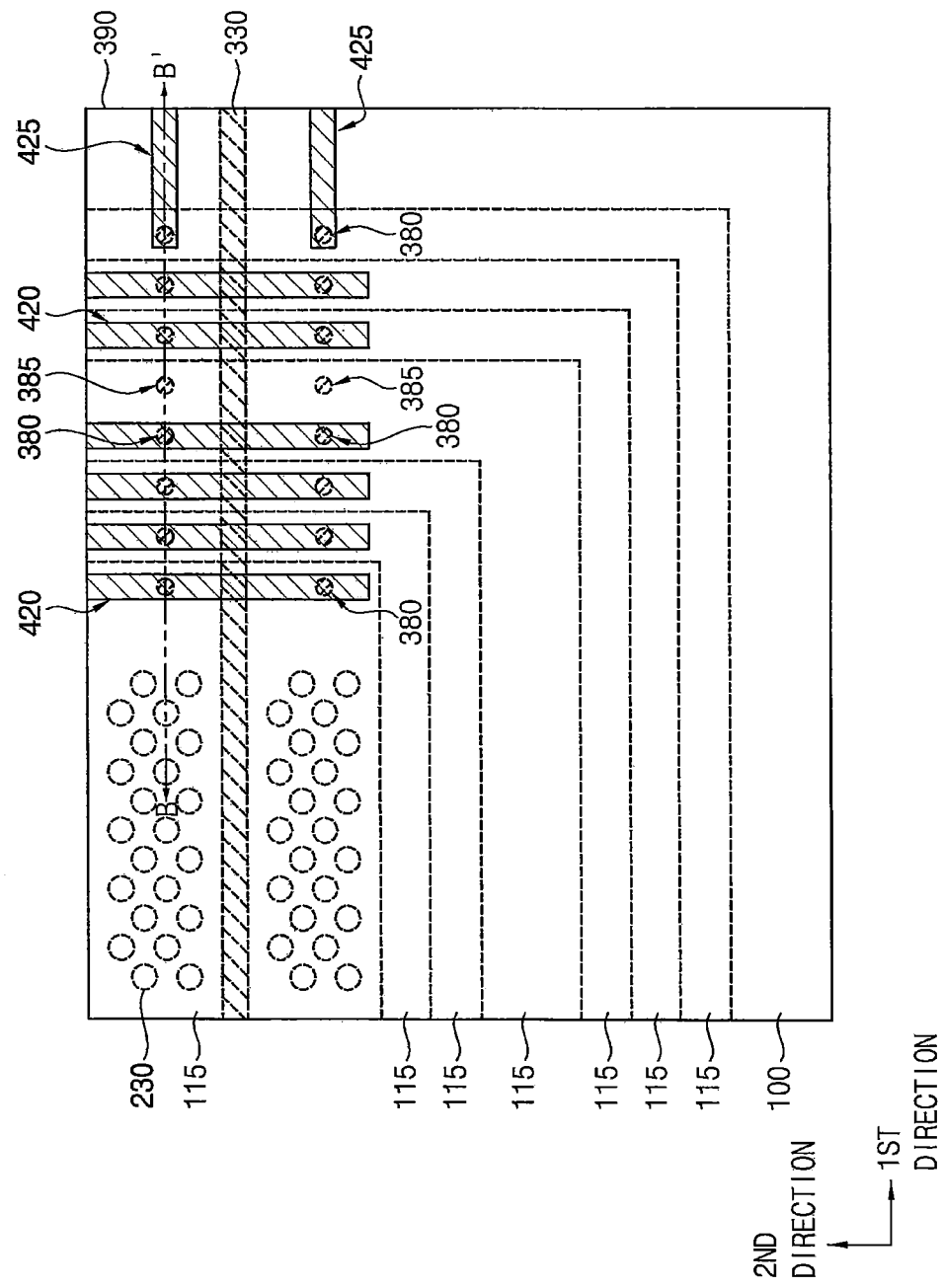
Figure 62:
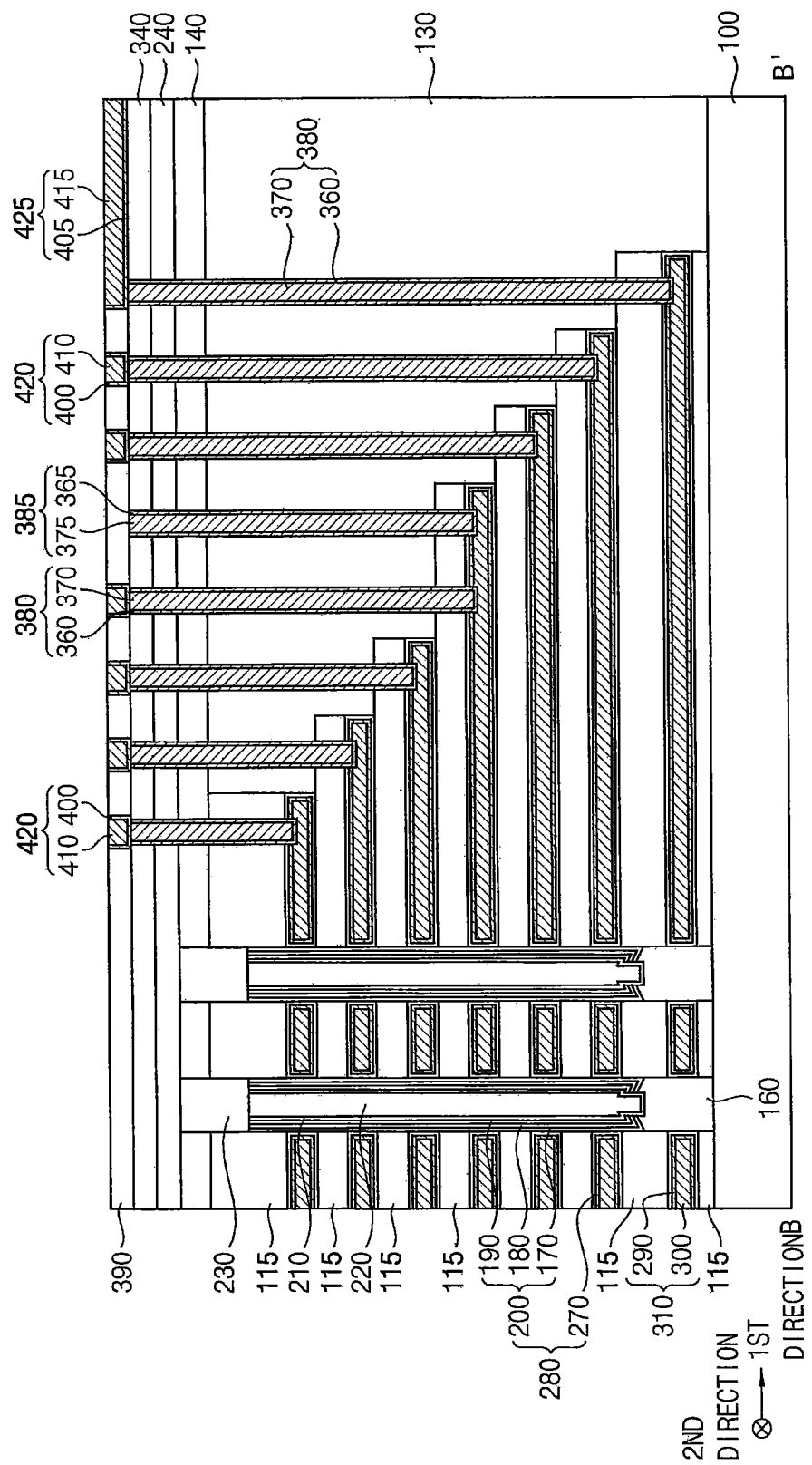

Referring to FIGS. 61 and 62, the first and second contact plugs 380 and 385 may be disposed in the same line in the first direction. Both of the first and second contact plugs 380 and 385 may be formed on the gate electrode 310 in the middle level stair. The first wiring 420, which may be electrically connected to the first contact plug 380, may extend in the first direction, and may not contact a top surface of the second contact plug 385. Thus, the second contact plug 385 may be referred to as a dummy contact plug.

Figure 63:
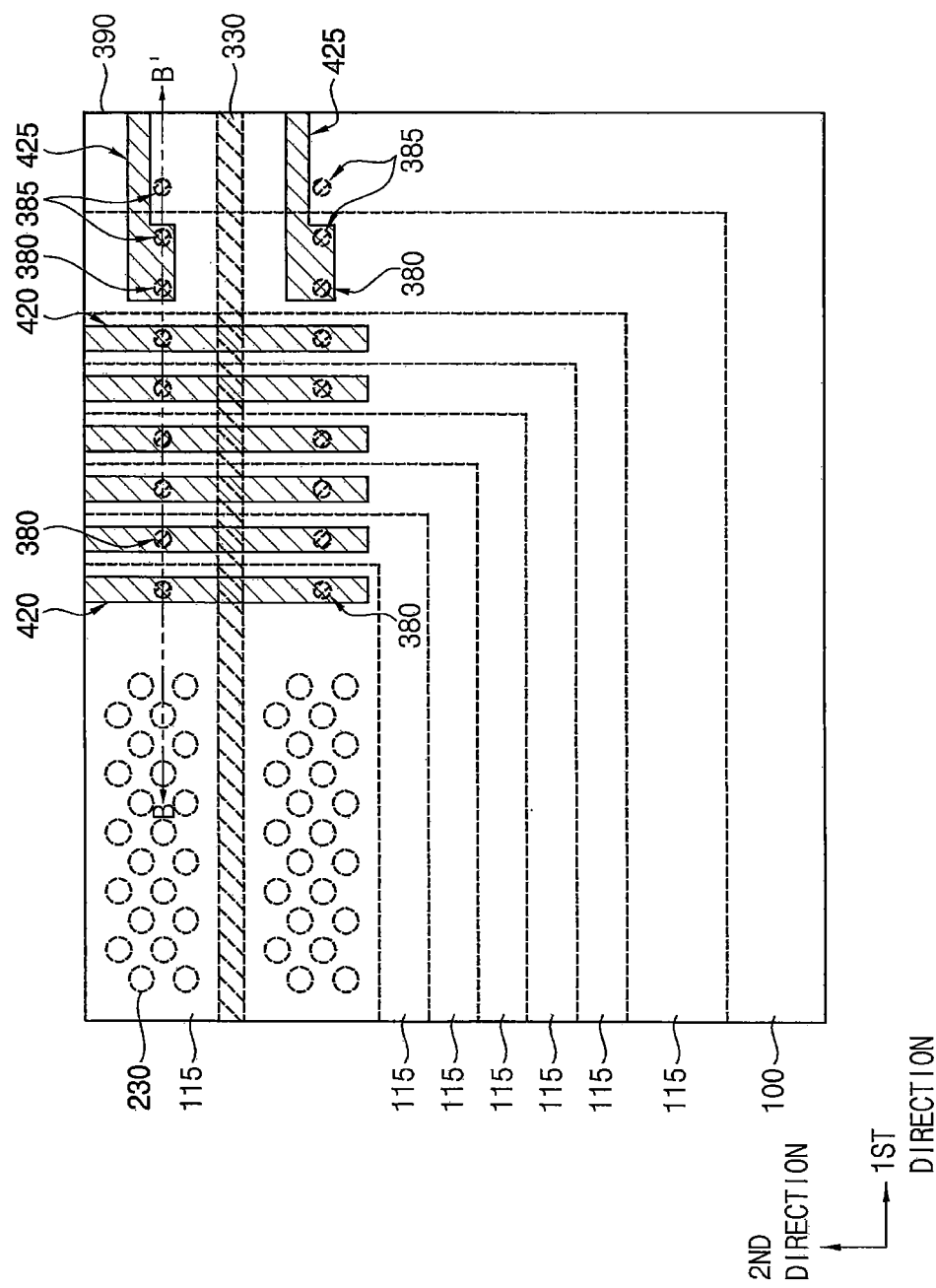
Figure 64:
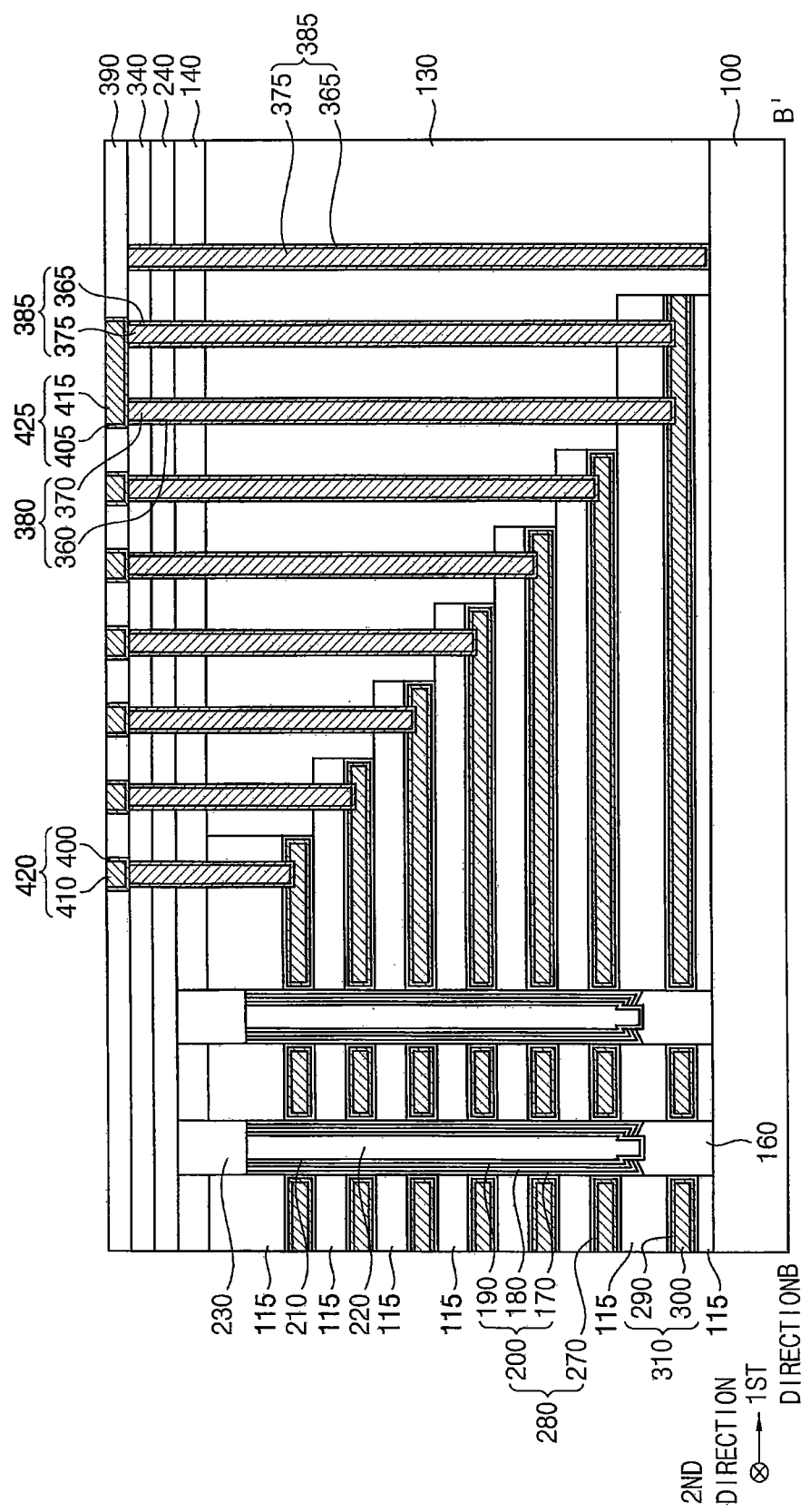

Referring to FIGS. 63 and 64, the first and second contact plugs 380 and 385 may be disposed in the same line in the first direction. Both of the first and second contact plugs 380 and 385 may be formed on the gate electrode 310 in the lowermost level stair. The second contact plug 385 may be further formed on a top surface of the substrate 100 adjacent the lowermost level stair in the first direction. The second wiring 425, which may be electrically connected to the first contact plug 380, may include a first portion extending in the first direction, and a second portion extending in the second direction. The second wiring 425 may contact a top surface of the second contact plug 385 on the first gate electrode 310, but may not contact the second contact plug 385 on the top surface of the substrate 100. Thus, the second contact plug 385 on the top surface of the substrate 100 may be referred to as a dummy contact plug.

Figure 65:
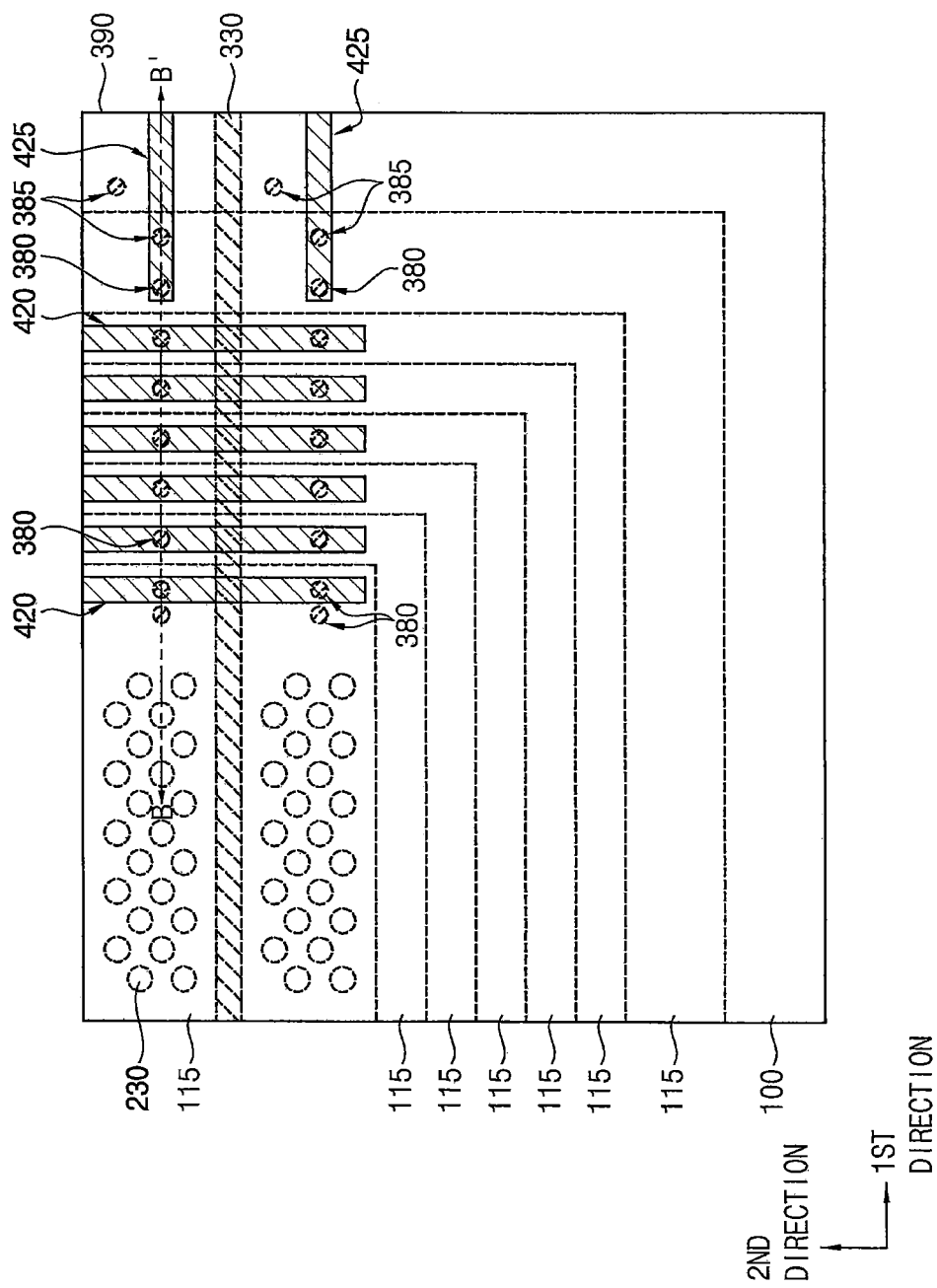
Figure 66:
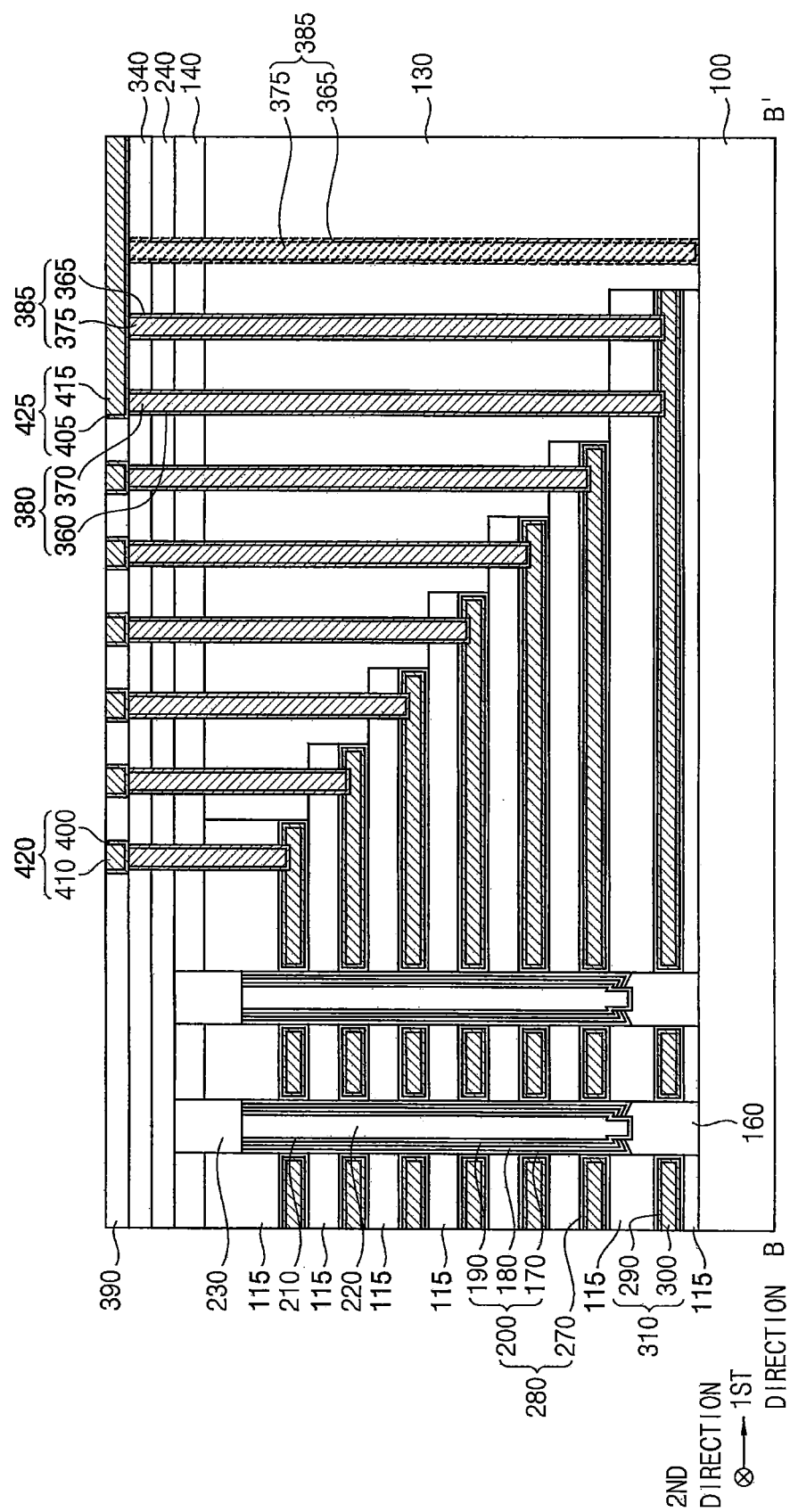

Referring to FIGS. 65 and 66, the first contact plugs 380 and the second contact plug 385 on the first gate electrode 310 may be disposed in the same line in the first direction, however, the second contact plug 385 on a top surface of the substrate 100 may not be disposed in the above line. Both of the first and second contact plugs 380 and 385 may be formed on the gate electrode 310 in the lowermost level stair. The second wiring 425, which may be electrically connected to the first contact plug 380 and the second contact plug 385 on the first gate electrode 310, may extend in the first direction, and may not contact a top surface of the second contact plug 385 on the top surface of the substrate 100. Thus, the second contact plug 385 on the top surface of the substrate 100 may be referred to as a dummy contact plug.

Figure 67:
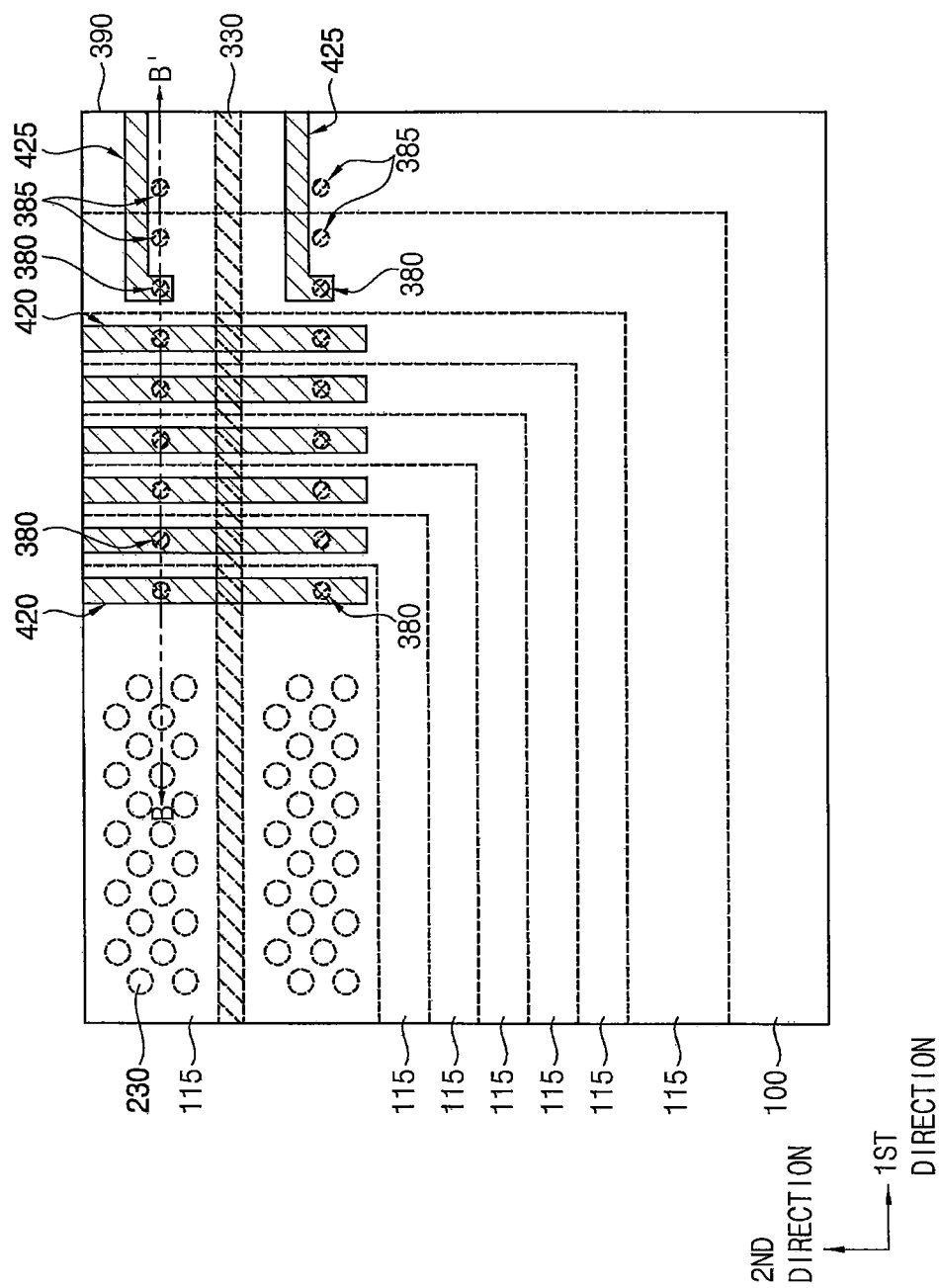
Figure 68:
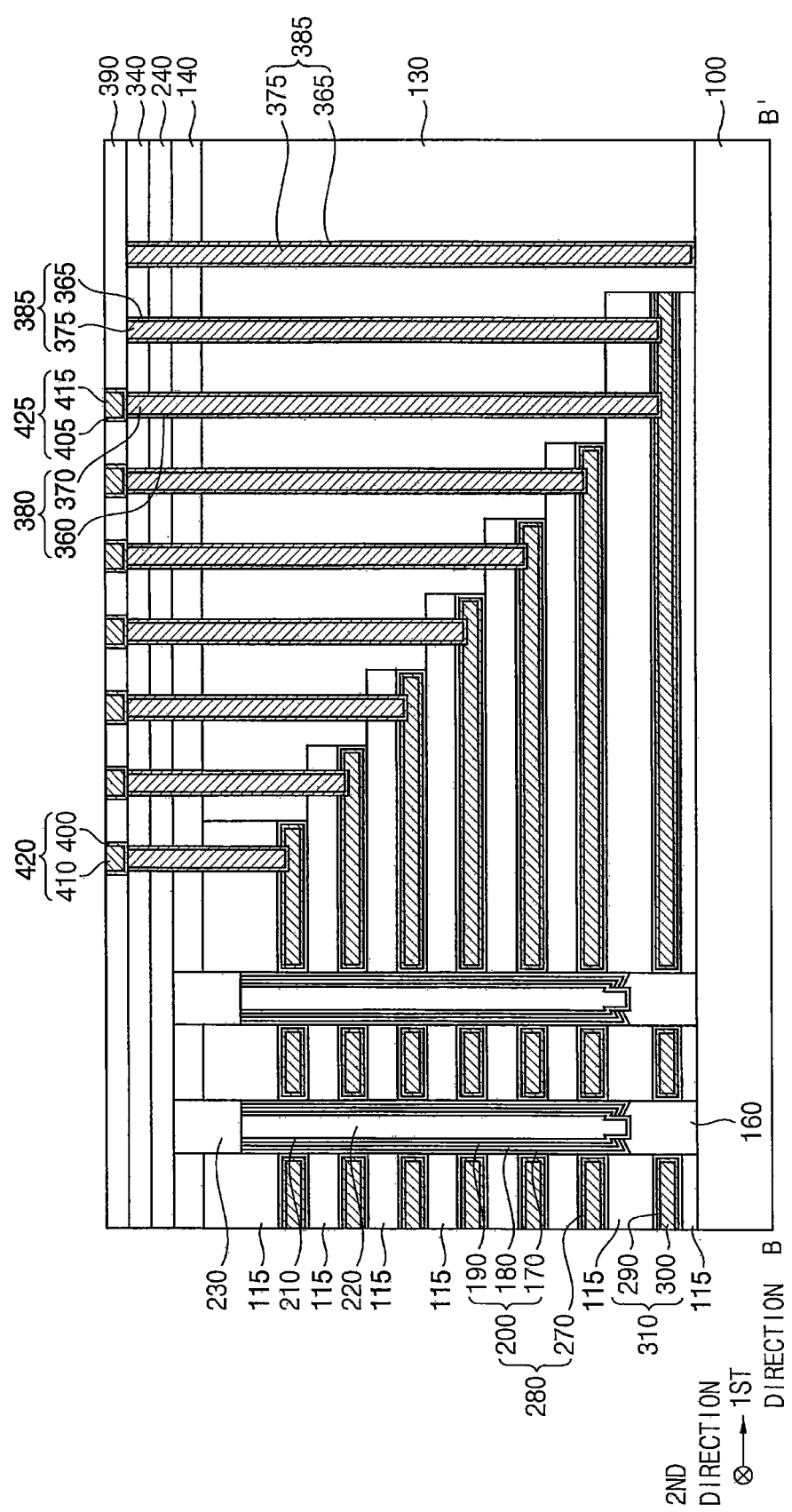

Referring to FIGS. 67 and 68, the first and second contact plugs 380 and may be disposed in the same line in the first direction. The second contact plug 385 may be formed on the gate electrode 310 in the lowermost level stair and on a top surface of the substrate 100 adjacent thereto. The second wiring 425, which may be electrically connected to the first contact plug 380, may include a first portion extending in the first direction, and a second portion extending in the second direction, and may not contact a top surface of the second contact plugs 385. Thus, the second contact plugs 385 may be referred to as dummy contact plugs.

Figure 69:
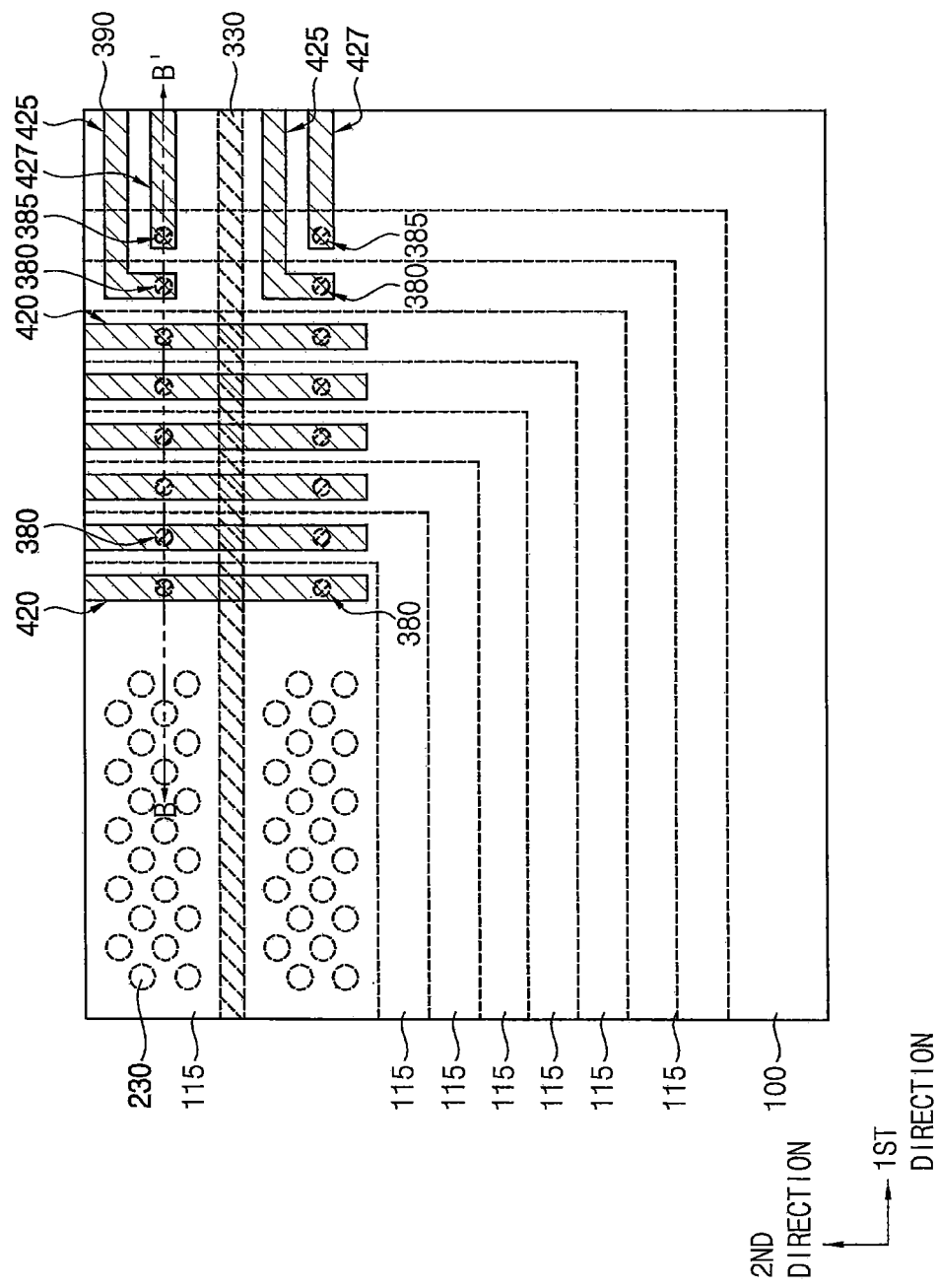
Figure 70:
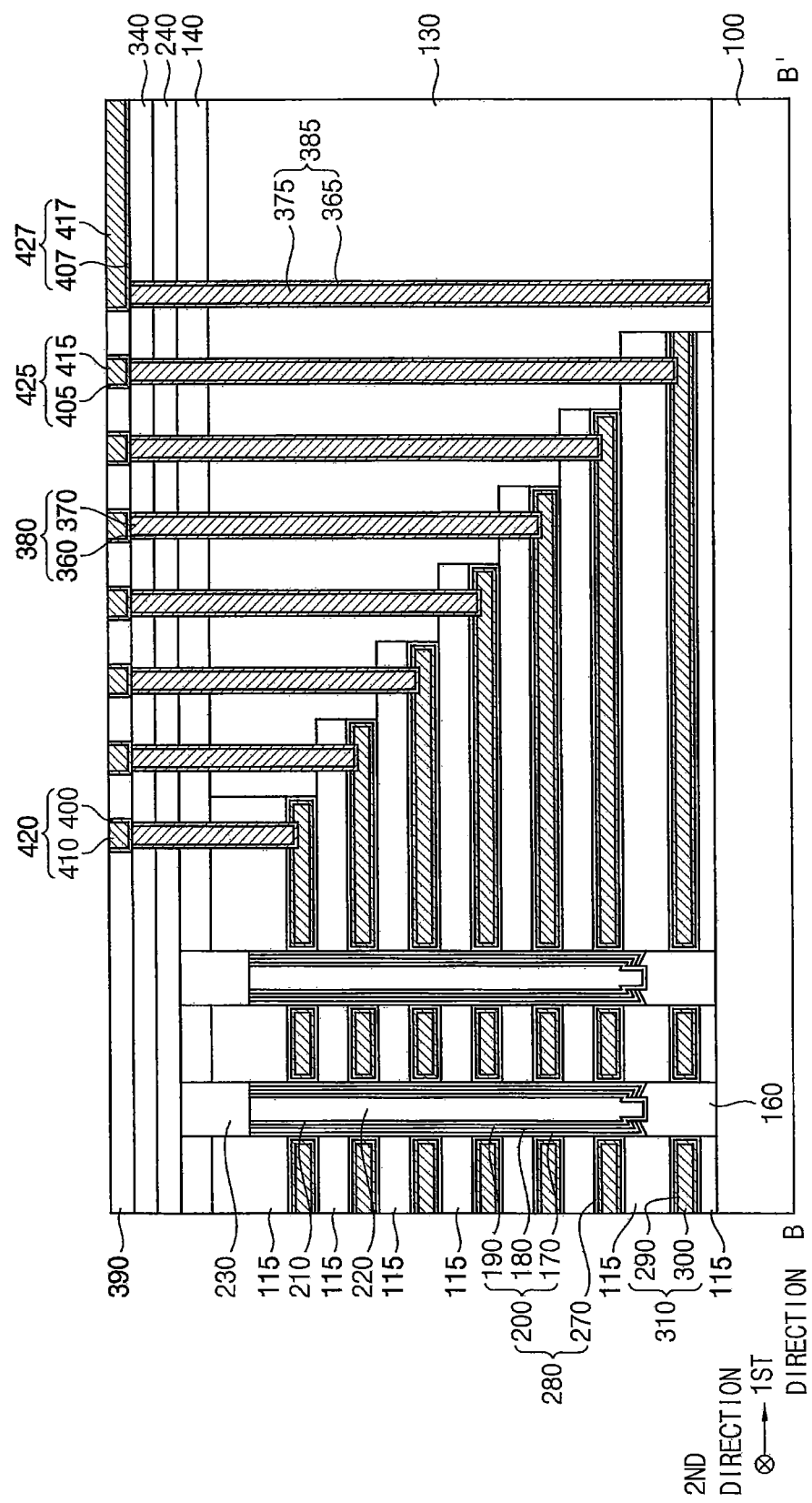

Referring to FIGS. 69 and 70, the first and second contact plugs 380 and may be disposed in the same line in the first direction. The second contact plug 385 may be formed on a top surface of the substrate 100 adjacent the lowermost level stair. The second wiring 425, which may be electrically connected to the first contact plug 380, may include a first portion extending in the first direction, and a second portion extending in the second direction, and may not contact a top surface of the second contact plug 385. However, the second contact plug 385 may be connected to, a seventh wiring 427 (which may include a conductive pattern 407, and a barrier pattern 417), and the seventh wiring 427 may transfer an electrical signal from a wiring in the second region II to the second contact plug 385.

While example embodiments have been particularly shown and described, it will be understood by one of ordinary skill in the art that variations in form and detail may be made therein without departing from the spirit and scope of the claims.

What is claimed is:

1. A vertical memory device, comprising:
   gate electrodes at a plurality of levels, respectively, spaced apart from each other in a vertical direction substantially perpendicular to a top surface of a substrate including a memory cell region and a peripheral region, the gate electrodes being in the memory cell region of the substrate;
   a channel extending in the vertical direction on the substrate and penetrating through ones of the gate electrodes; and
   first contact plugs extending in the vertical direction, the first contact plugs electrically contacting the gate electrodes, respectively; and
   at least one third contact plug directly on the substrate in the memory cell region adjacent to one of the gate electrodes at a lowermost level, the at least one third contact plug extending in the vertical direction only in the memory cell region of the substrate and having a top surface substantially coplanar with top surfaces of the first contact plugs, and the at least one third contact plug not contacting the one of the gate electrodes at the lowermost level.

2. The vertical memory device of claim 1, wherein each of the gate electrodes extends in a first direction substantially parallel to the top surface of the substrate,
   and wherein, in plan view, the first contact plugs and the at least one third contact plug are uniformly spaced from each other along the first direction.

3. The vertical memory device of claim 1, wherein the gate electrodes define a staircase shape having respective lengths in a first direction substantially parallel to the top surface of the substrate, wherein the respective lengths are decreasing from a lower level of the staircase shape toward an upper level thereof,
   and wherein the at least one third contact plug is disposed on a portion of the substrate adjacent the one of the gate electrodes at the lowermost level in the first direction.

4. The vertical memory device of claim 1, further comprising first wirings contacting top surfaces of the first contact plugs, respectively,
   wherein an electrical signal is applied to the first contact plugs through a second wiring in the peripheral region of the substrate.

5. The vertical memory device of claim 4, wherein a top surface of the at least one third contact plug contacts one of the first wirings on the top surface of one of the first contact plugs contacting the one of the gate electrodes at the lowermost level such that the at least one third contact plug and the one of the first contact plugs electrically contact the one of the first wirings.

6. The vertical memory device of claim 4, wherein the at least one third contact plug is connected to a third wiring different from the first wirings.

7. The vertical memory device of claim 4, wherein the at least one third contact plug comprises a dummy contact plug that is free of electrical connections to wirings configured to apply electrical signals.

8. The vertical memory device of claim 1, further comprising:
at least one second contact plug extending in the vertical direction on a first gate electrode among the gate electrodes such that the at least one second contact plug and one of the first contact plugs both electrically contact the first gate electrode, the at least one second contact plug having a top surface substantially coplanar with the top surfaces of the first contact plugs.

9. A vertical memory device, comprising:
a channel extending in a vertical direction on a substrate, the vertical direction being substantially perpendicular to a top surface of the substrate;
a charge storage structure on an outer sidewall of the channel;
gate electrodes at a plurality of levels, respectively, spaced apart from each other in the vertical direction, one or more of the gate electrodes on the charge storage structure and extending in a first direction, and the gate electrodes defining a staircase shape of which respective lengths of the gate electrodes in the first direction are decreasing from a lower level toward an upper level;
first contact plugs each extending in the vertical direction and contacting an edge portion of a corresponding one of the gate electrodes, wherein the edge portion is not overlapped by ones of the gate electrodes at upper levels; and
at least one second contact plug extending in the vertical direction on the edge portion of a first gate electrode of the gate electrodes alongside one of the first contact plugs on the edge portion of the first gate electrode such that the at least one second contact plug, the one of the first contact plugs, and the first gate electrode are electrically connected, wherein the respective lengths in the first direction of the gate electrodes sequentially stacked in the vertical direction are decreasing by a first value, while a difference between a length in the first direction of the first gate electrode and a length in the first direction of one of the gate electrodes nearest to the first gate electrode and disposed over the first gate electrode has a second value that is greater than the first value.

10. The vertical memory device of claim 9, wherein the first contact plugs and the at least one second contact plug are uniformly spaced from each other along the first direction.

11. The vertical memory device of claim 9, wherein a top surface of the at least one second contact plug is substantially coplanar with top surfaces of the first contact plugs.

12. The vertical memory device of claim 9, wherein the gate electrodes include a plurality of the first gate electrodes.

13. The vertical memory device of claim 9, wherein the first gate electrode is disposed at a lowermost level among the gate electrodes, wherein the first gate electrode is directly adjacent the top surface of the substrate.

14. A memory device, comprising:
conductive gate electrodes stacked on a substrate, wherein the conductive gate electrodes define selection lines and word lines of the memory device;
a channel structure on the substrate and extending through ones of the conductive gate electrodes; and
conductive contact plugs extending toward the substrate substantially parallel to the channel structure and onto the conductive gate electrodes,
wherein first ones of the conductive contact plugs electrically contact first ones of the conductive gate electrodes, respectively, and
wherein second ones of the conductive contact plugs extend on a second one of the conductive gate electrodes such that multiple of the second ones of the conductive contact plugs are electrically connected to one another and electrically contact the second one of the conductive gate electrodes at respective side-by-side portions of the second one of the conductive gate electrodes.

15. The memory device of claim 14, wherein surfaces of the first and second ones of the conductive contact plugs opposite the substrate are substantially coplanar, wherein the first ones of the conductive contact plugs extend toward the substrate to different depths, and wherein the second ones of the conductive contact plugs extend toward the substrate to respective depths that are different than the different depths of the first ones of the conductive contact plugs.

16. The memory device of claim 15, further comprising:
first wiring lines extending substantially parallel on the surfaces of the first ones of the conductive contact plugs and electrically coupled to the first ones of the conductive gate electrodes, respectively; and
a second wiring line on the surfaces of the second ones of the conductive contact plugs and electrically coupled to the second one of the conductive gate electrodes by the multiple of the second ones of the conductive contact plugs such that the multiple of the second ones of the conductive contact plugs are electrically connected in parallel,
wherein the second wiring line extends in a different direction than the first wiring lines.

17. The memory device of claim 15, wherein the respective depths of the second ones of the conductive contact plugs are substantially similar.

18. The memory device of claim 15, wherein another of the second ones of the conductive contact plugs does not electrically contact the second one of the conductive gate electrodes and/or is free of electrical contact to a wiring at the surface of the second ones of the conductive contact plugs.

* * * * *